United States Patent
Oda et al.

(10) Patent No.: US 12,538,454 B2
(45) Date of Patent: Jan. 27, 2026

(54) VAPOR CHAMBER, WICK SHEET FOR VAPOR CHAMBER, AND ELECTRONIC APPARATUS

(71) Applicant: DAI NIPPON PRINTING CO., LTD., Tokyo-to (JP)

(72) Inventors: Kazunori Oda, Tokyo-to (JP); Shinichiro Takahashi, Tokyo-to (JP); Toshihiko Takeda, Tokyo-to (JP); Takayuki Ota, Tokyo-to (JP); Makoto Yamaki, Tokyo-to (JP); Youji Kozuru, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 208 days.

(21) Appl. No.: 18/281,118

(22) PCT Filed: Mar. 9, 2022

(86) PCT No.: PCT/JP2022/010293
§ 371 (c)(1),
(2) Date: Sep. 8, 2023

(87) PCT Pub. No.: WO2022/191240
PCT Pub. Date: Sep. 15, 2022

(65) Prior Publication Data
US 2024/0172395 A1  May 23, 2024

(30) Foreign Application Priority Data

Mar. 10, 2021  (JP) .............................. 2021-038444
Mar. 10, 2021  (JP) .............................. 2021-038465
(Continued)

(51) Int. Cl.
*H05K 7/20*    (2006.01)

(52) U.S. Cl.
CPC ............................... *H05K 7/20336* (2013.01)

(58) Field of Classification Search
CPC ................................................ H05K 7/20336
See application file for complete search history.

(56) References Cited

U.S. PATENT DOCUMENTS

2013/0025829 A1    1/2013  Huang

FOREIGN PATENT DOCUMENTS

| CN | 107401941 A | 11/2017 |
| JP | 2009-236407 A | 10/2009 |

(Continued)

OTHER PUBLICATIONS

JP-2019039662-A Translation (Year: 2019).*
JP-2019066175-A Translation (Year: 2019).*
May 24, 2022 International Search Report issued in International Patent Application No. PCT/JP2022/010293.
(Continued)

*Primary Examiner* — Mukundbhai G Patel
(74) *Attorney, Agent, or Firm* — Oliff PLC

(57) ABSTRACT

A wick sheet for a vapor chamber includes a first main body surface, a second main body surface located opposite the first main body surface, a frame body section, and a plurality of land sections apart from each other within the frame body section. A vapor path through which a vapor of a working fluid travels is between the plurality of land sections. A liquid flow channel section that communicates with the vapor path and through which the working fluid in a liquid form travels is at the second main body surface side of at least one of the land sections. A bridge that couples the land sections to the frame body section or that couples the land sections to each other is included. The bridge is reduced in thickness from at least one of the first main body surface side and the second main body surface side.

19 Claims, 36 Drawing Sheets

(30) Foreign Application Priority Data

| Mar. 30, 2021 | (JP) | ................................ 2021-058317 |
| Apr. 27, 2021 | (JP) | ................................ 2021-075258 |
| Jul. 20, 2021 | (JP) | ................................ 2021-119907 |

(56) References Cited

FOREIGN PATENT DOCUMENTS

| JP | 2016-017702 A | | 2/2016 | |
| --- | --- | --- | --- | --- |
| JP | 2016-050682 A | | 4/2016 | |
| JP | 2019039662 A | * | 3/2019 | |
| JP | 2019066175 A | * | 4/2019 | ............ B32B 15/01 |
| JP | 6587164 B2 | | 10/2019 | |
| WO | 2019065969 A1 | | 4/2019 | |
| WO | 2021/070544 A1 | | 4/2021 | |
| WO | 2021/141110 A1 | | 7/2021 | |

OTHER PUBLICATIONS

Jul. 19, 2022 International Search Report issued in International Patent Application No. PCT/JP2022/018383.

Sep. 20, 2022 International Search Report issued in International Patent Application No. PCT/JP2022/028218.

Sep. 12, 2023 International Preliminary Report on Patentability issued in International Patent Application No. PCT/JP2022/010293.

Translation of Jan. 18, 2024 International Preliminary Report on Patentability issued in International Patent Application No. PCT/JP2022/028218.

U.S. Appl. No. 18/288,603, filed Oct. 27, 2023 in the name of Oda et al.

U.S. Appl. No. 18/291,057, filed Jan. 22, 2024 in the name of Oda et al.

Oct. 24, 2023 International Preliminary Report on Patentability issued in International Patent Application No. PCT/JP2022/018383.

May 19, 2025 U.S. Office Action issued in U.S. Appl. No. 18/288,603.

* cited by examiner

VAPOR CHAMBER, WICK SHEET FOR VAPOR CHAMBER, AND ELECTRONIC APPARATUS

TECHNICAL FIELD

The present disclosure relates to vapor chambers, wick sheets for vapor chambers, and electronic apparatuses.

BACKGROUND ART

Central processing units (CPU), light emitting diodes (LED), power semiconductors, and the like used in mobile terminals, such as portable terminals and tablet terminals, are devices that generate heat. Devices that generate heat are cooled by heat dissipating members, such as heat pipes. In recent years, it is demanded that heat dissipating members be reduced in thickness for reducing the thickness of mobile terminals and the like. Thus, vapor chambers that can be reduced in thickness more than heat pipes are being developed. A vapor chamber is filled with a working fluid. This working fluid absorbs and diffuses heat from a device, thereby cooling the device. For example, Patent Literature 1 discloses a sheet-type heat pipe formed by laminating two or more metallic foil sheets.

In more detail, the working fluid in the vapor chamber evaporates in an area (evaporation area) near the device by receiving heat from the device, so as to turn into a vapor (working vapor). The working vapor is cooled by diffusing away from the evaporation area within a vapor flow channel section, so as to condense into a liquid. The vapor chamber is provided with a liquid flow channel section serving as a capillary (wicking) structure. The working fluid (working liquid) that has turned into a liquid by condensation enters the liquid flow channel section from the vapor flow channel section, and is transported toward the evaporation area by flowing through the liquid flow channel section. Then, the working liquid evaporates again by receiving heat at the evaporation area. Accordingly, the working fluid circulates through the vapor chamber while repeatedly undergoing a phase change, that is, evaporation and condensation, thereby moving the heat of the device and enhancing heat dissipation efficiency.

CITATION LIST

Patent Literature

PTL 1: Japanese Unexamined Patent Application Publication No. 2016-017702

PTL 2: Japanese Patent No. 6587164

This embodiment provides a vapor chamber, a wick sheet for a vapor chamber, and an electronic apparatus that are capable of suppressing deformation of the wick sheet.

Furthermore, this embodiment provides a vapor chamber, a wick sheet for a vapor chamber, and an electronic apparatus that are capable of facilitating circulation of a working fluid within the vapor chamber.

SUMMARY OF INVENTION

A wick sheet according to this embodiment is for a vapor chamber. The wick sheet includes: a first main body surface; a second main body surface located opposite the first main body surface; a frame body section; and a plurality of land sections provided apart from each other within the frame body section. A vapor path through which a vapor of a working fluid travels is provided between the plurality of land sections and extends from the first main body surface to the second main body surface. A liquid flow channel section that communicates with the vapor path and through which the working fluid in a liquid form travels is provided at a second main body surface side of at least one of the land sections. A bridge that couples the land sections to the frame body section or that couples the land sections to each other is provided. The bridge is reduced in thickness from at least one of a first main body surface side and the second main body surface side.

In the wick sheet according to this embodiment, each of the land sections may have a curved shape or a bent linear shape in plan view.

In the wick sheet according to this embodiment, the plurality of land sections may include a first land section extending linearly in plan view and a second land section having a curved shape or a bent linear shape in plan view.

In the wick sheet according to this embodiment, the bridge may have a top surface located at the second main body surface side, a bottom surface located at the first main body surface side, and a side surface located between the top surface and the bottom surface and oriented in a direction facing a flowing direction of the vapor of the working fluid in the vapor path. The side surface may be disposed non-parallel to a width direction of the vapor path.

In the wick sheet according to this embodiment, the bridge may have a top surface located at the second main body surface side, a bottom surface located at the first main body surface side, and a side surface located between the top surface and the bottom surface and oriented in a direction facing a flowing direction of the vapor of the working fluid in the vapor path. The side surface may be inclined relative to the first main body surface and the second main body surface.

In the wick sheet according to this embodiment, the liquid flow channel section may have a plurality of liquid-flow-channel main grooves through which the working fluid in the liquid form travels, and may also have a plurality of liquid-flow-channel communication grooves communicating with the liquid-flow-channel main grooves. The bridge may be in contact with the liquid-flow-channel communication groove located at an outermost side of the land sections in a width direction.

In the wick sheet according to this embodiment, the bridge may have a top surface located at the second main body surface side. The top surface may be provided with a communication recess communicating with the liquid-flow-channel communication groove.

In the wick sheet according to this embodiment, the top surface of the bridge may be provided with a plurality of the communication recesses. The top surface may be provided with a first communication flow channel that connects the adjacent communication recesses to each other.

In the wick sheet according to this embodiment, a second communication flow channel that connects the communication recess and the vapor path may be provided at an outermost position of the bridge in a width direction.

In the wick sheet according to this embodiment, the plurality of land sections may include a first land section and a second land section. The bridge may couple one end of the first land section to an intermediate position of the second land section. The liquid-flow-channel main groove in the first land section and the communication recess in the bridge may extend continuously.

In the wick sheet according to this embodiment, the bridge may have a top surface located at the second main body surface side and a bottom surface located at the first main body surface side. The bridge may have a width that gradually increases from the top surface toward the bottom surface.

In the wick sheet according to this embodiment, the bridge may couple a longitudinal end of each land section to the frame body section.

A vapor chamber according to this embodiment has a working fluid enclosed therein. The vapor chamber includes: a first sheet; a second sheet; and a wick sheet interposed between the first sheet and the second sheet. The wick sheet includes: a first main body surface; a second main body surface located opposite the first main body surface; a frame body section; and a plurality of land sections provided apart from each other within the frame body section. A vapor path through which a vapor of a working fluid travels is provided between the plurality of land sections and extends from the first main body surface to the second main body surface. A liquid flow channel section that communicates with the vapor path and through which the working fluid in a liquid form travels is provided at a second main body surface side of at least one of the land sections. A bridge that couples the land sections to the frame body section or that couples the land sections to each other is provided. The bridge is reduced in thickness from at least one of a first main body surface side and the second main body surface side.

An electronic apparatus according to this embodiment includes: a housing; a device accommodated within the housing; and the vapor chamber according to this embodiment that is thermally in contact with the device.

According to the embodiment of the present disclosure, deformation of the wick sheet can be suppressed.

A wick sheet according to this embodiment is for a vapor chamber. The wick sheet includes: a first main body surface; a second main body surface located opposite the first main body surface; a frame body section; a plurality of land sections provided apart from each other within the frame body section; and a supporter that supports longitudinal ends of the plurality of land sections to the frame body section. A vapor path through which a vapor of a working fluid travels is provided between the plurality of land sections and extends through the first main body surface and the second main body surface. A liquid flow channel section that communicates with the vapor path and through which the working fluid in a liquid form travels is provided at a second main body surface side of at least one of the land sections. The liquid flow channel section has a plurality of liquid-flow-channel main grooves through which the working fluid in the liquid form travels and that are arranged parallel to each other. A protrusion row is provided between the liquid-flow-channel main grooves that are adjacent to each other. Each protrusion row has a plurality of protrusions. Of the plurality of protrusions, the protrusion located at the longitudinal end of each land section extends out toward the supporter.

A wick sheet according to this embodiment is for a vapor chamber. The wick sheet includes: a first main body surface; a second main body surface located opposite the first main body surface; a frame body section; a plurality of land sections provided apart from each other within the frame body section; and a supporter that supports longitudinal ends of the plurality of land sections to the frame body section. A vapor path through which a vapor of a working fluid travels is provided between the plurality of land sections and extends from the first main body surface to the second main body surface. A liquid flow channel section that communicates with the vapor path and through which the working fluid in a liquid form travels is provided at a second main body surface side of at least one of the land sections. The liquid flow channel section has a plurality of liquid-flow-channel main grooves through which the working fluid in the liquid form travels and that are arranged parallel to each other. A protrusion row is provided between the liquid-flow-channel main grooves that are adjacent to each other. Each protrusion row has a plurality of protrusions. Of the plurality of protrusions, the protrusion located at the longitudinal end of each land section is disposed apart from the supporter.

In the wick sheet according to this embodiment, the supporter may have a supporter front surface located at the second main body surface side, a supporter rear surface located at the first main body surface side, and a supporter inner wall surface extending from the supporter front surface to the supporter rear surface. The supporter inner wall surface may be such that the first main body surface side is located inward of the vapor path in a longitudinal direction relative to the second main body surface side in cross section.

In the wick sheet according to this embodiment, the supporter may have a supporter front surface located at the second main body surface side, a supporter rear surface located at the first main body surface side, and a supporter coupling surface provided continuously with a frame-body inner wall surface of the frame body section. The supporter coupling surface may be such that the first main body surface side is located inward of the vapor path in a longitudinal direction relative to the second main body surface side in cross section.

In the wick sheet according to this embodiment, the supporter may have a supporter front surface located at the second main body surface side, a supporter rear surface located at the first main body surface side, and a supporter inner wall surface extending from the supporter front surface to the supporter rear surface. An intersection line can be drawn between the supporter inner wall surface and the supporter rear surface. At a widthwise end of the vapor path, the intersection line may be bent inward of the vapor path in a longitudinal direction from an inner side toward an outer side in a width direction of the vapor path in plan view.

In the wick sheet according to this embodiment, the protrusion located at the longitudinal end of each land section may have a length greater than a length of a remaining one or more of the protrusions.

In the wick sheet according to this embodiment, the protrusion located at the longitudinal end of each land section may have a length smaller than a length of a remaining one or more of the protrusions.

In the wick sheet according to this embodiment, the liquid flow channel section may have a plurality of protrusion rows. Of the plurality of protrusion rows, the protrusion located at a longitudinal end of one or more of the protrusion rows may extend out toward the supporter and the protrusion located at a longitudinal end of a remaining one or more of the protrusion rows does not have to extend out toward the supporter.

In the wick sheet according to this embodiment, the supporter may have a supporter front surface located at the second main body surface side, a supporter rear surface located at the first main body surface side, and a supporter inner wall surface extending from the supporter front surface to the supporter rear surface. An intersection line can be drawn between the supporter inner wall surface and the supporter rear surface. An intersection point between a side surface located at one widthwise end of each land section and the intersection line may be defined as a first end point, and an intersection point between a side surface located at another widthwise end of the land section and another intersection line may be defined as a second end point. At a side of the first end point, the protrusion located at the longitudinal end of each land section may be located outward of the vapor path in a longitudinal direction relative to the first end point. At a side of the second end point, the protrusion located at the longitudinal end of each land section may be located inward of the vapor path in the longitudinal direction relative to the second end point.

In the wick sheet according to this embodiment, a longitudinal end of the vapor path may extend to the frame body section, and the supporter may be split by the vapor path.

A vapor chamber according to this embodiment has a working fluid enclosed therein. The vapor chamber includes: a first sheet; a second sheet; and a wick sheet interposed between the first sheet and the second sheet. The wick sheet includes: a first main body surface; a second main body surface located opposite the first main body surface; a frame body section; a plurality of land sections provided apart from each other within the frame body section; and a supporter that supports longitudinal ends of the plurality of land sections to the frame body section. A vapor path through which a vapor of a working fluid travels is provided between the plurality of land sections and extends through the first main body surface and the second main body surface. A liquid flow channel section that communicates with the vapor path and through which the working fluid in a liquid form travels is provided at a second main body surface side of at least one of the land sections. The liquid flow channel section has a plurality of liquid-flow-channel main grooves through which the working fluid in the liquid form travels and that are arranged parallel to each other. A protrusion row is provided between the liquid-flow-channel main grooves that are adjacent to each other. Each protrusion row has a plurality of protrusions. Of the plurality of protrusions, the protrusion located at the longitudinal end of each land section extends out toward the supporter.

A vapor chamber according to this embodiment has a working fluid enclosed therein. The vapor chamber includes: a first sheet; a second sheet; and a wick sheet interposed between the first sheet and the second sheet. The wick sheet includes: a first main body surface; a second main body surface located opposite the first main body surface; a frame body section; a plurality of land sections provided apart from each other within the frame body section; and a supporter that supports longitudinal ends of the plurality of land sections to the frame body section. A vapor path through which a vapor of a working fluid travels is provided between the plurality of land sections and extends from the first main body surface to the second main body surface. A liquid flow channel section that communicates with the vapor path and through which the working fluid in a liquid form travels is provided at a second main body surface side of at least one of the land sections. The liquid flow channel section has a plurality of liquid-flow-channel main grooves through which the working fluid in the liquid form travels and that are arranged parallel to each other. A protrusion row is provided between the liquid-flow-channel main grooves that are adjacent to each other. Each protrusion row has a plurality of protrusions. Of the plurality of protrusions, the protrusion located at the longitudinal end of each land section is disposed apart from the supporter.

An electronic apparatus according to this embodiment includes: a housing; a device accommodated within the housing; and the vapor chamber according to this embodiment that is thermally in contact with the device.

The embodiment of the present disclosure can facilitate circulation of the working fluid within the vapor chamber.

DESCRIPTION OF EMBODIMENTS

First Embodiment

Figure 1:
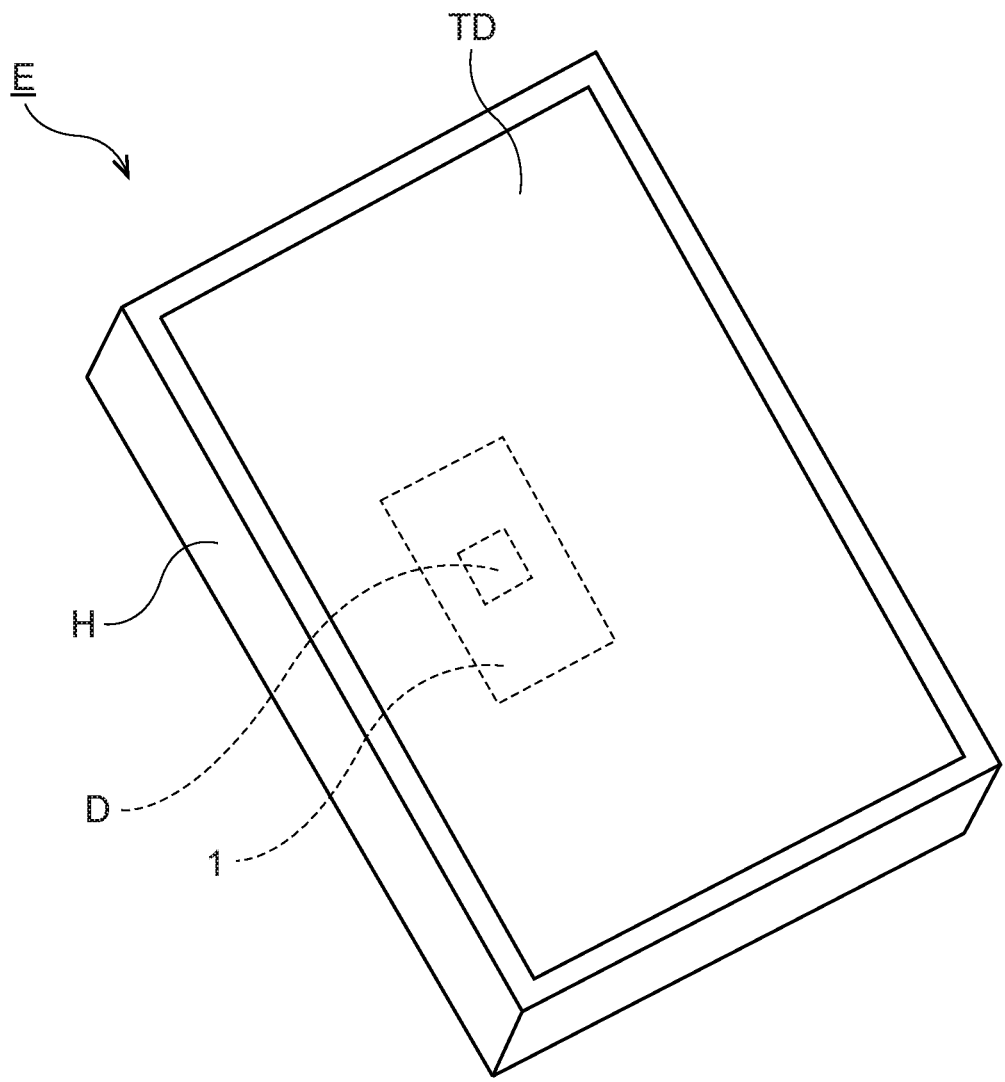
FIG. 1 is a schematic perspective view illustrating an electronic apparatus according to a first embodiment.

A first embodiment will be described below with reference to FIG. 1 to FIG. 27. In the drawings attached to this description, the scales, the aspect ratios, and the like have been appropriately changed and exaggerated from the actuality for the sake of facilitating the understanding of the drawings.

Terms, such as "parallel", "orthogonal", and "identical", used in this description for specifying shapes, geometrical conditions, physical properties, and the degrees thereof, as well as values of lengths, angles, and physical properties, are not limited to strict meanings. These terms and numerical values are to be interpreted while including a range in which similar functions are expectable. Furthermore, in order to clarify the drawings, the shapes of a plurality of parts expectably exhibiting similar functions are indicated in an orderly fashion. Without being limited to strict meanings, these parts may have different shapes within the range in which these functions are expectable. Moreover, in the drawings, boundary lines indicating bonded surfaces between members are denoted by simple straight lines for the sake of convenience. Each boundary line is not strictly limited to being a straight line. Each boundary line may have any shape within a range in which desired bonding performance is expectable.

A vapor chamber, a wick sheet for a vapor chamber, and an electronic apparatus according to this embodiment will now be described with reference to FIG. 1 to FIG. 10. A vapor chamber 1 according to this embodiment is a device equipped in an electronic apparatus E and is for cooling a device D as an exothermic body accommodated in the electronic apparatus E. An example of the device D is an electronic device (device to be cooled) that generates heat and that is used in a mobile terminal, such as a portable terminal or a tablet terminal. An electronic device that generates heat is a central processing unit (CPU), a light emitting diode (LED), a power semiconductor, or the like.

First, the electronic apparatus E equipped with the vapor chamber 1 according to this embodiment will be described with reference to a tablet terminal as an example. As illustrated in FIG. 1, the electronic apparatus E (e.g., tablet terminal) includes a housing H, the device D accommodated within the housing H, and the vapor chamber 1. In the electronic apparatus E illustrated in FIG. 1, the front surface of the housing H is provided with a touchscreen display TD. The vapor chamber 1 is accommodated within the housing H and is disposed thermally in contact with the device D. Accordingly, when the electronic apparatus E is being used, heat generated by the device D can be received by the vapor chamber 1. The heat received by the vapor chamber 1 is released outside the vapor chamber 1 via working fluids 2a and 2b, to be described later. The device D is effectively cooled in this manner. In the case where the electronic apparatus E is a tablet terminal, the device D corresponds to, for example, a central processing unit.

Figure 2:
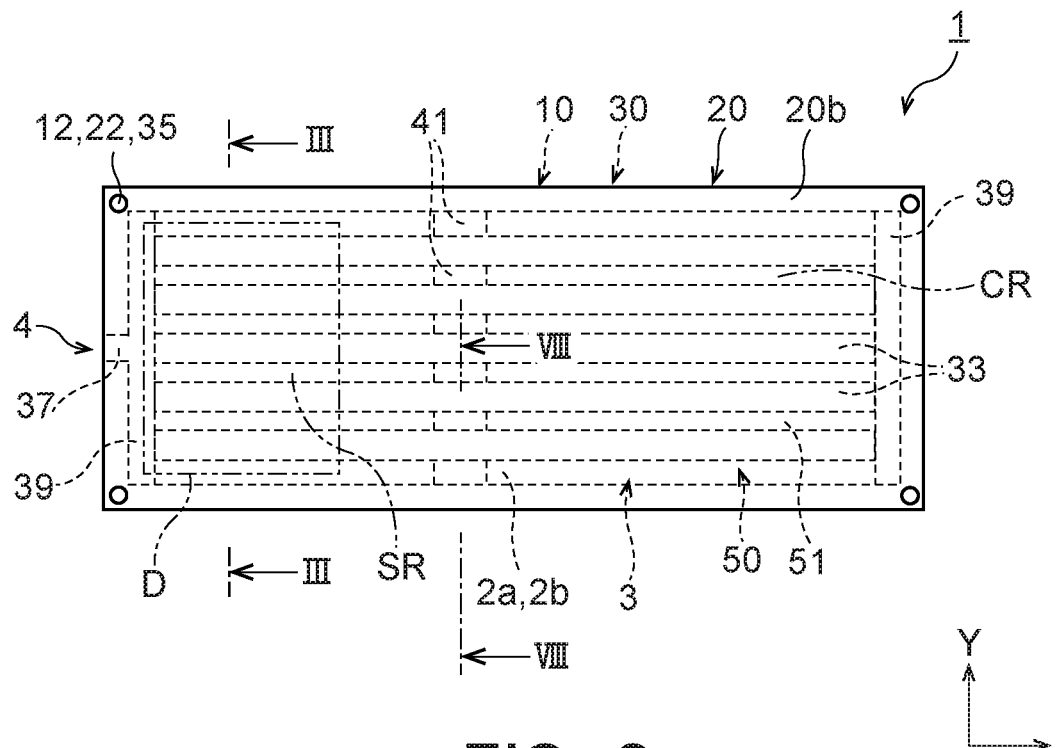
FIG. 2 is a top view illustrating a vapor chamber according to the first embodiment.
Figure 3:
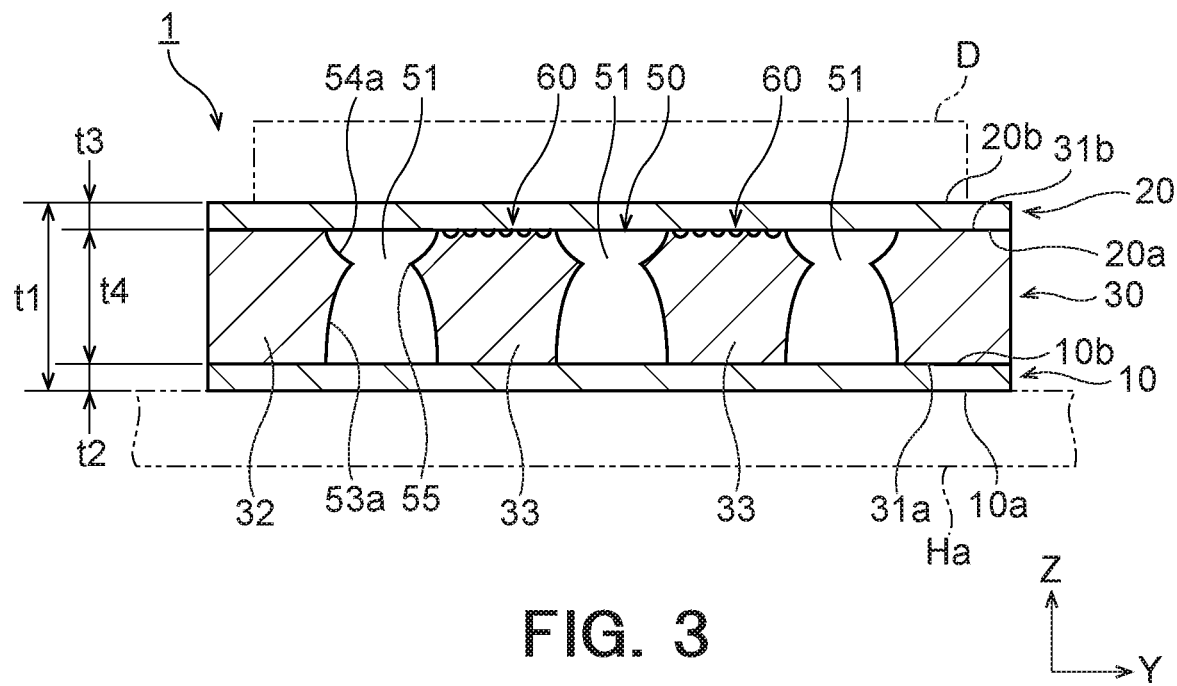
FIG. 3 is a cross-sectional view illustrating the vapor chamber, taken along line III-Ill in FIG. 2.

Next, the vapor chamber 1 according to this embodiment will be described. As illustrated in FIG. 2 and FIG. 3, the vapor chamber 1 has a sealed space 3 in which the working fluids 2a and 2b are enclosed. The vapor chamber 1 is configured to effectively cool the device D in the aforementioned electronic apparatus E by causing the working fluids 2a and 2b to repeat a phase change within the sealed space 3. Examples of the working fluids 2a and 2b include pure water, ethanol, methanol, acetone, and a mixture of the above. The working fluids 2a and 2b may have freezing expansibility. Specifically, the working fluids 2a and 2b may each be a fluid that expands when the fluid freezes. An example of the working fluids 2a and 2b having freezing expansibility is pure water or an aqueous solution obtained by adding an additive, such as alcohol, to pure water.

As illustrated in FIG. 2 and FIG. 3, the vapor chamber 1 includes a lower sheet 10 (first sheet), an upper sheet 20 (second sheet), and a wick sheet (simply referred to as "wick sheet 30" hereinafter) for the vapor chamber. The wick sheet 30 is interposed between the lower sheet 10 and the upper sheet 20. In the vapor chamber 1 according to this embodiment, the lower sheet 10, the wick sheet 30, and the upper sheet 20 are laminated in this order.

The vapor chamber 1 has a substantially thin plate-like shape. Although the vapor chamber 1 may have any planar shape, the vapor chamber 1 may have a rectangular shape, as illustrated in FIG. 2. For example, the planar shape of the vapor chamber 1 may be a rectangle with one side being 50 mm or more and 200 mm or less and another side being 150 mm or more and 600 mm or less, or a square with each side being 70 mm or more and 300 mm or less, and the vapor chamber 1 may have any planar dimensions. This embodiment relates to an example where the vapor chamber 1 has a rectangular planar shape with an X direction to be described below as the longitudinal direction. In this case, as illustrated in FIG. 4 to FIG. 7, the lower sheet 10, the upper sheet 20, and the wick sheet 30 may each have a planar shape similar to that of the vapor chamber 1. The planar shape of the vapor chamber 1 is not limited to a rectangular shape and may be any shape, such as a circular shape, an elliptical shape, an L-shape, a T-shape, or a U-shape.

As illustrated in FIG. 2, the vapor chamber 1 has an evaporation area SR where the working fluids 2a and 2b evaporate, and a condensation area CR where the working fluids 2a and 2b condense.

The evaporation area SR is an area that overlaps the device D in plan view and to which the device D is attached. The evaporation area SR may be disposed at any location of the vapor chamber 1. In this embodiment, the evaporation area SR is provided at one side (left side in FIG. 2) of the vapor chamber 1 in the X direction. The heat from the device D is transmitted to the evaporation area SR, and this heat causes a working fluid in a liquid form (referred to as a working liquid 2b, where appropriate) to evaporate at the evaporation area SR. The heat from the device D may be transmitted not only to the area overlapping the device D in plan view but also to an area surrounding the aforementioned area. Therefore, in plan view, the evaporation area SR includes the area overlapping the device D and the surrounding area thereof. Plan view in this case is a state as viewed from a direction orthogonal to a surface (second upper sheet surface 20b, to be described later, of the upper sheet 20) where the vapor chamber 1 receives heat from the device D and a surface (first lower sheet surface 10a, to be described later, of the lower sheet 10) where the vapor chamber 1 releases the heat. Specifically, for example, as illustrated in FIG. 2, plan view corresponds to a state of the vapor chamber 1 as viewed from above and a state thereof as viewed from below.

The condensation area CR is an area that does not overlap the device D in plan view and where a working vapor 2a mainly condenses by releasing heat. The condensation area CR can also be regarded as an area surrounding the evaporation area SR. Heat from the working vapor 2a is released to the lower sheet 10 in the condensation area CR, so that the working vapor 2a condenses by being cooled in the condensation area CR.

In a case where the vapor chamber 1 is installed in a mobile terminal, the vertical relationship may sometimes be lost depending on the orientation of the mobile terminal. However, in this embodiment, a sheet that receives heat from the device D is referred to as the upper sheet 20 mentioned above and a sheet that releases the received heat is referred to as the lower sheet 10 mentioned above for the sake of convenience. Therefore, the description will proceed below in a state where the lower sheet 10 is disposed at the lower side and the upper sheet 20 is disposed at the upper side.

Figure 4:
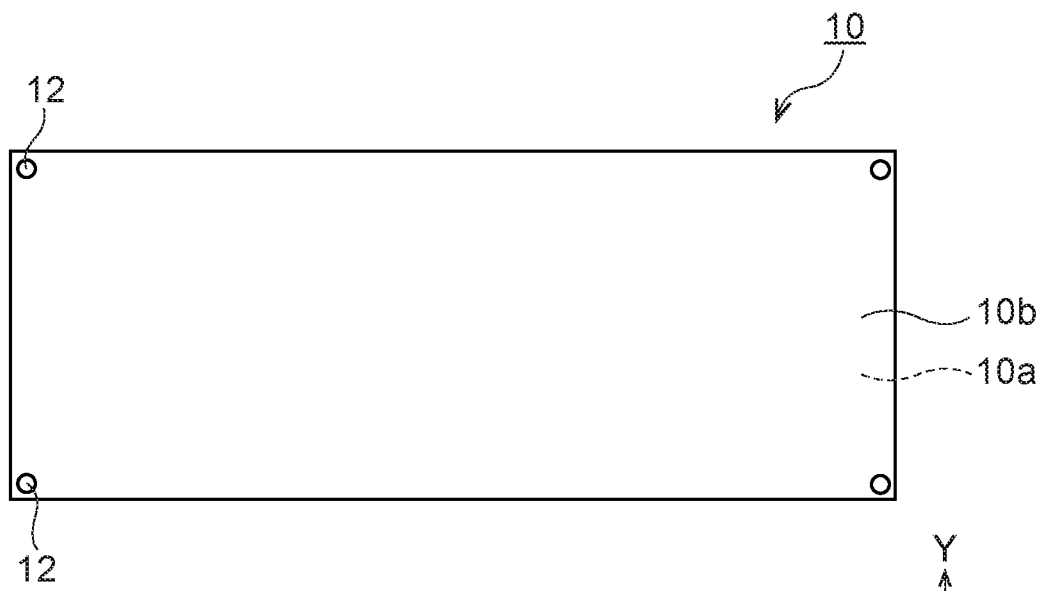
FIG. 4 is a top view of a lower sheet in FIG. 3.

As illustrated in FIG. 3, the lower sheet 10 has a first lower sheet surface 10a located opposite the wick sheet 30, and also has a second lower sheet surface 10b located opposite the first lower sheet surface 10a (i.e., at the wick sheet 30 side). The lower sheet 10 may entirely be flat, and the lower sheet 10 may entirely have a fixed thickness. A housing member Ha serving as a part of a housing of a mobile terminal or the like is attached to the first lower sheet surface 10a. The first lower sheet surface 10a may entirely be covered with the housing member Ha. As illustrated in FIG. 4, alignment holes 12 may be provided at the four corners of the lower sheet 10.

Figure 5:
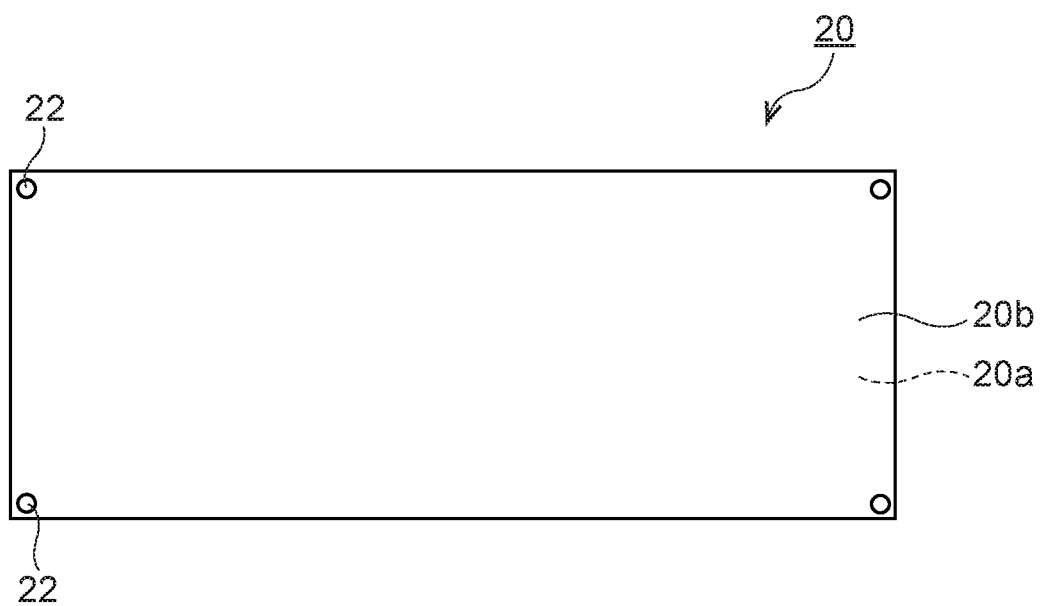
FIG. 5 is a bottom view of an upper sheet in FIG. 3.

As illustrated in FIG. 3, the upper sheet 20 has a first upper sheet surface 20a provided at the wick sheet 30 side, and also has a second upper sheet surface 20b located opposite the first upper sheet surface 20a. The upper sheet 20 may entirely be flat, and the upper sheet 20 may entirely have a fixed thickness. The aforementioned device D is attached to the second upper sheet surface 20b. As illustrated in FIG. 5, alignment holes 22 may be provided at the four corners of the upper sheet 20.

As illustrated in FIG. 3, the wick sheet 30 includes a vapor flow channel section 50 and a liquid flow channel section 60 disposed adjacent to the vapor flow channel section 50. The wick sheet 30 has a first main body surface 31a and a second main body surface 31b located opposite the first main body surface 31a. The first main body surface 31a is disposed at the lower sheet 10 side, and the second main body surface 31b is disposed at the upper sheet 20 side.

The second lower sheet surface 10b of the lower sheet 10 and the first main body surface 31a of the wick sheet 30 may be permanently bonded to each other by diffusion bonding. Likewise, the first upper sheet surface 20a of the upper sheet 20 and the second main body surface 31b of the wick sheet 30 may be permanently bonded to each other by diffusion bonding. The lower sheet 10, the upper sheet 20, and the wick sheet 30 may be bonded to one another by another technique, such as soldering, instead of diffusion bonding so long as they can be permanently bonded to one another. The expression "permanently bonded" is not limited to a strict meaning. The expression "permanently bonded" refers to a degree of bonding where the bonding between the lower sheet 10 and the wick sheet 30 can be maintained and the bonding between the upper sheet 20 and the wick sheet 30 can be maintained to an extent that the sealability of the sealed space 3 is maintainable when the vapor chamber 1 is operating.

Figure 6:
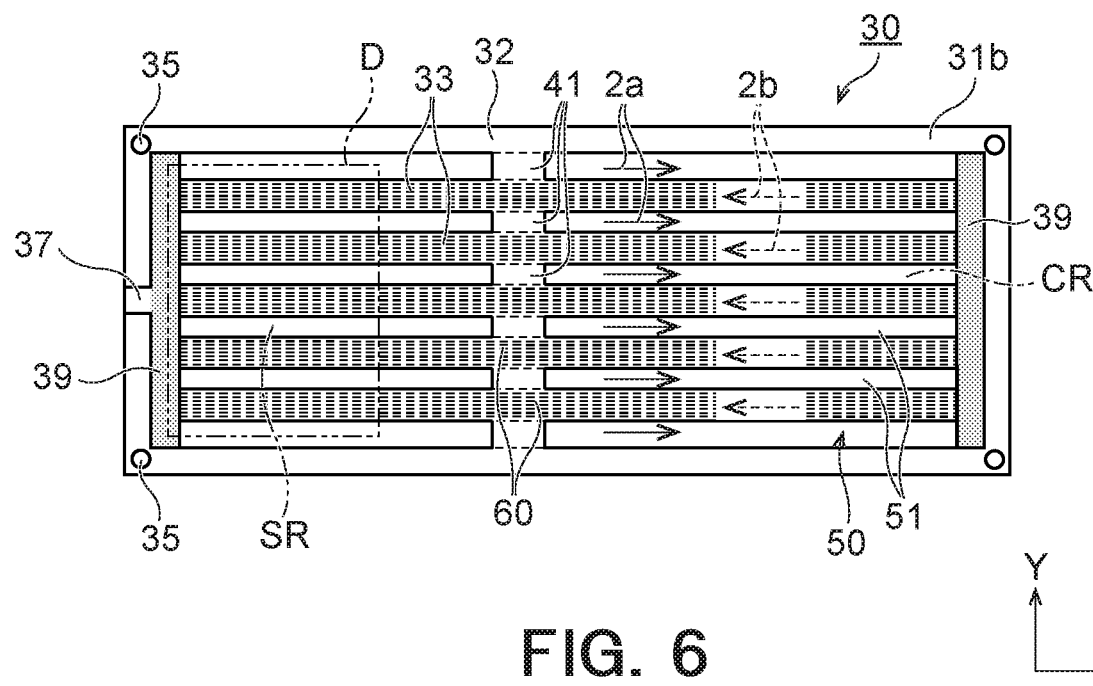
FIG. 6 is a top view of a wick sheet in FIG. 3.
Figure 7:
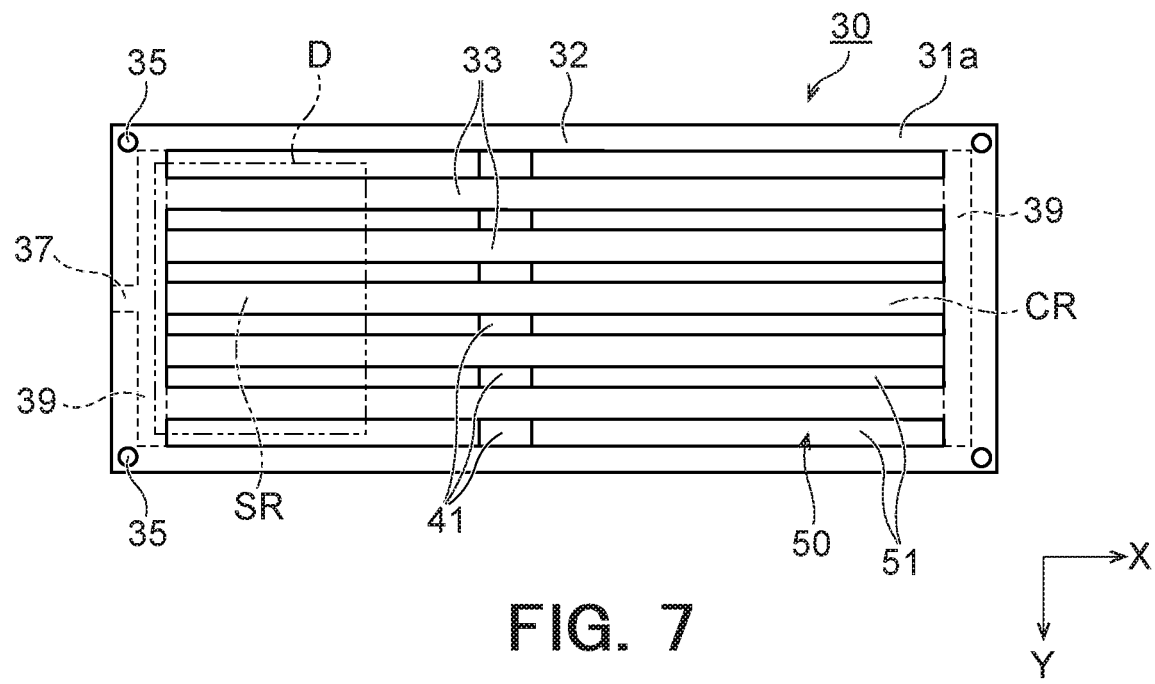
FIG. 7 is a bottom view of the wick sheet in FIG. 3.

As illustrated in FIG. 3, FIG. 6, and FIG. 7, the wick sheet 30 according to this embodiment has a frame body section 32 having a rectangular frame shape in plan view and land sections 33 provided within the frame body section 32. The frame body section 32 and the land sections 33 are sections where the material of the wick sheet 30 remains without being removed by etching in an etching process to be described later. Although the frame body section 32 has a rectangular frame shape in plan view in this embodiment, the shape thereof is not limited to this and may be any frame shape, such as a circular frame shape, an elliptical frame shape, an L-shaped frame shape, a T-shaped frame shape, or a U-shaped frame shape. The vapor flow channel section 50 is defined within the frame body section 32. Specifically, the working vapor 2a flows within the frame body section 32 and around the land sections 33.

In this embodiment, each land section 33 may extend in a long and narrow manner in plan view with the X direction (first direction, horizontal direction in FIG. 6) as the longitudinal direction. Although the planar shape of each land section 33 is a long and narrow rectangular shape, the planar shape thereof is not limited to this and may be any shape, such as a circular-arc or S-like curved shape or a V-like or L-like bent linear shape. The land sections 33 may be arranged parallel to each other while being evenly spaced apart from each other in a Y direction (second direction, vertical direction in FIG. 6). The working vapor 2a flows around each land section 33 so as to be transported toward the condensation area CR. Accordingly, a hindrance to the flow of the working vapor 2a is suppressed. A width w1 (see FIG. 8) of each land section 33 may be, for example, 30 µm or more and 3000 µm or less. The width w1 of each land section 33 is the dimension of the land section 33 in the Y direction and refers to the dimension at the location where the land section 33 is the thickest (e.g., the location where a protrusion 55 to be described later exists).

The frame body section 32 and the land sections 33 are diffusion-bonded to the lower sheet 10 and are also diffusion-bonded to the upper sheet 20. Accordingly, the mechanical strength of the vapor chamber 1 is enhanced. A first wall surface 53a and a second wall surface 54a of a vapor path 51 to be described later constitute a sidewall of each land section 33. The first main body surface 31a and the second main body surface 31b of the wick sheet 30 may be flat throughout the frame body section 32 and the land sections 33.

The vapor flow channel section 50 is mainly a flow channel through which a vapor of a working fluid (referred to as a working vapor 2a, where appropriate) flows. The vapor flow channel section 50 extends from the first main body surface 31a to the second main body surface 31b and extends through the wick sheet 30.

As illustrated in FIG. 6 and FIG. 7, the vapor flow channel section 50 according to this embodiment has a plurality of vapor paths 51. The vapor paths 51 are provided at the inner side of the frame body section 32 and at the outer side of the land sections 33, that is, between the frame body section 32 and the land sections 33, and between adjacent land sections 33. Although the planar shape of each vapor path 51 is a long and narrow rectangular shape, the planar shape thereof is not limited to this and may be any shape, such as a circular-arc or S-like curved shape or a V-like or L-like bent linear shape. The vapor flow channel section 50 is segmented into the plurality of vapor paths 51 by the plurality of land sections 33.

As illustrated in FIG. 3, the vapor paths 51 are provided so as to extend from the first main body surface 31a to the second main body surface 31b of the wick sheet 30. Furthermore, the vapor paths 51 are provided so as to extend through the wick sheet 30 from the first main body surface 31a to the second main body surface 31b of the wick sheet 30.

Figure 8:
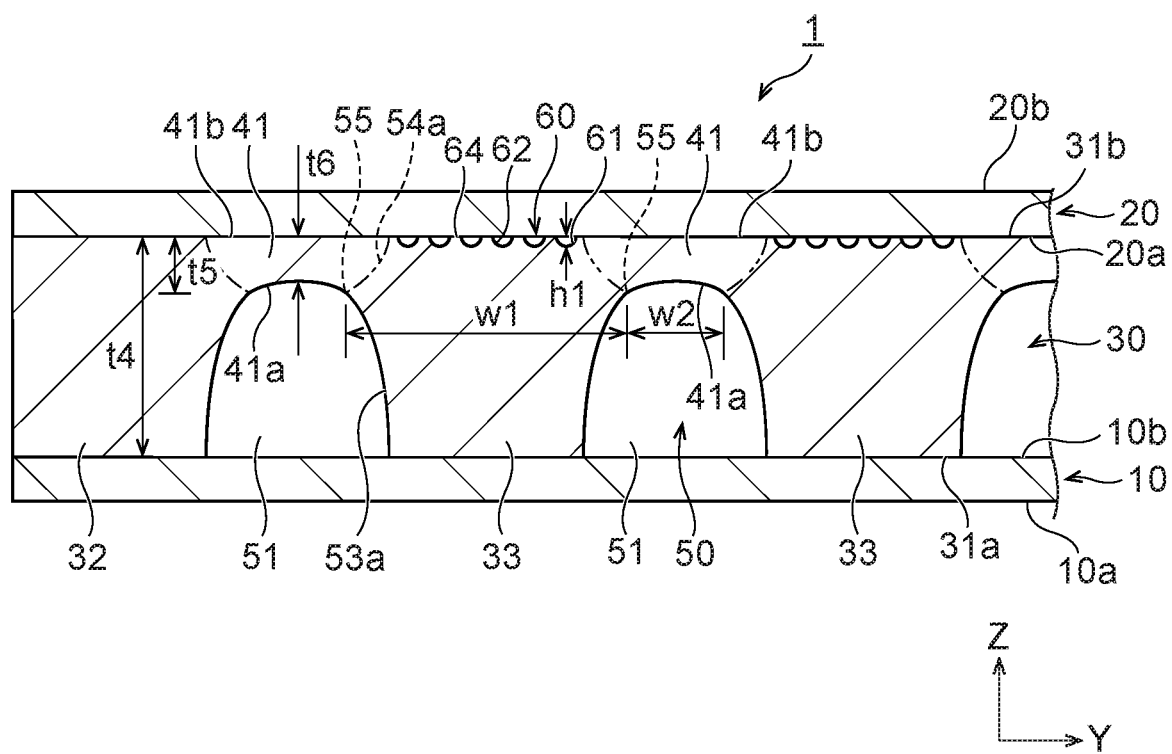
FIG. 8 is a partially-enlarged cross-sectional view of FIG. 3 (cross-sectional view taken along line VIII-VIII in FIG. 2).

The vapor paths 51 may each be formed by etching from the first main body surface 31a and the second main body surface 31b of the wick sheet 30 in an etching process to be described later. In this case, as illustrated in FIG. 8, each vapor path 51 has a first wall surface 53a having a bent shape and a second wall surface 54a having a bent shape. The first wall surface 53a is located at the first main body surface 31a side and is bent into a shape that is recessed inward in the width direction (Y direction) of the corresponding land section 33. The second wall surface 54a is located at the second main body surface 31b side and is bent into a shape that is recessed inward in the width direction (Y direction) of the corresponding land section 33. The first wall surface 53a and the second wall surface 54a merge at a protrusion 55 provided to protrude into the vapor path 51. The protrusion 55 may be acute in cross section. The vapor path 51 has a minimum planar area at the location where the protrusion 55 exists. A width w2 (see FIG. 8) of the vapor path 51 may be, for example, 100 µm or more and 5000 µm or less. The width w2 of the vapor path 51 is the width at the narrowest portion of the vapor path 51 and, in this case, refers to a distance measured in the width direction (Y direction) at the location where the protrusion 55 exists. Furthermore, the width w2 of the vapor path 51 corresponds to a gap between adjacent land sections 33 in the width direction (Y direction).

The position of the protrusion 55 in the thickness direction (Z direction) of the wick sheet 30 is offset toward the second main body surface 31b relative to the center position between the first main body surface 31a and the second main body surface 31b. When a distance between the protrusion 55 and the second main body surface 31b is defined as t5 (see FIG. 8), the distance t5 may be 5% or more, 10% or more, or 20% or more of a thickness t4 (see FIG. 8) of the wick sheet 30 to be described later. The distance t5 may be 50% or less, 40% or less, or 30% or less of the thickness t4 of the wick sheet 30. The position of the protrusion 55 in the thickness direction (Z direction) of the wick sheet 30 is not limited to the above and may be the center position between the first main body surface 31a and the second main body surface 31b or may be offset toward the first main body surface 31a relative to the center position. The protrusion 55 may be located at any position so long as the vapor path 51 extends through the wick sheet 30 in the thickness direction (Z direction).

Furthermore, although the cross-sectional shape of each vapor path 51 is defined by the corresponding protrusion 55 provided to protrude inward, the cross-sectional shape is not limited to this. For example, the cross-sectional shape of each vapor path 51 may be a trapezoidal shape or a rectangular shape, or may be a barrel-like shape.

The vapor flow channel section 50 including the vapor paths 51 having the above configuration serves as a part of the aforementioned sealed space 3. As illustrated in FIG. 3, the vapor flow channel section 50 according to this embodiment is mainly defined by the lower sheet 10, the upper sheet 20, and the frame body section 32 and the land sections 33 of the aforementioned wick sheet 30. Each vapor path 51 has a relatively large flow-channel cross sectional area to allow the working vapor 2a to travel therethrough.

As illustrated in FIG. 2, FIG. 6, FIG. 7, and FIG. 8, a plurality of bridges 41 are provided within the vapor flow channel section 50. Of the plurality of bridges 41, one or more of the bridges 41 couple the land sections 33 and the frame body section 32 to each other, and the remaining one or more of the bridges 41 couple adjacent land sections 33 to each other. In detail, the bridges 41 couple the land sections 33 to the land sections 33 adjacent to the aforementioned land sections 33 in the width direction (Y direction) or to the frame body section 32. The bridges 41 are provided so as to extend across the vapor paths 51 in the width direction (Y direction). In this case, each of the vapor paths 51 is provided with one bridge 41. By disposing the bridges 41 in all of the vapor paths 51 in this manner, deformation of the land sections 33 can be effectively suppressed.

Although the locations of the bridges 41 in the vapor flow channel section 50 are not limited, it is preferable that the bridges 41 be disposed in portions of the vapor flow channel section 50 where the width is relatively large. Accordingly, a decrease in cross-sectional area of the vapor flow channel section 50 can be suppressed at the locations where the bridges 41 are disposed, and an increase in resistance in the vapor flow channel section 50 can be suppressed. For example, if the width of one vapor path 51 varies in the longitudinal direction of the vapor path 51, the corresponding bridge 41 may be provided in a portion of this vapor path 51 where the width is relatively large. In this case, a decrease in traveling speed of the working vapor 2a with reference to the bridge 41 can be suppressed. If multiple vapor paths 51 have different widths, a bridge or bridges 41 may be disposed in a vapor path or paths 51 with a relatively large width among the multiple vapor paths 51. In this case, an occurrence of a portion (low-temperature portion) where the working vapor 2a is difficult to flow partially in the vapor chamber 1 is suppressed.

Each bridge 41 is rectangular in plan view. Moreover, the bridges 41 are integrated with the land sections 33 and the frame body section 32 and are composed of the same material as the land sections 33 and the frame body section 32. The bridges 41 may be provided at arbitrary locations in the longitudinal direction (X direction) of the land sections 33. In this case, each bridge 41 is located at an intermediate position in the longitudinal direction of the corresponding land section 33 and between the evaporation area SR and the condensation area CR. Furthermore, the plurality of bridges 41 are arranged linearly in plan view. In detail, a line connecting the centers of the bridges 41 is located on a line parallel to the width direction (Y direction) of the land sections 33. Accordingly, multiple land sections 33 can be bound in the same area in the longitudinal direction (X direction), so that deformation of the land sections 33 can be suppressed more effectively.

The bridges 41 are areas not extending through the wick sheet 30 in the thickness direction and have a thickness smaller than those of the frame body section 32 and the land sections 33. Accordingly, the thickness of each bridge 41 can be reduced relative to the height of each vapor path 51 (the thickness t4 of the wick sheet 30), so that the vapor path 51 is not blocked. Accordingly, the bridges 41 can be made so as not to hinder the flow of the working vapor 2a within the vapor paths 51.

Furthermore, the bridges 41 are reduced in thickness by half-etching from the first main body surface 31a side. Therefore, when the protrusions 55 are located closer toward the second main body surface 31b than the first main body surface 31a (see FIG. 8), the bridges 41 can be reduced in thickness in a single etching process. Accordingly, an increase in vapor resistance in the vapor paths 51 due to the bridges 41 and an increase in weight of the wick sheet 30 can be suppressed. Moreover, since each bridge 41 and the liquid flow channel section 60 are adjacent to each other, even when a slight gap forms between the bridge 41 and the upper sheet 20, the working liquid 2b entering this gap can be released from the liquid flow channel section 60. Therefore, if the working liquid 2b freezes in an environment where the temperature is lower than the freezing point of the working liquid 2b, widening of the gap between the bridge 41 and the upper sheet 20 due to the frozen working liquid 2b can be suppressed.

As illustrated in FIG. 8, each bridge 41 has a top surface 41b located at the second main body surface 31b side and a bottom surface 41a located at the first main body surface 31a side. The top surface 41b is a flat surface and is located in the same plane as the second main body surface 31. The top surface 41b may entirely or partially be diffusion-bonded to the upper sheet 20. The bottom surface 41a is exposed toward the corresponding vapor path 51. The bottom surface 41a may be a curved surface formed by etching from the first main body surface 31a side and bent toward the second main body surface 31b. Furthermore, when the vapor path 51 is formed by etching, the bridge 41 may be formed together therewith. In this case, the bottom surface 41a is a curved surface extending continuously from the first wall surface 53a of the vapor path 51. A thickness (thickness at the thinnest area) t6 of the bridge 41 may be 5% or more, 10% or more, or 20% or more of the thickness t4 of the wick sheet 30 to be described later. The thickness t6 of the bridge 41 may be 50% or less, 40% or less, or 30% or less of the thickness t4 of the wick sheet 30.

Figure 9:
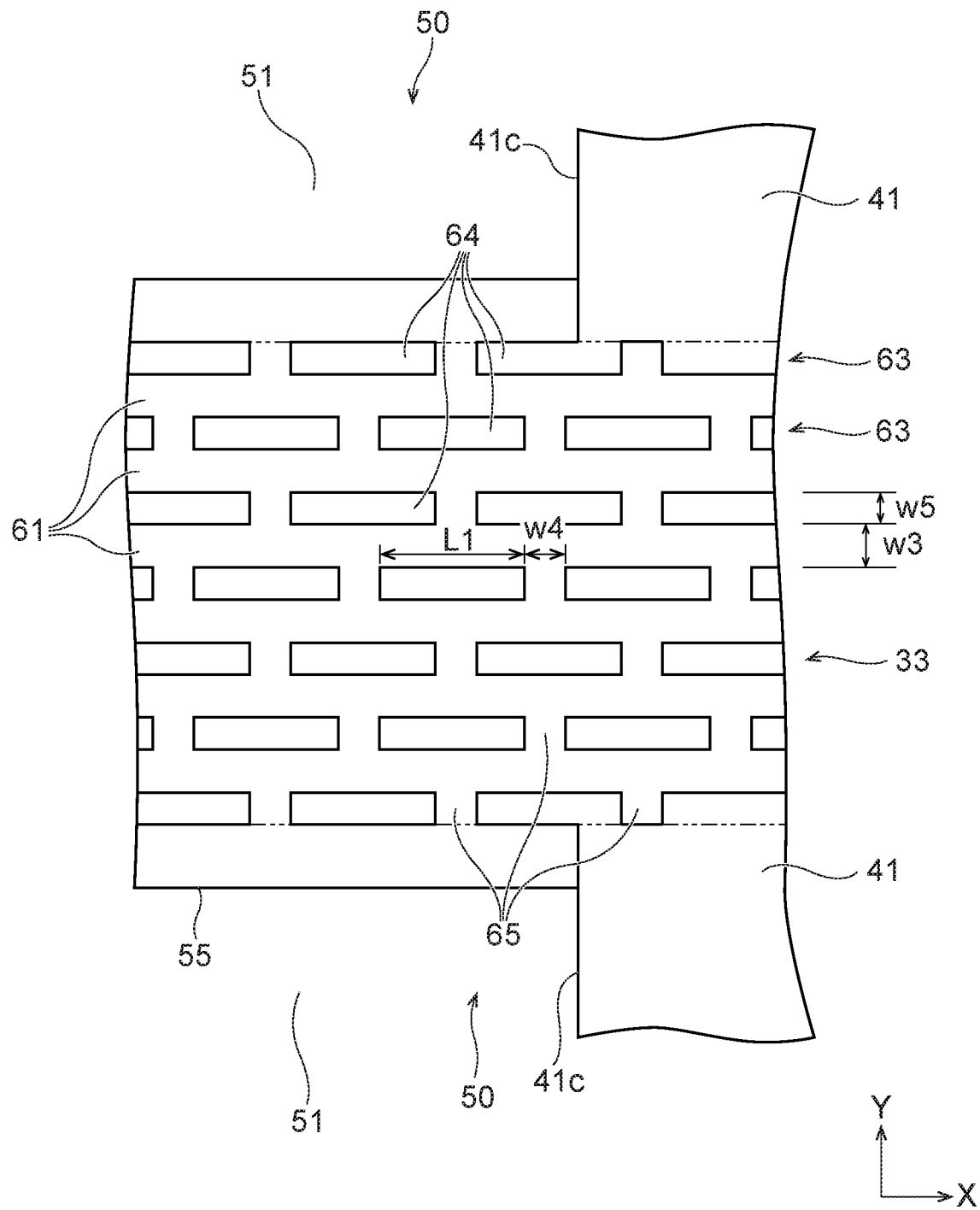
FIG. 9 is a partially-enlarged top view of a liquid flow channel section illustrated in FIG. 6.
Figure 10:
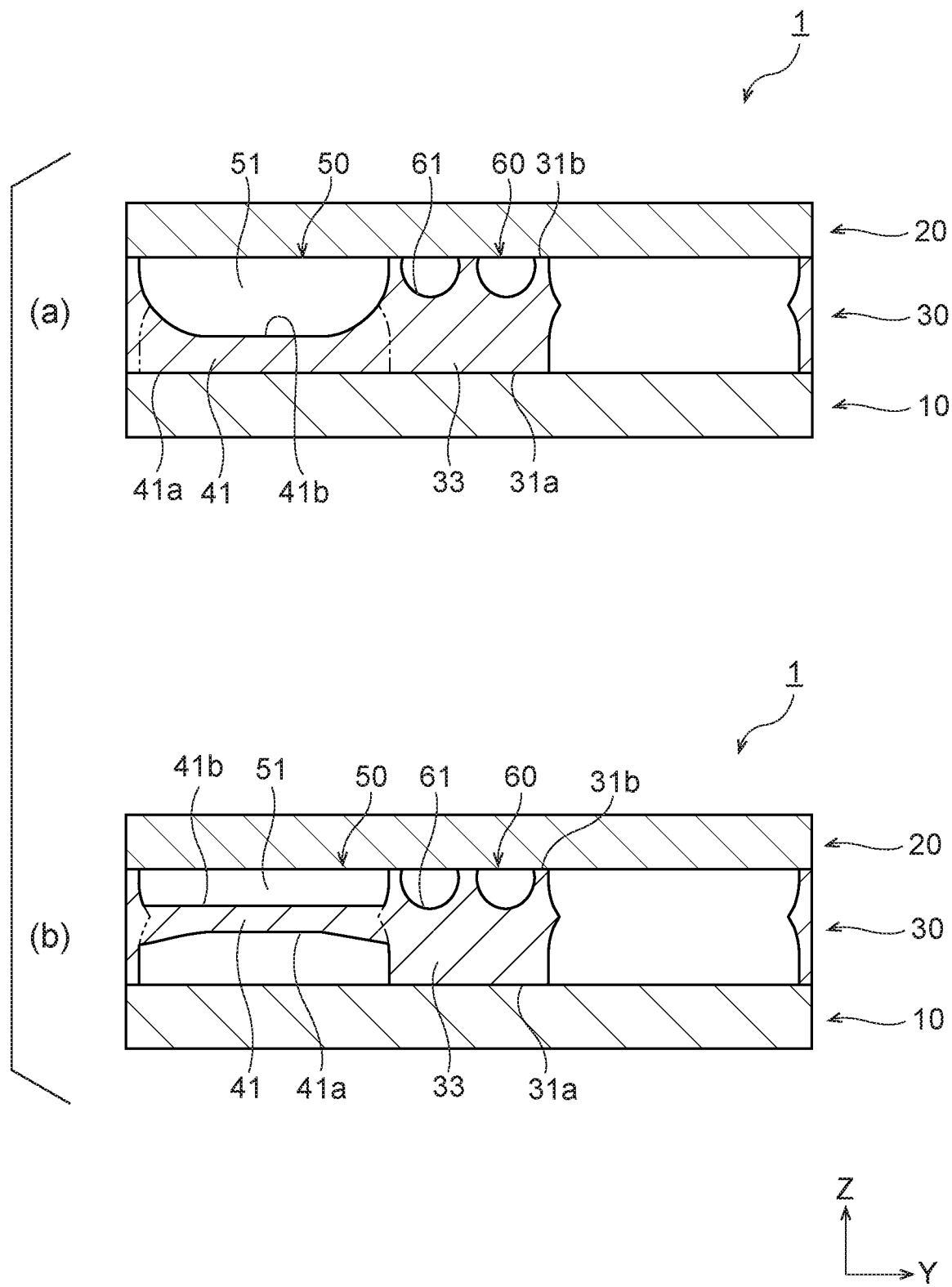
FIG. 10($a$) and FIG. 10($b$) are cross-sectional views illustrating a modification of each bridge.

As illustrated in FIG. 9, each bridge 41 has a side surface 41c between the top surface 41b and the bottom surface 41a. The side surface 41c is oriented in a direction opposing the flowing direction of the working vapor 2a in the corresponding vapor path 51. The side surface 41c may be a flat surface that is orthogonal to the longitudinal direction (X direction) of the vapor path 51.

Accordingly, each land section 33 is coupled to another land section 33 or the frame body section 32 by the corresponding bridge 41, so that the length of a long and narrow space (a part of the corresponding vapor path 51) extending through the wick sheet 30 in one direction (X direction) is reduced. Accordingly, a situation where the wick sheet 30 becomes in the form of a reed screen in one direction (X direction) is suppressed. As a result, the wick sheet 30 is less likely to deform when being handled, and the ease of handling of the wick sheet 30 during manufacturing of the vapor chamber 1 can be improved. Moreover, the flatness of the wick sheet 30 upon completion is enhanced, and the quality of the vapor chamber 1 can be improved.

Alternatively, the bridges 41 may be reduced in thickness by half-etching from the second main body surface 31b side (FIG. 10(a)). In this case, since the bridges 41 do not exist at the second main body surface 31b side, the working vapor 2a or the working liquid 2b can move back and forth smoothly between the vapor paths 51 and the liquid flow channel section 60. Furthermore, the working liquid 2b accumulated on the top surface 41b of each bridge 41 can be readily recovered. Alternatively, the bridges 41 may be reduced in thickness by half-etching from both the first main body surface 31a side and the second main body surface 31b side (FIG. 10(b)). In this case, the bridges 41 are located substantially at the center between the first main body surface 31a and the second main body surface 31b in the thickness direction. Accordingly, a situation where the bridges 41 are readily breakable from only one of the first main body surface 31a and the second main body surface 31b can be suppressed.

As illustrated in FIG. 6 and FIG. 7, a supporter 39 that supports an end of each land section 33 in the longitudinal direction (X direction) to the frame body section 32 is provided within the vapor flow channel section 50. The supporter 39 supports adjacent land sections 33. The supporter 39 is provided at one side (positive side in the X direction) of the land sections 33 in the longitudinal direction (X direction). Alternatively, both sides of the land sections 33 in the longitudinal direction (X direction) may be provided with supporters 39. The supporter 39 is preferably provided so as not to hinder the flow of the working vapor 2a diffusing in the vapor flow channel section 50. In this case, the supporter 39 is disposed at the first main body surface 31a side of the wick sheet 30, and the second main body surface 31b side is provided with a space communicating with the vapor flow channel section 50. In FIG. 6, the supporter 39 is indicated in grey. The supporter 39 is reduced in thickness by half-etching from the second main body surface 31b side. The supporter 39 is an area not extending through the wick sheet 30 in the thickness direction and has a smaller thickness than the frame body section 32. Accordingly, the thickness of the supporter 39 can be made smaller than the thickness of the wick sheet 30, and the vapor paths 51 can be prevented from being split in the X direction and the Y direction. However, the configuration is not limited to this, and the supporter 39 may be disposed at the second main body surface 31b side. Moreover, the surface at the first main body surface 31a side and the surface at the second main body surface 31b side of the supporter 39 may both be provided with spaces communicating with the vapor flow channel section 50.

Furthermore, as illustrated in FIG. 2, the vapor chamber 1 may further include an injection section 4 that is located at an edge at one side in the X direction (negative side in the X direction) and through which the working liquid 2b is injected into the sealed space 3. In the configuration illustrated in FIG. 2, the injection section 4 is disposed at the evaporation area SR side. The injection section 4 has an injection flow channel 37 provided in the wick sheet 30. The injection flow channel 37 is provided at the second main body surface 31b side of the wick sheet 30 and is recessed from the second main body surface 31b side. Upon completion of the vapor chamber 1, the injection flow channel 37 is in a sealed state. Furthermore, the injection flow channel 37 communicates with the vapor flow channel section 50, and the working liquid 2b is injected into the sealed space 3 via the injection flow channel 37. Depending on the position of the liquid flow channel section 60, the injection flow channel 37 may communicate with the liquid flow channel section 60.

Although this embodiment indicates an example where the injection section 4 is provided at one edge of a pair of edges of the vapor chamber 1 in the X direction, the configuration is not limited to this. The injection section 4 may be provided at any position.

As illustrated in FIG. 3, FIG. 6, and FIG. 8, the liquid flow channel section 60 is provided at the second main body surface 31b of the wick sheet 30. The working liquid 2b mainly travels through the liquid flow channel section 60. The liquid flow channel section 60 serves as a part of the aforementioned sealed space 3 and communicates with the vapor flow channel section 50. The liquid flow channel section 60 serves as a capillary (wicking) structure for transporting the working liquid 2b to the evaporation area SR. In this embodiment, the liquid flow channel section 60 is provided at the second main body surface 31b at each land section 33 of the wick sheet 30. The liquid flow channel section 60 may be provided at the entire second main body surface 31b of each land section 33. Of the multiple land sections 33, one or more of the land sections 33 do not have to be provided with the liquid flow channel section 60.

As illustrated in FIG. 9, the liquid flow channel section 60 has a plurality of liquid-flow-channel main grooves 61 through which the working liquid 2b travels and that are arranged parallel to each other, and also has a plurality of liquid-flow-channel communication grooves 65 communicating with the liquid-flow-channel main grooves 61. Although each land section 33 includes six liquid-flow-channel main grooves 61 in the example illustrated in FIG. 9, the configuration is not limited to this. The number of liquid-flow-channel main grooves 61 included in each land section 33 is arbitrary, and may be, for example, 3 or more and 20 or less.

As illustrated in FIG. 9, the liquid-flow-channel main grooves 61 are provided so as to extend in the longitudinal direction (X direction) of each land section 33. The multiple liquid-flow-channel main grooves 61 are arranged parallel to each other. If the land section 33 is bent in plan view, the liquid-flow-channel main grooves 61 may extend in a curved manner in the bent direction of the land section 33. Specifically, the liquid-flow-channel main grooves 61 do not necessarily have to be provided linearly, and do not have to extend parallel to the X direction.

Each liquid-flow-channel main groove 61 has a flow-channel cross-sectional area smaller than that of each vapor path 51 of the vapor flow channel section 50 so that the working liquid 2b flows mainly due to a capillary effect. The liquid-flow-channel main grooves 61 are configured to transport the working liquid 2b condensed from the working vapor 2a to the evaporation area SR. The liquid-flow-channel main grooves 61 are disposed while being spaced apart from each other in the width direction (Y direction).

The liquid-flow-channel main grooves 61 are formed by etching from the second main body surface 31b of the wick sheet 30 in an etching process to be described later. As illustrated in FIG. 8, each liquid-flow-channel main groove 61 has a wall surface 62 having a bent shape. The wall surface 62 defines the liquid-flow-channel main groove 61 and is bent so as to be recessed from the second main body surface 31b side toward the first main body surface 31a side. In the cross section illustrated in FIG. 8, the curvature radius of each wall surface 62 is preferably smaller than the curvature radius of the second wall surface 54a of each vapor path 51.

In FIG. 9, a width w3 of each liquid-flow-channel main groove 61 may be, for example, 2 µm or more and 500 µm or less. The width w3 of the liquid-flow-channel main groove 61 is the length in the direction perpendicular to the longitudinal direction of each land section 33, and in this case, is the dimension in the Y direction. The width w3 of the liquid-flow-channel main groove 61 also refers to the dimension at the second main body surface 31b.

Furthermore, as illustrated in FIG. 8, a depth h1 of each liquid-flow-channel main groove 61 may be, for example, 3 µm or more and 300 µm or less. The depth h1 of the liquid-flow-channel main groove 61 is the distance measured from the second main body surface 31b in the direction perpendicular to the second main body surface 31b, and in this case, is the dimension in the Z direction. The depth h1 is also the depth at the deepest location of the liquid-flow-channel main groove 61.

As illustrated in FIG. 9, each liquid-flow-channel communication groove 65 extends in a direction different from the X direction. In this embodiment, the liquid-flow-channel communication grooves 65 are provided so as to extend in the Y direction, and are provided perpendicularly to the liquid-flow-channel main grooves 61. Some of the liquid-flow-channel communication grooves 65 are disposed so as to allow adjacent liquid-flow-channel main grooves 61 to communicate with each other. The remaining liquid-flow-channel communication grooves 65 are disposed so as to allow the vapor flow channel section 50 (vapor paths 51) and the liquid-flow-channel main grooves 61 closest to the vapor flow channel section 50 to communicate with each other. Specifically, each liquid-flow-channel communication groove 65 extends from an end of the corresponding land section 33 in the Y direction to the liquid-flow-channel main groove 61 adjacent to the aforementioned end. The vapor paths 51 of the vapor flow channel section 50 and the liquid-flow-channel main grooves 61 communicate with each other in this manner.

Each liquid-flow-channel communication groove 65 has a flow-channel cross-sectional area smaller than that of each vapor path 51 of the vapor flow channel section 50 so that the working liquid 2b flows mainly due to a capillary effect. The liquid-flow-channel communication grooves 65 may be disposed while being evenly spaced apart from each other in the longitudinal direction (X direction) of each land section 33.

Similar to each liquid-flow-channel main groove 61, each liquid-flow-channel communication groove 65 is also formed by etching and has a wall surface (not illustrated)

having a bent shape like the liquid-flow-channel main groove 61. As illustrated in FIG. 9, a width w4 (dimension in the X direction) of each liquid-flow-channel communication groove 65 may be 5 μm or more and 300 μm or less. The depth of each liquid-flow-channel communication groove 65 may be 3 μm or more and 300 μm or less.

As illustrated in FIG. 9, adjacent liquid-flow-channel main grooves 61 of the liquid flow channel section 60 have a protrusion row 63 provided therebetween. Although the example illustrated in FIG. 9 relates to a case where each land section 33 includes seven protrusion rows 63, the configuration is not limited to this. The number of protrusion rows 63 included in each land section 33 is arbitrary, and may be, for example, 3 rows or more and 20 rows or less.

As illustrated in FIG. 9, the protrusion rows 63 are provided so as to extend in the longitudinal direction (X direction) of each land section 33. The multiple protrusion rows 63 are arranged parallel to each other. If the land section 33 is bent in plan view, the protrusion rows 63 may extend in a curved manner in the bent direction of the land section 33. Specifically, the protrusion rows 63 do not necessarily have to be provided linearly, and do not have to extend parallel to the X direction. The protrusion rows 63 are disposed while being spaced apart from each other in the width direction (Y direction).

Each protrusion row 63 includes a plurality of protrusions 64 (liquid-flow-channel protrusions) arranged in the X direction. The protrusions 64 are provided within the liquid flow channel section 60 and protrude from the liquid-flow-channel main grooves 61 and the liquid-flow-channel communication grooves 65 so as to be in contact with the upper sheet 20. In plan view, each protrusion 64 has a rectangular shape with the X direction as the longitudinal direction. Each liquid-flow-channel main groove 61 is disposed between adjacent protrusions 64 in the Y direction. Each liquid-flow-channel communication groove 65 is disposed between adjacent protrusions 64 in the X direction. The liquid-flow-channel communication grooves 65 are provided so as to extend in the Y direction, and allow adjacent liquid-flow-channel main grooves 61 in the Y direction to communicate with each other. Accordingly, the working liquid 2b can move back and forth between these liquid-flow-channel main grooves 61.

The protrusions 64 are sections where the material of the wick sheet 30 remains without being removed by etching in an etching process to be described later. In this embodiment, as illustrated in FIG. 9, the planar shape of each protrusion 64 (i.e., the shape at the location of the second main body surface 31b of the wick sheet 30) is a rectangular shape. A width w5 of each protrusion 64 may be, for example, 5 μm or more and 500 μm or less.

In this embodiment, the protrusions 64 are disposed in a staggered (alternate) fashion. In more detail, the protrusions 64 in adjacent protrusion rows 63 in the Y direction are disposed while being offset from each other in the X direction. This offset amount may be half of the arrangement pitch of the protrusions 64 in the X direction. The protrusions 64 are not limited to the staggered arrangement and may be arranged parallel to each other. In this case, the protrusions 64 in adjacent protrusion rows 63 in the Y direction are also aligned with each other in the X direction. The bridges 41 may be integrated with one or more of the protrusions 64 located at an end in the width direction (Y direction).

A length L1 (dimension in the X direction) of each protrusion 64 may be uniform among the protrusions 64. Furthermore, the length L1 of each protrusion 64 is larger than the width w4 of each liquid-flow-channel communication groove 65 (L1>w4). The length L1 of each protrusion 64 refers to the maximum dimension in the X direction at the second main body surface 31b.

The material used for forming the lower sheet 10, the upper sheet 20, and the wick sheet 30 are not particularly limited so long as the material has good thermal conductivity. For example, the lower sheet 10, the upper sheet 20, and the wick sheet 30 may contain copper or a copper alloy. In this case, the thermal conductivity of each of the sheets 10, 20, and 30 can be enhanced, and the heat dissipation efficiency of the vapor chamber 1 can be enhanced. If pure water is used as the working fluids 2a and 2b, corrosion can be prevented. So long as desired heat dissipation efficiency can be achieved and corrosion can be prevented, another metallic material, such as aluminum or titanium, or another metallic alloy material, such as stainless steel, may be used for these sheets 10, 20, and 30.

A thickness t1 of the vapor chamber 1 illustrated in FIG. 3 may be, for example, 100 μm or more and 2000 μm or less. By setting the thickness t1 to 100 μm or more, the vapor flow channel section 50 is appropriately ensured, whereby the vapor chamber 1 can appropriately exhibit its function. On the other hand, by setting the thickness t1 to 2000 μm or less, an increase in the thickness t1 of the vapor chamber 1 can be suppressed.

A thickness t2 of the lower sheet 10 may be, for example, 5 μm or more and 500 μm or less. By setting the thickness t2 to 5 μm or more, the mechanical strength of the lower sheet 10 can be ensured. On the other hand, by setting the thickness t2 to 500 μm or less, an increase in the thickness t1 of the vapor chamber 1 can be suppressed. Likewise, a thickness t3 of the upper sheet 20 may be set similarly to the thickness t2 of the lower sheet 10. The thickness t3 of the upper sheet 20 and the thickness t2 of the lower sheet 10 may be different from each other.

The thickness t4 of the wick sheet 30 may be, for example, 50 μm or more and 1000 μm or less. By setting the thickness t4 to 50 μm or more, the vapor flow channel section 50 is appropriately ensured, so that the vapor chamber 1 can operate appropriately. On the other hand, by setting the thickness t4 to 1000 μm or less, an increase in the thickness t1 of the vapor chamber 1 can be suppressed.

Next, a method for manufacturing the vapor chamber 1 according to this embodiment having the above configuration will be described by using FIG. 11(a) to FIG. 11(c). FIG. 11(a) to FIG. 11(c) are cross-sectional views substantially similar to the cross-sectional view in FIG. 3.

A fabrication process of the wick sheet 30 will be described first.

First, as illustrated in FIG. 11(a), a tabular metallic material sheet M including a first material surface Ma and a second material surface Mb is prepared in a preparation process.

After the preparation process, the vapor flow channel section 50 and the liquid flow channel section 60 are formed by performing an etching process involving etching the metallic material sheet M from the first material surface Ma and the second material surface Mb, as illustrated in FIG. 11(b).

In more detail, a patterned resist film (not illustrated) is formed on each of the first material surface Ma and the second material surface Mb of the metallic material sheet M by photolithography. Then, the first material surface Ma and the second material surface Mb of the metallic material sheet M are etched via openings on the patterned resist films. Accordingly, the first material surface Ma and the second material surface Mb of the metallic material sheet M are pattern-etched, whereby the vapor flow channel section 50 and the liquid flow channel section 60 illustrated in FIG. 11(*b*) are formed. In this case, the metallic material sheet M is half-etched from the first material surface Ma side, so that the bridges 41 are formed. Examples of an etching solution used include an iron-chloride-based etching solution, such as an iron(III)-chloride aqueous solution, and a copper-chloride-based etching solution, such as a copper-chloride aqueous solution.

The first material surface Ma and the second material surface Mb of the metallic material sheet M may be etched simultaneously. However, the etching of the first material surface Ma and the second material surface Mb is not limited to this and may be performed in different processes. Furthermore, the vapor flow channel section 50 and the liquid flow channel section 60 may be formed simultaneously by etching, or may be formed in different processes. Furthermore, the etching process involves etching the first material surface Ma and the second material surface Mb of the metallic material sheet M, so that a predetermined outer contour shape illustrated in FIG. 6 and FIG. 7 is obtained. Specifically, the edges of the wick sheet 30 are formed.

The wick sheet 30 according to this embodiment is obtained in this manner.

Figure 11:
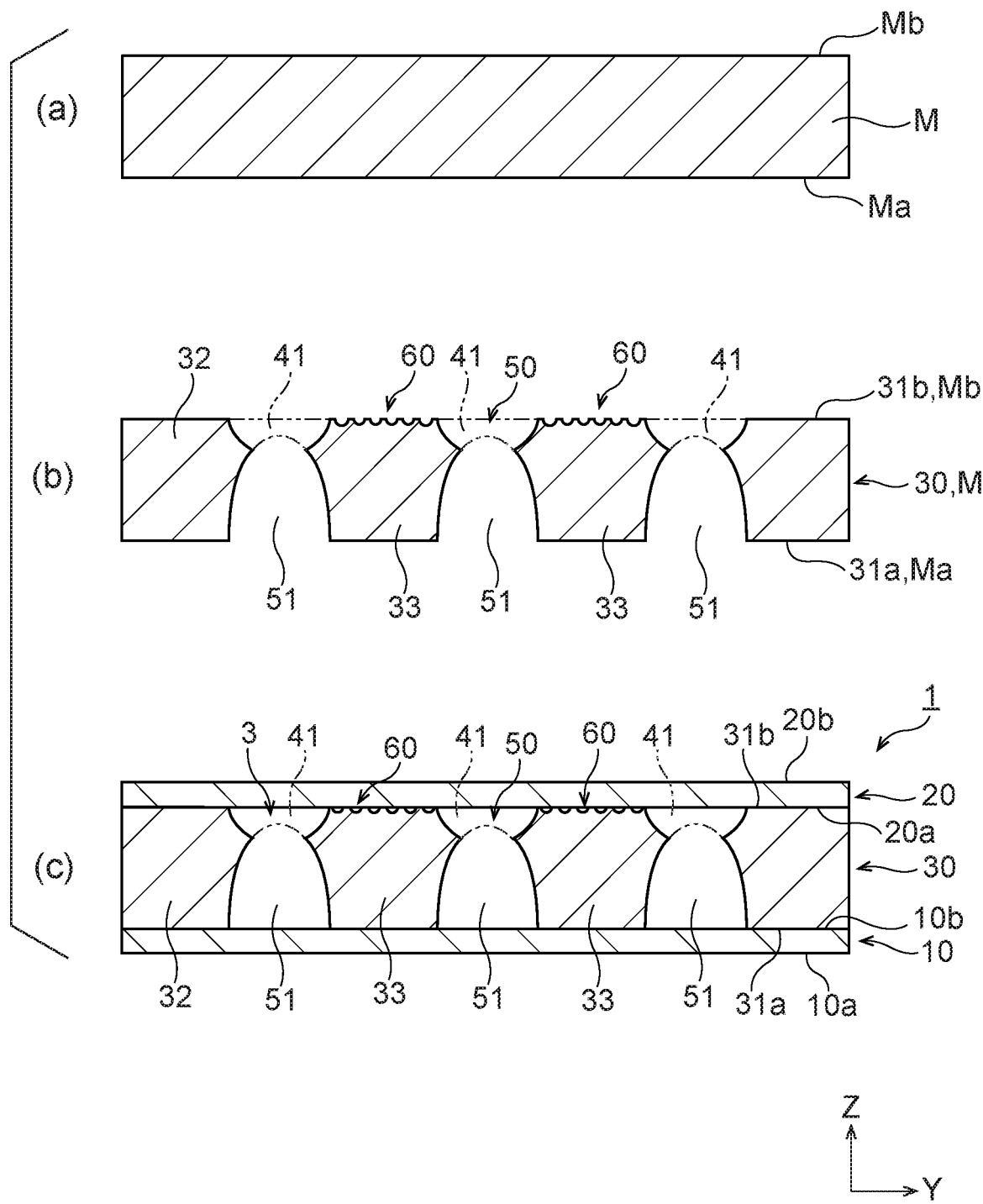
FIG. 11($a$) to FIG. 11($c$) illustrate a method for manufacturing the vapor chamber according to the first embodiment.
Figure 12:
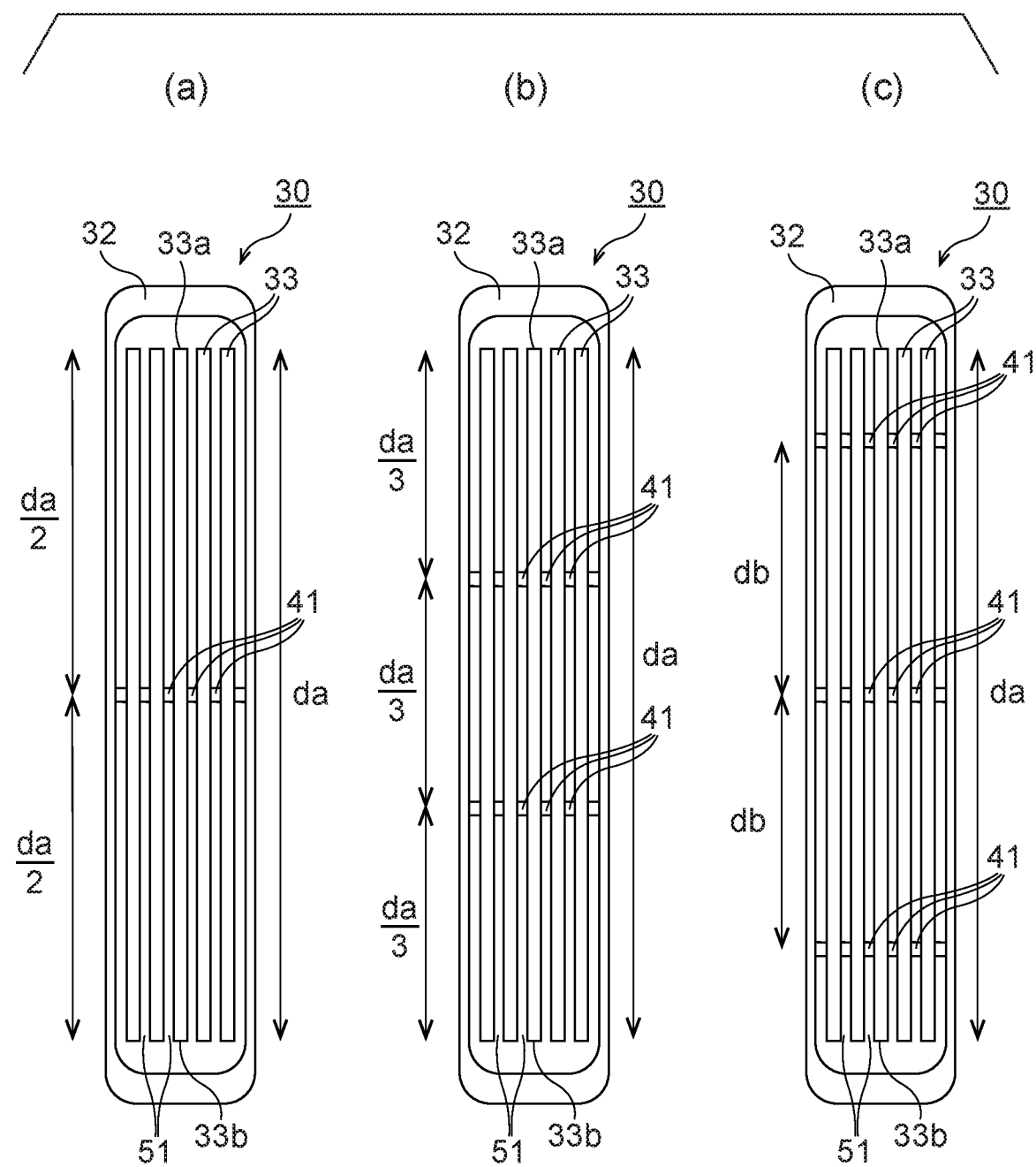
FIG. 12($a$) to FIG. 12($c$) illustrate a wick sheet according to a first modification of the first embodiment.
Figure 13:
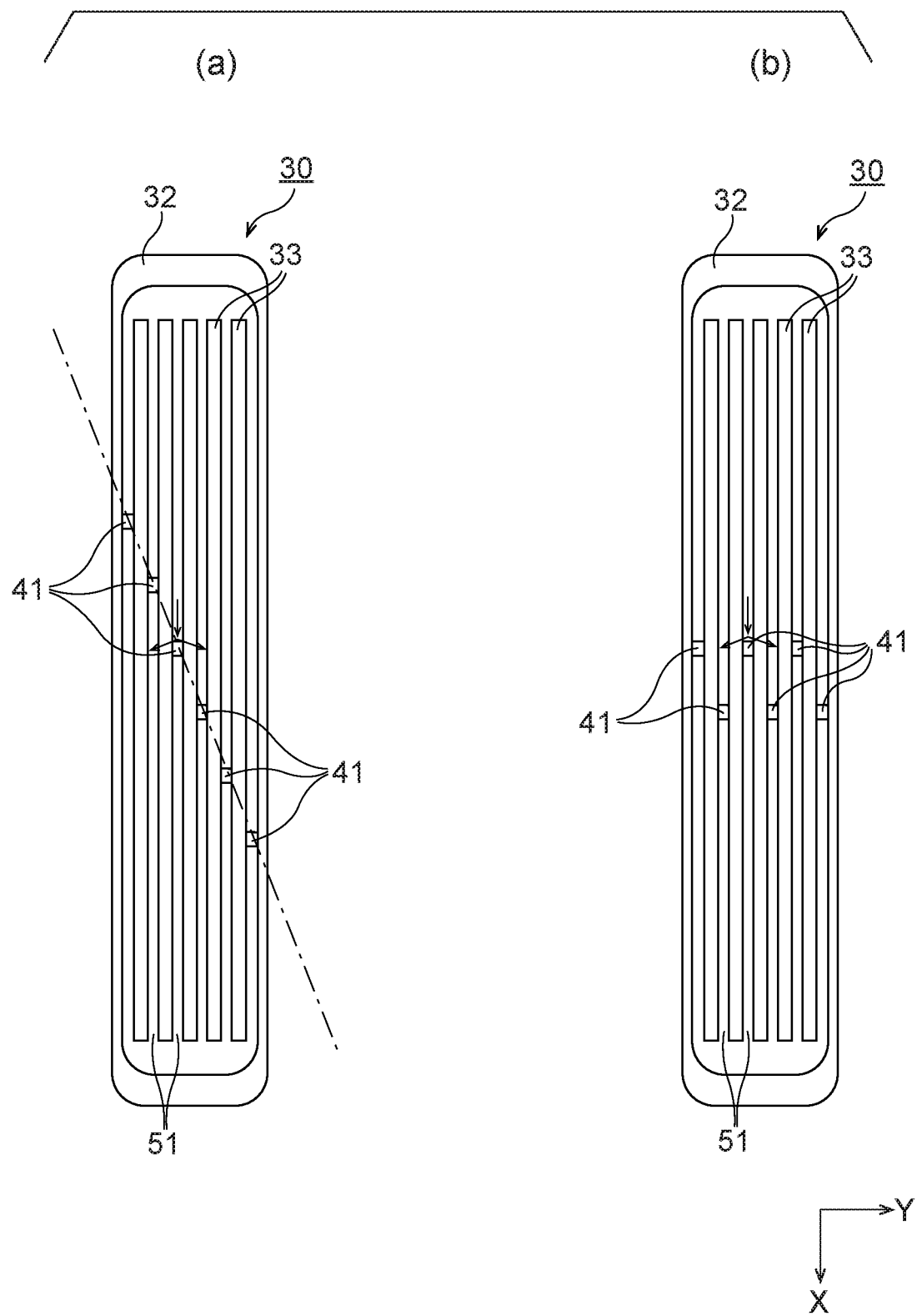
FIG. 13($a$) and FIG. 13($b$) illustrate a wick sheet according to a second modification of the first embodiment.
Figure 14:
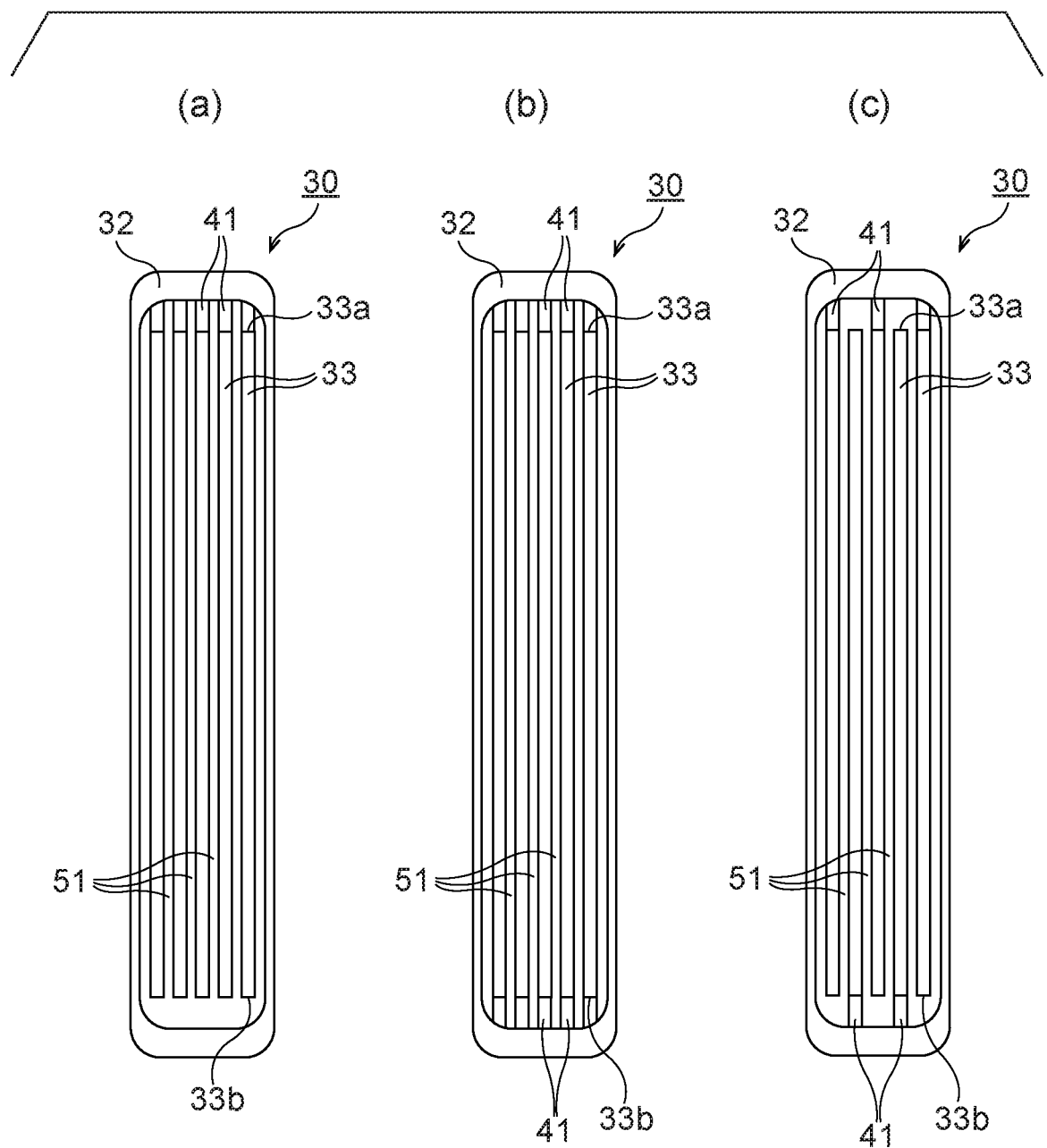
FIG. 14($a$) to FIG. 14($c$) illustrate a wick sheet according to a third modification of the first embodiment.
Figure 15:
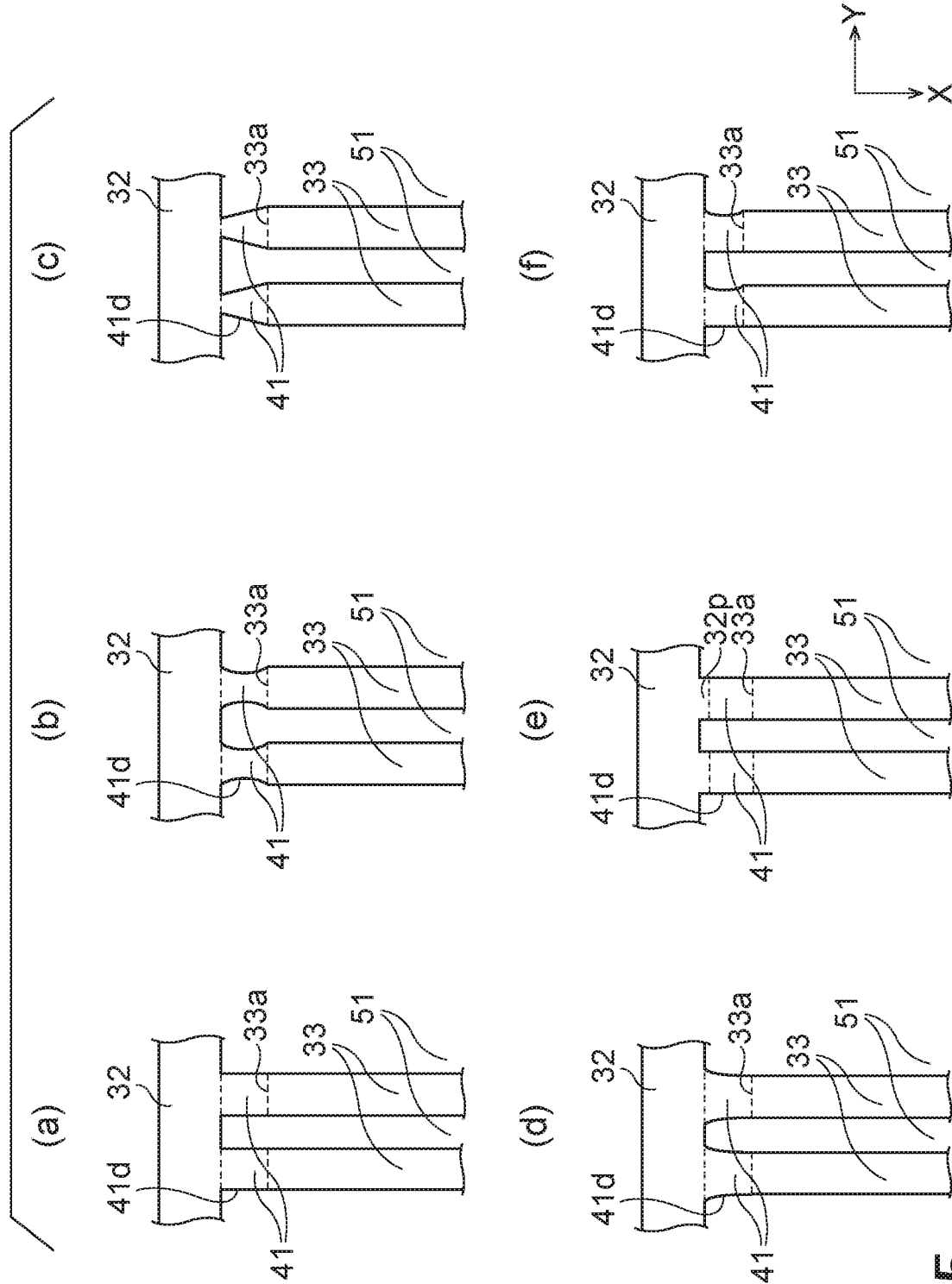
FIG. 15($a$) to FIG. 15($f$) illustrate the wick sheet according to the third modification of the first embodiment.
Figure 16:
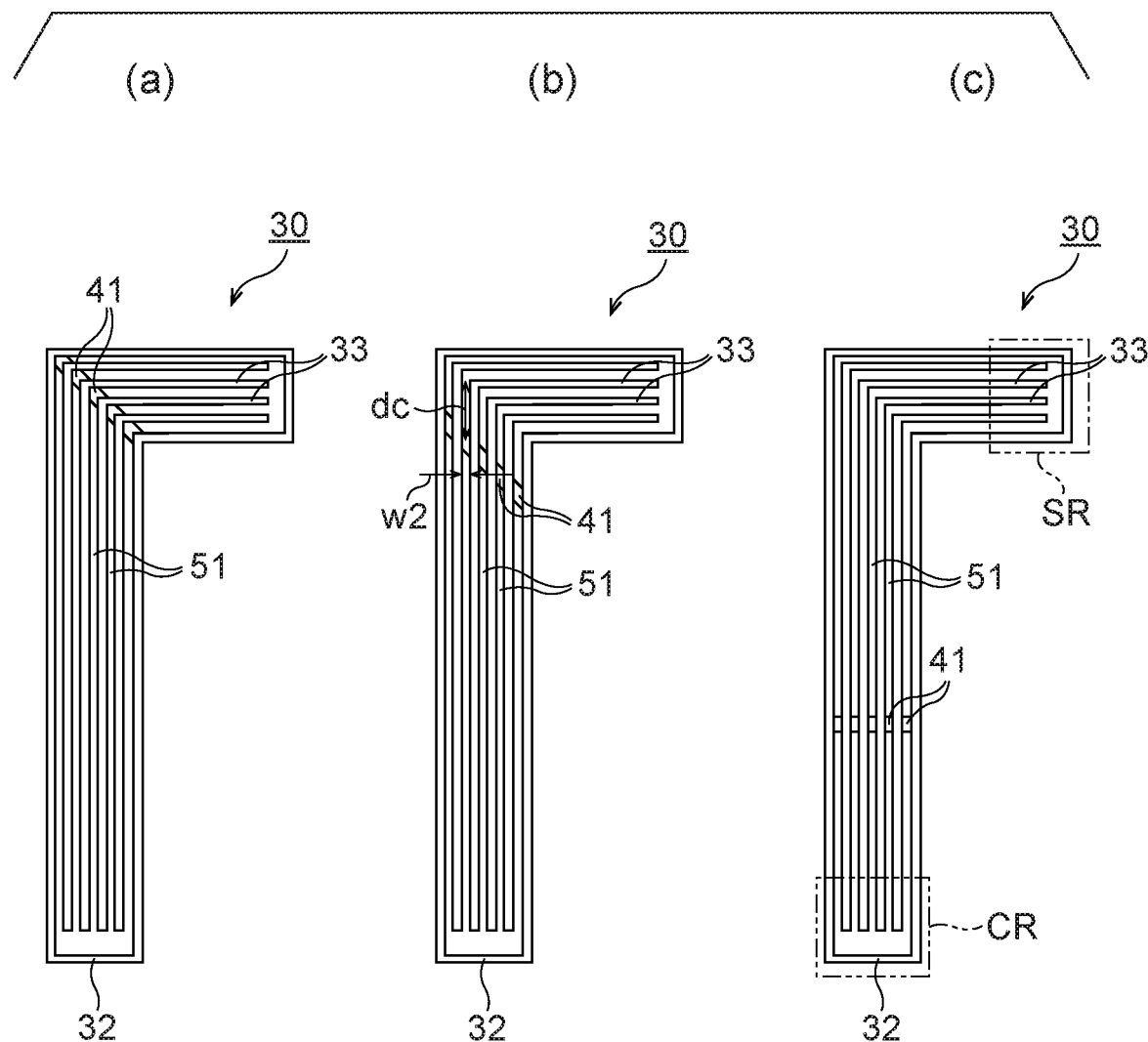
FIG. 16($a$) to FIG. 16($c$) illustrate a wick sheet according to a fourth modification of the first embodiment.
Figure 16:
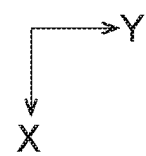
Figure 17:
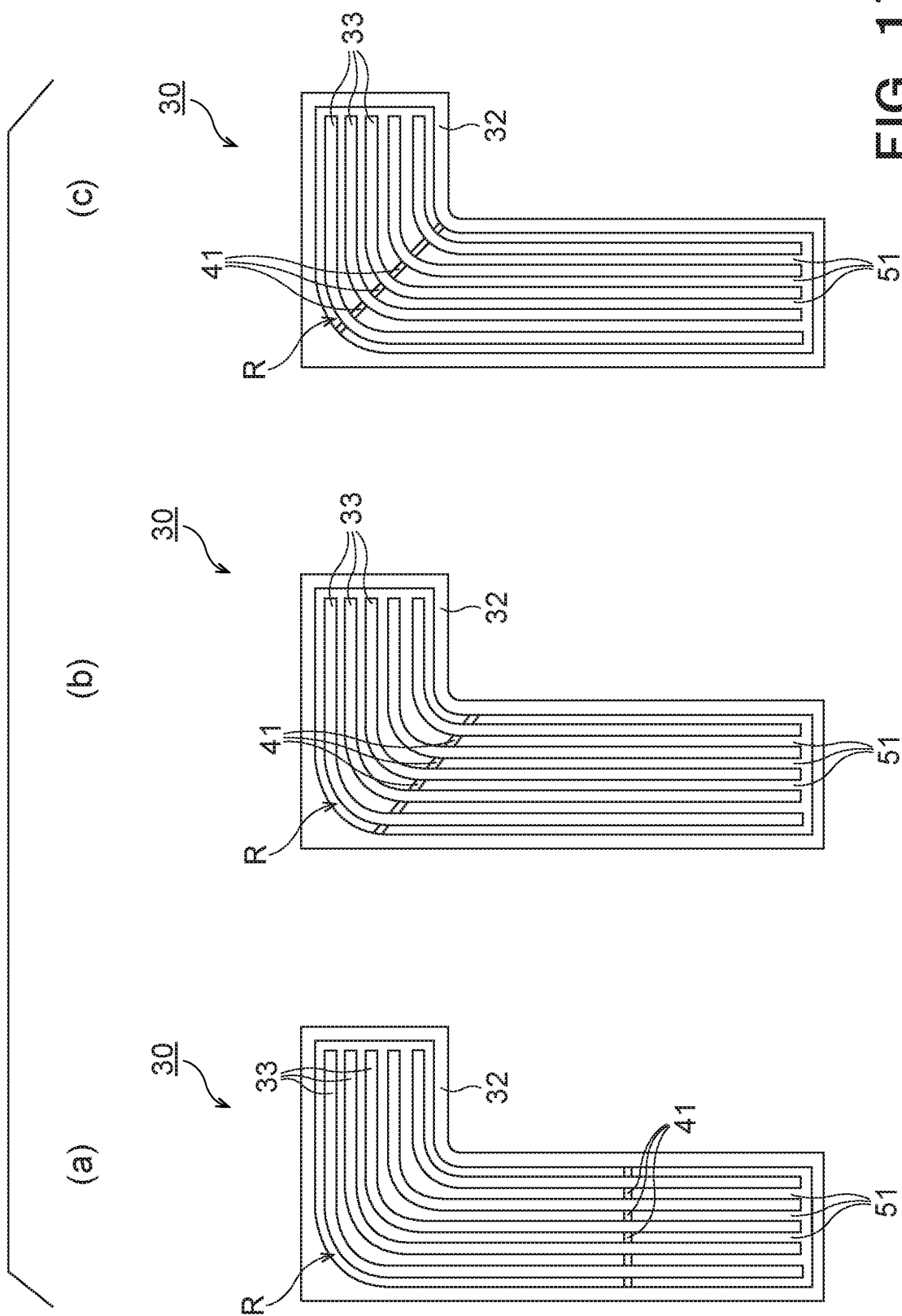
FIG. 17($a$) to FIG. 17($c$) illustrate the wick sheet according to the fourth modification of the first embodiment.
Figure 18:
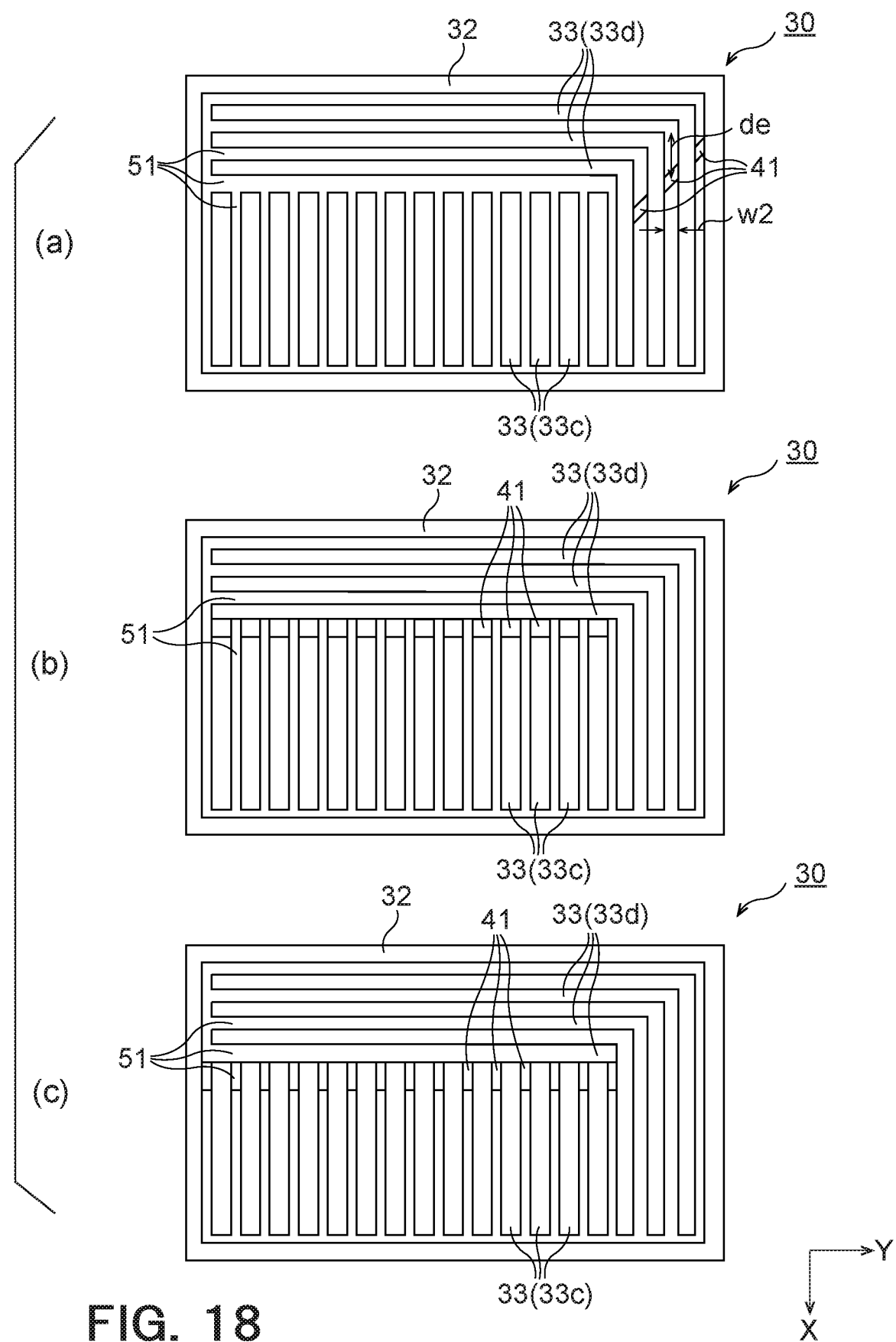
FIG. 18($a$) to FIG. 18($c$) illustrate a wick sheet according to a fifth modification of the first embodiment.
Figure 19:
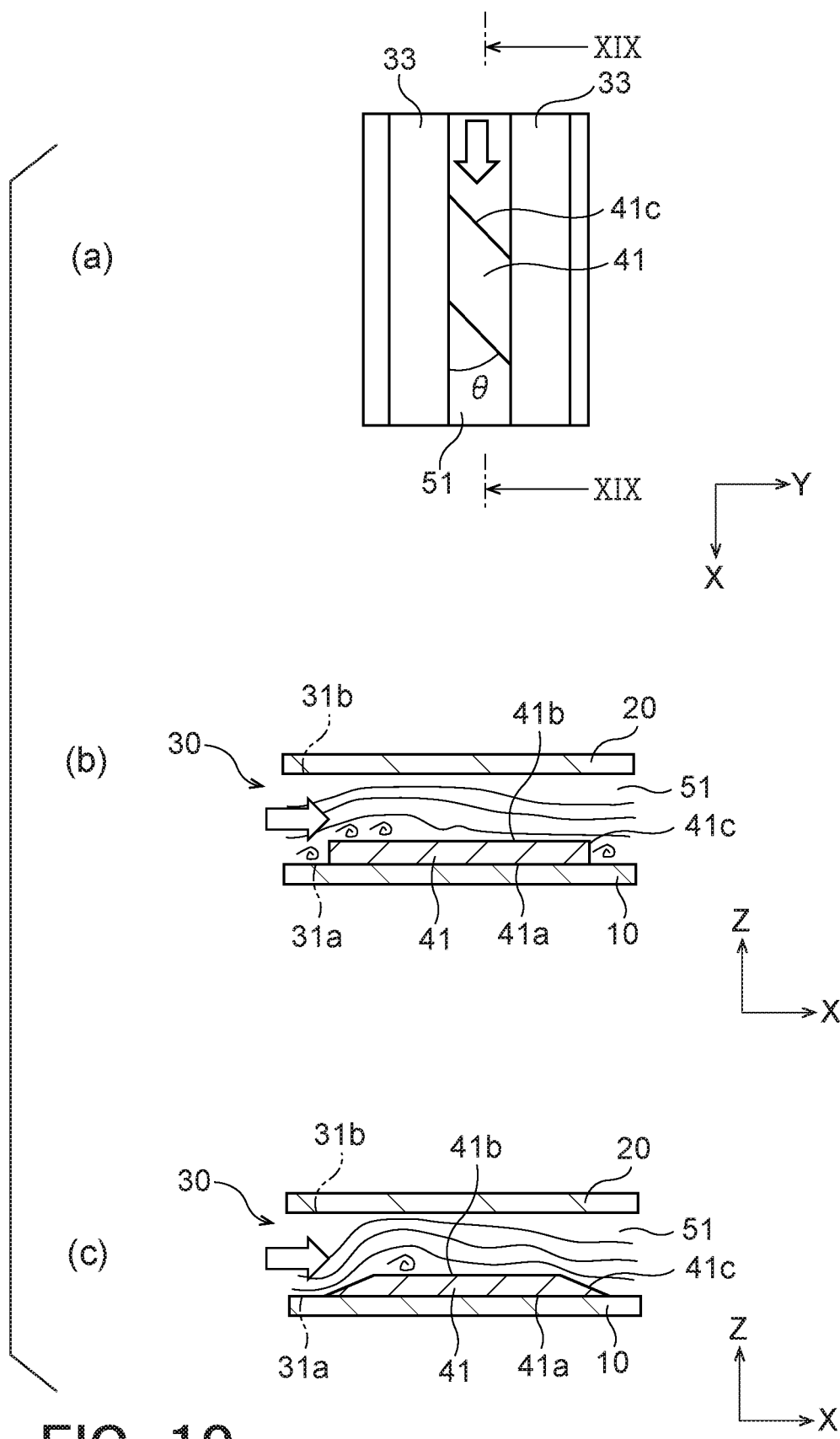
FIG. 19($a$) to FIG. 19($c$) illustrate each bridge according to a sixth modification of the first embodiment.
Figure 20:
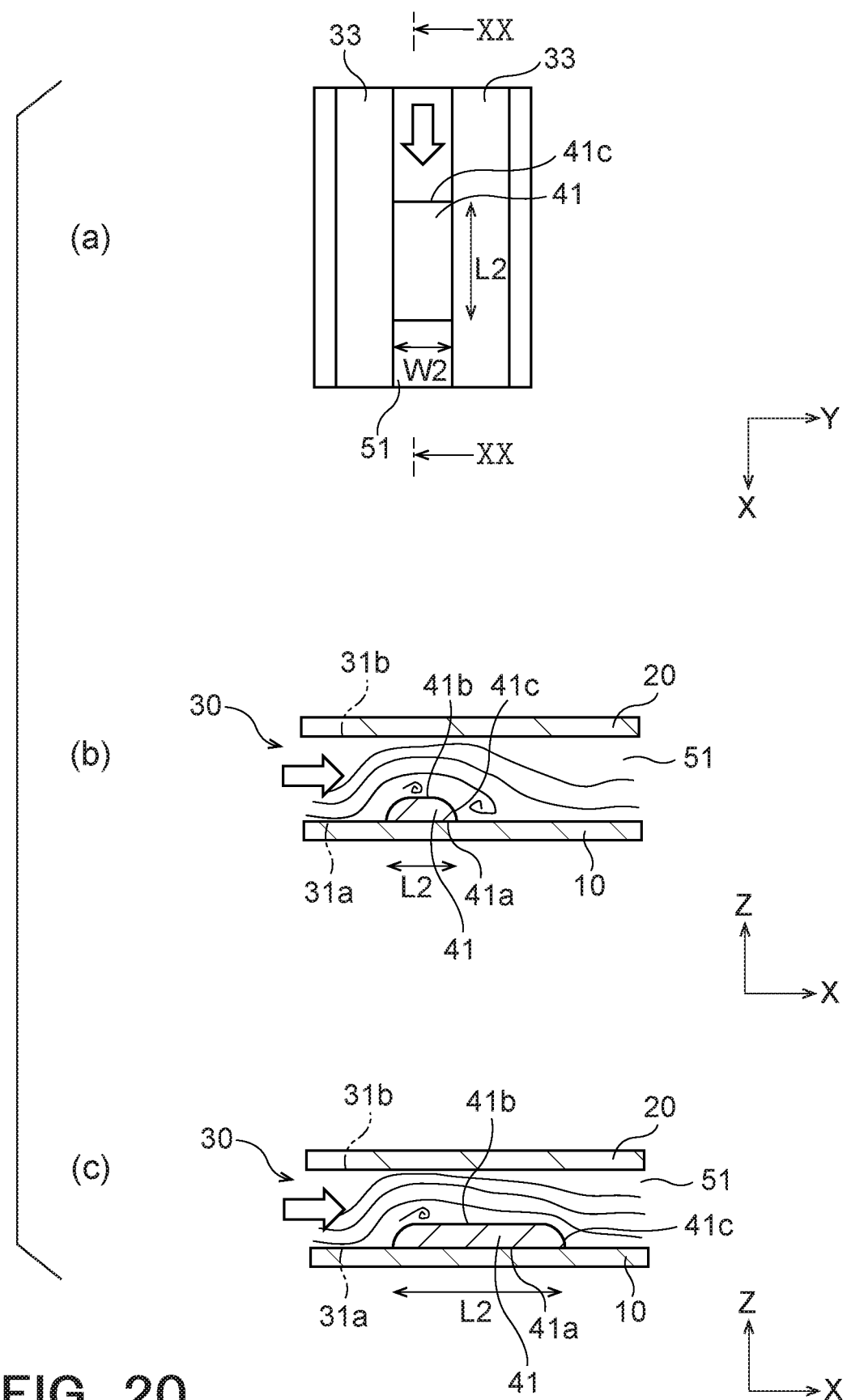
FIG. 20($a$) to FIG. 20($c$) illustrate each bridge according to a seventh modification of the first embodiment.
Figure 21:
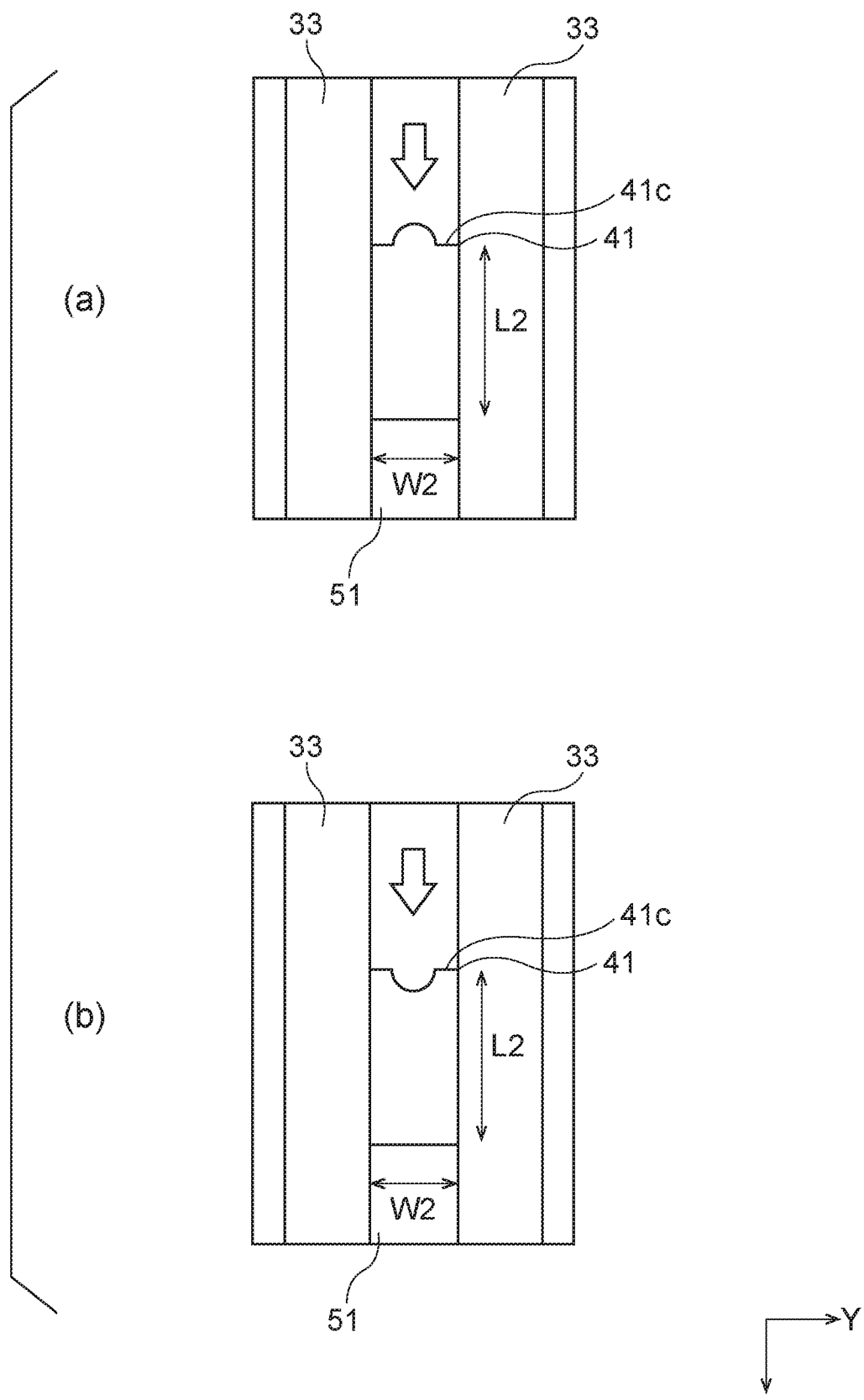
FIG. 21($a$) and FIG. 21($b$) illustrate each bridge according to the seventh modification of the first embodiment.
Figure 22:
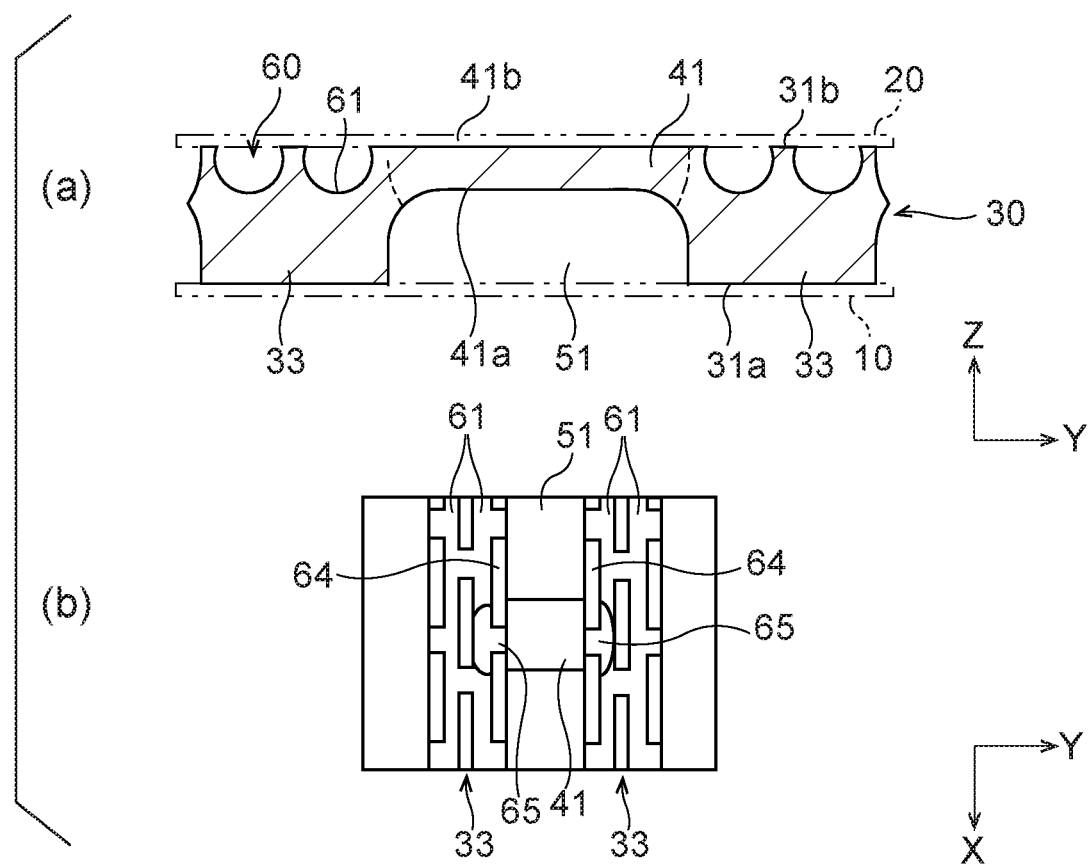
FIG. 22($a$) and FIG. 22($b$) illustrate each bridge according to an eighth modification of the first embodiment.
Figure 23:
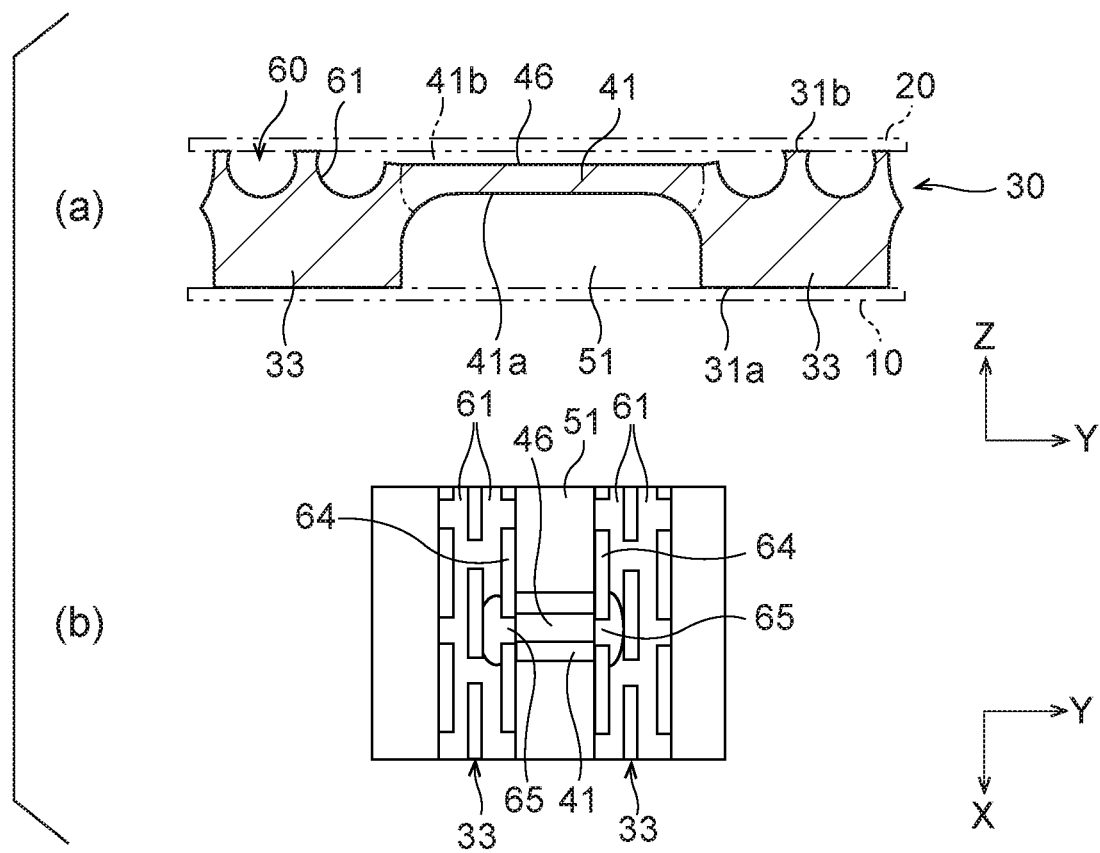
FIG. 23($a$) and FIG. 23($b$) illustrate each bridge according to a ninth modification of the first embodiment.

After the fabrication process of the wick sheet 30, the lower sheet 10, the upper sheet 20, and the wick sheet 30 are bonded in a bonding process, as illustrated in FIG. 11(*c*). The lower sheet 10 and the upper sheet 20 may be formed by using a rolling member having a desired thickness.

In more detail, the lower sheet 10, the wick sheet 30, and the upper sheet 20 are first laminated in this order. In this case, the first main body surface 31*a* of the wick sheet 30 is layered over the second lower sheet surface 10*b* of the lower sheet 10, and the first upper sheet surface 20*a* of the upper sheet 20 is layered over the second main body surface 31*b* of the wick sheet 30. On this occasion, the sheets 10, 20, and 30 are positioned by using the alignment holes 12 (see FIG. 4) in the lower sheet 10, alignment holes 35 (see FIG. 6 and FIG. 7) in the wick sheet 30, and the alignment holes 22 (see FIG. 5) in the upper sheet 20.

Subsequently, the lower sheet 10, the wick sheet 30, and the upper sheet 20 are temporarily fixed to one another. For example, the sheets 10, 20, and 30 may be temporarily fixed to one another by performing spot resistance welding, or the sheets 10, 20, and 30 may be temporarily fixed to one another by laser welding.

Then, the lower sheet 10, the wick sheet 30, and the upper sheet 20 are permanently bonded to one another by diffusion bonding. Diffusion bonding refers to the following bonding technique. First, the lower sheet 10 and the wick sheet 30 that are to be bonded to each other are brought into contact with each other, and the wick sheet 30 and the upper sheet 20 are brought into contact with each other. Then, the lower sheet 10, the wick sheet 30, and the upper sheet 20 are heated and pressurized in the laminating direction within a controlled atmosphere, such as in vacuum or in inactive gas, so as to become bonded to one another by utilizing diffusion of atoms at the bonding surfaces. Although diffusion bonding involves heating the materials of the sheets 10, 20, and 30 to a temperature near the melting point, since the temperature is lower than the melting point, deformation of the sheets 10, 20, and 30 caused by melting can be avoided. In more detail, the frame body section 32 of the wick sheet 30 and the first main body surface 31*a* at each land section 33 are diffusion-bonded to the second lower sheet surface 10*b* of the lower sheet 10. Moreover, the frame body section 32 of the wick sheet 30 and the second main body surface 31*b* at each land section 33 are diffusion-bonded to the first upper sheet surface 20*a* of the upper sheet 20. The sheets 10, 20, and 30 are diffusion-bonded to one another in this manner, and the sealed space 3 having the vapor flow channel section 50 and the liquid flow channel section 60 is formed between the lower sheet 10 and the upper sheet 20.

After the bonding process, the working liquid 2*b* is injected into the sealed space 3 through the injection section 4.

Then, the aforementioned injection flow channel 37 is sealed. For example, the injection flow channel 37 may be sealed by partially melting the injection section 4. Accordingly, communication between the sealed space 3 and the outside is blocked, the working liquid 2*b* is sealed in the sealed space 3, and the working liquid 2*b* within the sealed space 3 is prevented from leaking outside.

The vapor chamber 1 according to this embodiment is obtained in the above-described manner.

Next, an operating method of the vapor chamber 1, that is, a cooling method of the device D, will be described.

The vapor chamber 1 obtained in the above-described manner is installed in the housing H of the electronic apparatus E, such as a mobile terminal. The device D, such as a CPU, as a device to be cooled is attached to the second upper sheet surface 20*b* of the upper sheet 20 (or the vapor chamber 1 is attached to the device D). The working liquid 2*b* within the sealed space 3 adheres by surface tension thereof to wall surfaces of the sealed space 3, that is, the first wall surface 53*a* and the second wall surface 54*a* of each vapor path 51, the wall surface 62 of each liquid-flow-channel main groove 61 in the liquid flow channel section 60, and the wall surface of each liquid-flow-channel communication groove 65. The working liquid 2*b* may also adhere to portions exposed to the vapor paths 51 at the second lower sheet surface 10*b* of the lower sheet 10. Furthermore, the working liquid 2*b* may also adhere to portions exposed to the vapor paths 51, the liquid-flow-channel main grooves 61, and the liquid-flow-channel communication grooves 65 at the first upper sheet surface 20*a* of the upper sheet 20.

When the device D generates heat in this state, the working liquid 2*b* existing in the evaporation area SR (see FIG. 6 and FIG. 7) receives the heat from the device D. The working liquid 2*b* evaporates (gasifies) by absorbing the received heat as latent heat, whereby the working vapor 2*a* is generated. A major portion of the generated working vapor 2*a* is diffused within the vapor paths 51 constituting the sealed space 3 (see a solid arrow in FIG. 6). The working vapor 2*a* within the vapor paths 51 moves away from the evaporation area SR, and a major portion of the working vapor 2*a* is transported to the condensation area CR (right part in FIG. 6 and FIG. 7) where the temperature is relatively low. In the condensation area CR, the working vapor 2*a* is cooled by mainly dissipating heat to the lower sheet 10. The heat received by the lower sheet 10 from the working vapor 2*a* is transmitted to outside air via the housing member Ha (see FIG. 3).

The working vapor 2*a* dissipates heat to the lower sheet 10 at the condensation area CR, so as to condense by surrendering the latent heat absorbed at the evaporation area SR, whereby the working liquid 2*b* is generated. The generated working liquid 2*b* adheres to the first wall surface 53*a* and the second wall surface 54*a* of each vapor path 51, the second lower sheet surface 10*b* of the lower sheet 10, and the first upper sheet surface 20*a* of the upper sheet 20. In the evaporation area SR, the working liquid 2*b* continues to evaporate. Therefore, the working liquid 2b in an area (condensation area CR) other than the evaporation area SR of the liquid flow channel section 60 is transported toward the evaporation area SR (see a dashed arrow in FIG. 6) due to the capillary effect of each liquid-flow-channel main groove 61. Accordingly, the working liquid 2b adhered to the vapor paths 51, the second lower sheet surface 10b, and the first upper sheet surface 20a moves to the liquid flow channel section 60 and enters the liquid-flow-channel main grooves 61 via the liquid-flow-channel communication grooves 65. The liquid-flow-channel main grooves 61 and the liquid-flow-channel communication grooves 65 become filled with the working liquid 2b in this manner. Therefore, the injected working liquid 2b receives a propulsion force toward the evaporation area SR due to the capillary effect of each liquid-flow-channel main groove 61, so as to be transported smoothly toward the evaporation area SR.

In the liquid flow channel section 60, each liquid-flow-channel main groove 61 communicates with another adjacent liquid-flow-channel main groove 61 via the corresponding liquid-flow-channel communication groove 65. Accordingly, the working liquid 2b moves back and forth between adjacent liquid-flow-channel main grooves 61, so that an occurrence where the liquid-flow-channel main grooves 61 dry out is suppressed. Therefore, the capillary effect is applied to the working liquid 2b within each liquid-flow-channel main groove 61, so that the working liquid 2b is transported smoothly toward the evaporation area SR.

The working liquid 2b that has reached the evaporation area SR evaporates by receiving heat again from the device D. The working vapor 2a evaporated from the working liquid 2b travels through the liquid-flow-channel communication grooves 65 within the evaporation area SR, moves to the vapor paths 51 having a large flow-channel cross-sectional area, and diffuses within the vapor paths 51. Accordingly, the working fluids 2a and 2b circulate through the sealed space 3 while repeatedly undergoing a phase change, that is, evaporation and condensation, thereby transporting and releasing the heat of the device D. As a result, the device D is cooled.

According to this embodiment, the wick sheet 30 has the bridges 41 that couple the land sections 33 and the frame body section 32 to each other and the bridges 41 that couple the land sections 33 to each other. Accordingly, the length (length in the X direction) of a long and narrow space (a part of each vapor path 51) extending through the wick sheet 30 in one direction (X direction) can be reduced. As a result, a situation where the land sections 33 of the wick sheet 30 move randomly in the form of a reed screen is suppressed, and deformation of the wick sheet 30 when being handled can be suppressed. By suppressing deformation of the wick sheet 30, partial narrowing or blocking of the vapor flow channel section 50 and the liquid flow channel section 60 can be suppressed, whereby the cooling performance of the vapor chamber 1 can be enhanced. Furthermore, since the bridges 41 can be reduced in thickness, the vapor paths 51 are not completely blocked by the bridges 41, so that a hindrance to the flow of the working vapor 2a within the vapor paths 51 can be suppressed.

MODIFICATIONS

Next, various modifications of the first embodiment will be described with reference to FIG. 12 to FIG. 27. FIG. 12 to FIG. 27 illustrate the wick sheet 30 or the bridges 41 according to the respective modifications. In FIG. 12 to FIG. 27, sections identical to those in the embodiment illustrated in FIG. 1 to FIG. 11 are given the same reference signs, and detailed descriptions thereof are omitted. Furthermore, in FIG. 12 to FIG. 18, some elements, such as the injection flow channel 37 and the supporter 39, are omitted for the sake of convenience.

First Modification

As illustrated in FIG. 12(a) to FIG. 12(c), the bridges 41 may be arranged evenly in the longitudinal direction (X direction) of the land sections 33.

For example, as illustrated in FIG. 12(a), each bridge 41 may be provided at the center position of each land section 33 in the longitudinal direction. In this case, when the length of each land section 33 in the longitudinal direction is defined as da, each bridge 41 is located where the distance from each of a first longitudinal end 33a and a second longitudinal end 33b of the land section 33 is da/2.

Furthermore, as illustrated in FIG. 12(b), multiple bridges 41 (in this case, two per vapor path 51) may be provided in the longitudinal direction of each land section 33, and the bridges 41 may be provided at locations corresponding to equally-divided lengths of the land section 33 in the longitudinal direction. In this case, in each vapor path 51, the first longitudinal end 33a of the land section 33, the two bridges 41, and the second longitudinal end 33b of the land section 33 are disposed while being equally spaced apart from each other by da/3.

Furthermore, as illustrated in FIG. 12(c), multiple bridges 41 (in this case, three per vapor path 51) may be provided in the longitudinal direction of each land section 33, and the bridges 41 may be provided at an equal pitch. In this case, in each vapor path 51, the three bridges 41 are disposed while being spaced apart from each other by a distance db (<da/2).

According to this modification, the bridges 41 are disposed evenly in the longitudinal direction of each land section 33, so that the length of a long and narrow space (a part of each vapor path 51) extending in the longitudinal direction of the land section 33 is reduced, whereby deformation of the land section 33 can be effectively suppressed. Moreover, because the number of bridges 41 can be reduced, an increase in vapor resistance in the vapor paths 51 due to the bridges 41 and an increase in weight of the wick sheet 30 can be suppressed.

Second Modification

As illustrated in FIG. 13(a) and FIG. 13(b), adjacent bridges 41 in the width direction (Y direction) of the land sections 33 may be offset in the longitudinal direction (X direction) of the land sections 33.

For example, as illustrated in FIG. 13(a), multiple land sections 33 may be disposed linearly in plan view, and a line connecting the centers of multiple bridges 41 may be located on a line not parallel to neither of the longitudinal direction (X direction) and the width direction (Y direction) of the land sections 33.

Furthermore, as illustrated in FIG. 13(b), multiple bridges 41 may be disposed in a staggered (alternate) fashion in plan view. Specifically, each bridge 41 and another bridge 41 adjacent thereto in the width direction (Y direction) of the land sections 33 are offset in the longitudinal direction (X direction) of the land sections 33.

According to this modification, there is slight vapor resistance in the vapor path 51 near each bridge 41, and even if the working vapor 2a accumulates at this location, heat can be transmitted to the adjacent vapor path 51 via the liquid flow channel section 60 adjacent to the bridge 41 (see an arrow in each of FIG. 13(a) and FIG. 13(b)). Accordingly, a decrease in heat transport performance by the vapor path 51 can be suppressed.

Third Modification

As illustrated in FIG. 14(a) to FIG. 14(c), the bridges 41 may couple the longitudinal ends of the land sections 33 to the frame body section 32.

As illustrated in FIG. 14(a), the first longitudinal ends 33a of the land sections 33 and the frame body section 32 may be coupled to each other by the bridges 41.

Furthermore, as illustrated in FIG. 14(b), the first longitudinal ends 33a of the land sections 33 and the frame body section 32 may be coupled to each other by bridges 41, and the second longitudinal ends 33b of the land sections 33 and the frame body section 32 may be coupled to each other by other bridges 41.

Moreover, as illustrated in FIG. 14(c), only the first longitudinal ends 33a or the second longitudinal ends 33b of the land sections 33 may be coupled to the frame body section 32 by the bridges 41. In this case, a land section 33 provided with a bridge 41 only at the first longitudinal end 33a and a land section 33 provided with a bridge 41 only at the second longitudinal end 33b are alternately disposed in the width direction (Y direction) of the land sections 33.

In FIG. 14(a) to FIG. 14(c), the bridges 41 are not provided at the intermediate positions of the land sections 33 in the longitudinal direction. Moreover, the vapor flow channel section 50 does not have to be provided with the supporter 39 therein. According to this modification, an increase in vapor resistance of the vapor paths 51 by the bridges 41 can be suppressed, while deformation of the land sections 33 can be suppressed.

FIG. 15(a) to FIG. 15(f) illustrate examples of various shapes of the bridges 41 that couple the longitudinal ends of the land sections 33 to the frame body section 32. As illustrated in FIG. 15(a) to FIG. 15(f), the bridges 41 have side edges 41d located in the vapor paths 51. The side edges 41d are provided continuously from the sidewalls (the first wall surface 53a and the second wall surface 54a) of the land sections 33.

As illustrated in FIG. 15(a), the side edges 41d of each bridge 41 may extend substantially linearly in plan view.

As illustrated in FIG. 15(b), the side edges 41d of each bridge 41 may be recessed inward in the width direction (Y direction) of the corresponding land section 33. In this case, the side edges 41d of each bridge 41 are bent in a curved shape in plan view but are not limited thereto, and may be recessed in a rectangular shape. Accordingly, the working vapor 2a can flow readily in the width direction (Y direction) of each land section 33.

As illustrated in FIG. 15(c), the width of each bridge 41 (length in the Y direction) may be smaller at the frame body section 32 side than at the land section 33 side. In this case, the side edges 41d of each bridge 41 are linear in plan view but are not limited thereto, and may be bent in a curved shape. Accordingly, deformation of the land sections 33 can be suppressed, and the working vapor 2a can flow readily in the width direction (Y direction) of each land section 33.

As illustrated in FIG. 15(d), the width of each bridge 41 (length in the Y direction) may be larger at the frame body section 32 side than at the land section 33 side. In this case, the side edges 41d of each bridge 41 are bent in a curved shape in plan view but are not limited thereto, and may be linear. Accordingly, deformation of the land sections 33 can be suppressed more effectively.

As illustrated in FIG. 15(e), of the frame body section 32, connection portions 32p that connect to the bridges 41 may extend out toward the bridges 41. Accordingly, deformation of the land sections 33 can be suppressed more effectively.

As illustrated in FIG. 15(f), of the pair of side edges 41d of each bridge 41, one side edge 41d may be recessed inward in the width direction (Y direction) of the corresponding land section 33. The other side edge 41d may extend substantially linearly in plan view in the longitudinal direction (X direction) of the corresponding land section 33. Accordingly, by varying the shapes of the pair of side edges 41d from each other, the flowing direction of the working vapor 2a and the strength of each land section 33 can both be achieved in accordance with the flowing direction of the working vapor 2a and how force is applied to the land section 33.

Fourth Modification

As illustrated in FIG. 16(a) to FIG. 16(c), the land sections 33 may have a bent linear shape. In this case, the planar shape of the wick sheet 30 is an L-shape, and each land section 33 extends in an L-shape in plan view.

As illustrated in FIG. 16(a), each bridge 41 may be disposed at the bent portion of the corresponding land section 33. Accordingly, deformation at the bent portion of the land section 33 where deformation tends to occur can be suppressed.

Furthermore, as illustrated in FIG. 16(b), each bridge 41 may be disposed near the bent portion of the corresponding land section 33. In detail, a distance dc between the center of each bridge 41 and the bent portion of the corresponding land section 33 located closest to the bridge 41 may be 0 or more and 30 times or less of the width w2 of each vapor path 51. Accordingly, deformation at the bent portion of the land section 33 can be suppressed, and an increase in vapor resistance near the bent portion of the land section 33 can be suppressed.

Moreover, as illustrated in FIG. 16(c), each bridge 41 may be disposed at a position located away from the evaporation area SR. In detail, when viewed along the length of the corresponding land section 33, each bridge 41 may be located closer toward the condensation area CR than the evaporation area SR. In this case, since each bridge 41 is provided in an area where the vapor pressure (the speed of the working vapor 2a) is low, an increase in vapor resistance in the corresponding vapor path 51 due to the bridge 41 can be suppressed. Furthermore, each bridge 41 may be provided at the side where the distance from the bent portion of the corresponding land section 33 to each end of the land section 33 is long. In this case, deformation of the land section 33 can be suppressed.

In FIG. 16(a) to FIG. 16(c), the bent angle of each land section 33 in plan view is not limited to 90°, and may be any angle between an acute angle and an obtuse angle. Furthermore, each land section 33 may be bent in a curved shape in plan view.

For example, as illustrated in FIG. 17(a) to FIG. 17(c), each land section 33 may have a bent portion R bent in a curved shape in plan view. Similar to the land sections 33, each vapor path 51 located between the corresponding land sections 33 are also bent in a curved shape in plan view. With the land sections 33 having the bent portions R, the vapor resistance of the working vapor 2a flowing through the vapor paths 51 can be reduced, thereby facilitating the transferring of heat within the plane of the vapor chamber 1.

As illustrated in FIG. 17(a), each bridge 41 may be provided in a portion (e.g., a linear portion of the land section 33) other than the bent portion R of the corresponding land section 33.

Furthermore, as illustrated in FIG. 17(b), each bridge 41 may be provided at the boundary between the bent portion R and a linear portion of the corresponding land section 33. Accordingly, the working vapor 2a can flow readily through the vapor paths 51 at the bent portions R, and deformation of the land sections 33 at the bent portions R can be suppressed.

Moreover, as illustrated in FIG. 17(c), each bridge 41 may be disposed at substantially the center of the bent portion R of the corresponding land section 33. Accordingly, deformation of the land sections 33 at the bent portions R can be suppressed.

Fifth Modification

As illustrated in FIG. 18(a) to FIG. 18(c), the wick sheet 30 may include land sections 33 (first land sections 33c) extending linearly in plan view and land sections 33 (second land sections 33d) extending in a bent linear fashion in plan view. In this case, the planar shape of the wick sheet 30 is a rectangular shape, but may alternatively be any shape, such as a circular shape, an elliptical shape, an L-shape, or a T-shape.

As illustrated in FIG. 18(a), each bridge 41 may be disposed near a bent portion of the corresponding second land section 33d. In detail, a distance de between the center of each bridge 41 and the bent portion of the corresponding second land section 33d located closest to the bridge 41 may be 0 or more and 30 times or less of the width w2 of each vapor path 51. Accordingly, deformation at the bent portion of each second land section 33d can be suppressed, and an increase in vapor resistance near the bent portion of each second land section 33d can be suppressed.

Moreover, as illustrated in FIG. 18(b), each bridge 41 may couple one end of the corresponding first land section 33c and an intermediate position of one of the second land sections 33d to each other. Accordingly, deformation of each first land section 33c can be suppressed.

Furthermore, as illustrated in FIG. 18(c), each bridge 41 may couple the corresponding first land section 33c to another land section 33c or 33d adjacent to the first land section 33c in the width direction or to the frame body section 32. Accordingly, deformation of each first land section 33c can be suppressed.

In FIG. 18(a) to FIG. 18(c), the planar shape of each second land section 33d may be any shape, such as a circular-arc curved shape or an L-like bent linear shape. For example, similar to the examples illustrated in FIG. 17(a) to FIG. 17(c), each second land section 33d may have the bent portion R bent in a curved shape in plan view.

Sixth Modification

In FIG. 19(a) to FIG. 19(c), the bridges 41 are reduced in thickness by half-etching from the second main body surface 31b side. In this case, each bridge 41 has a top surface 41b located at the second main body surface 31b side, a bottom surface 41a located at the first main body surface 31a side, and side surfaces 41c located between the top surface 41b and the bottom surface 41a. The top surface 41b is exposed toward the corresponding vapor path 51. FIG. 19(a) is a plan view of each bridge 41, and FIG. 19(b) and FIG. 19(c) are cross-sectional views taken along line XIX-XIX in FIG. 19(a).

As illustrated in FIG. 19(a), each bridge 41 may have a parallelogram shape in plan view. In this case, the side surfaces 41c of the bridge 41 are not disposed parallel to the width direction (Y direction) of the corresponding vapor path 51. In detail, an angle θ (smaller angle) formed between each side surface 41c of the bridge 41 and a side surface of the corresponding land section 33 may be 20° or more and 70° or less. Accordingly, vapor resistance near the bridge 41 can be suppressed, so that the working vapor 2a can flow smoothly near the bridge 41. The side surface 41c of the bridge 41 does not necessarily have to be disposed to entirely form the angle θ relative to the side surface of the land section 33. For example, the side surface 41c of the bridge 41 may be disposed so as to partially form the angle θ of 20° or more and 70° or less relative to the side surface of the land section 33. In this case, vapor resistance near the bridge 41 can be suppressed, so that the working vapor 2a can flow smoothly near the bridge 41. Furthermore, each bridge 41 may have a trapezoidal shape in plan view. In this case, one of the two side surfaces 41c of the bridge 41 may be disposed to form the angle θ of 20° or more and 70° or less relative to the corresponding side surface of the land section 33. In this case, vapor resistance near the bridge 41 can be suppressed, so that the working vapor 2a can flow smoothly near the bridge 41.

As illustrated in FIG. 19(b), each side surface 41c of the bridge 41 may be orthogonal to the first main body surface 31a and the second main body surface 31b.

Furthermore, as illustrated in FIG. 19(c), each side surface 41c of the bridge 41 may be inclined relative to the first main body surface 31a and the second main body surface 31b. In this case, vapor resistance near the bridge 41 can be suppressed, so that the working vapor 2a can flow smoothly near the bridge 41. The side surfaces 41c inclined in this manner can be fabricated readily at the same time as the liquid flow channel section 60 during the etching process. Supposing that the working vapor 2a liquefies by colliding with each bridge 41, since the angle formed between the lower sheet 10 and each side surface 41c is an obtuse angle, the working liquid 2b can be discharged readily along the bridge 41.

In FIG. 19(a) to FIG. 19(c), the bridges 41 may be reduced in thickness by half-etching from the first main body surface 31a side.

Seventh Modification

In FIG. 20(a) to FIG. 20(c), the bridges 41 are reduced in thickness by half-etching from the second main body surface 31b side. In this case, each bridge 41 has a top surface 41b located at the second main body surface 31b side, a bottom surface 41a located at the first main body surface 31a side, and side surfaces 41c located between the top surface 41b and the bottom surface 41a. The top surface 41b is exposed toward the corresponding vapor path 51. FIG. 20(a) is a plan view of each bridge 41, and FIG. 20(b) and FIG. 20(c) are cross-sectional views taken along line XX-XX in FIG. 20(a).

As illustrated in FIG. 20(a), the side surfaces 41c of each bridge 41 are disposed orthogonally to the width direction (Y direction) of the corresponding vapor path 51.

Furthermore, as illustrated in FIG. 20(b) and FIG. 20(c), the side surfaces 41c of each bridge 41 may be inclined in a curved shape relative to the first main body surface 31a and the second main body surface 31b. In this case, a length L2 of the bridge 41 in the longitudinal direction (X direction) of the corresponding vapor path 51 may be 0.5 times or more and 10 times or less of the width w2 of the vapor path 51. By setting the length L2 of the bridge 41 to 0.5 times or more of the width w2 of the vapor path 51, accumulation of the working vapor 2a near the side surfaces 41c of the bridge 41 can be suppressed, so that the working vapor 2a can flow smoothly near the bridge 41. By setting the length L2 of the bridge 41 to 10 times or less of the width w2 of the vapor path 51, a portion where the vapor path 51 narrows is shortened, so that a pressure loss of the working vapor 2a within the vapor path 51 can be reduced.

In FIG. 20(a) to FIG. 20(c), the bridge 41 may be reduced in thickness by half-etching from the first main body surface 31a side.

Furthermore, as illustrated in FIG. 21(a) and FIG. 21(b), the side surfaces 41c of each bridge 41 may partially have a protruding shape (FIG. 21(a)) or a recessed shape (FIG. 21(b)) in plan view. In this case, the working vapor 2a can flow readily near the bridge 41. In FIG. 21(a) and FIG. 21(b), the side surface 41c at the inlet side (negative side in the X direction) of the working vapor 2a has a protruding shape or a recessed shape. However, the configuration is not limited to this. The side surface 41c at the outlet side (positive side in the X direction) of the working vapor 2a may have a protruding shape or a recessed shape. Alternatively, the side surfaces 41c at the inlet side (negative side in the X direction) and the outlet side (positive side in the X direction) of the working vapor 2a may both have a protruding shape or a recessed shape.

Eighth Modification

In FIG. 22(a) and FIG. 22(b), each bridge 41 is reduced in thickness by half-etching from the first main body surface 31a side. In this case, the bridge 41 is in contact with at least one of the liquid-flow-channel communication grooves 65 located at the outermost side of the corresponding land section 33 in the width direction (Y direction).

According to this modification, even when a slight gap forms between the bridge 41 and the upper sheet 20 due to the bridge 41 and the upper sheet 20 not being completely bonded to each other by diffusion bonding, the working liquid 2b entering this gap can be released from the corresponding liquid-flow-channel communication groove 65. Accordingly, even when the working liquid 2b freezes in an environment where the temperature is lower than the freezing point of the working liquid 2b, widening of the gap between the bridge 41 and the upper sheet 20 due to the frozen working liquid 2b can be suppressed.

Ninth Modification

In FIG. 23(a) and FIG. 23(b), each bridge 41 is reduced in thickness by half-etching from the first main body surface 31a side. In this case, the bridge 41 is in contact with at least one of the liquid-flow-channel communication grooves 65 located at the outermost side of the corresponding land section 33 in the width direction (Y direction). Furthermore, the top surface 41b of the bridge 41 is provided with a communication recess 46 that communicates with the liquid-flow-channel communication groove 65. The communication recess 46 extends entirely across the corresponding vapor path 51 in the width direction (Y direction).

According to this modification, the working liquid 2b entering between the bridge 41 and the upper sheet 20 can be released to the liquid-flow-channel communication groove 65 via the communication recess 46. Accordingly, even when the working liquid 2b freezes in an environment where the temperature is lower than the freezing point of the working liquid 2b, widening of the gap between the bridge 41 and the upper sheet 20 due to the frozen working liquid 2b can be suppressed.

Tenth Modification

Figure 24:
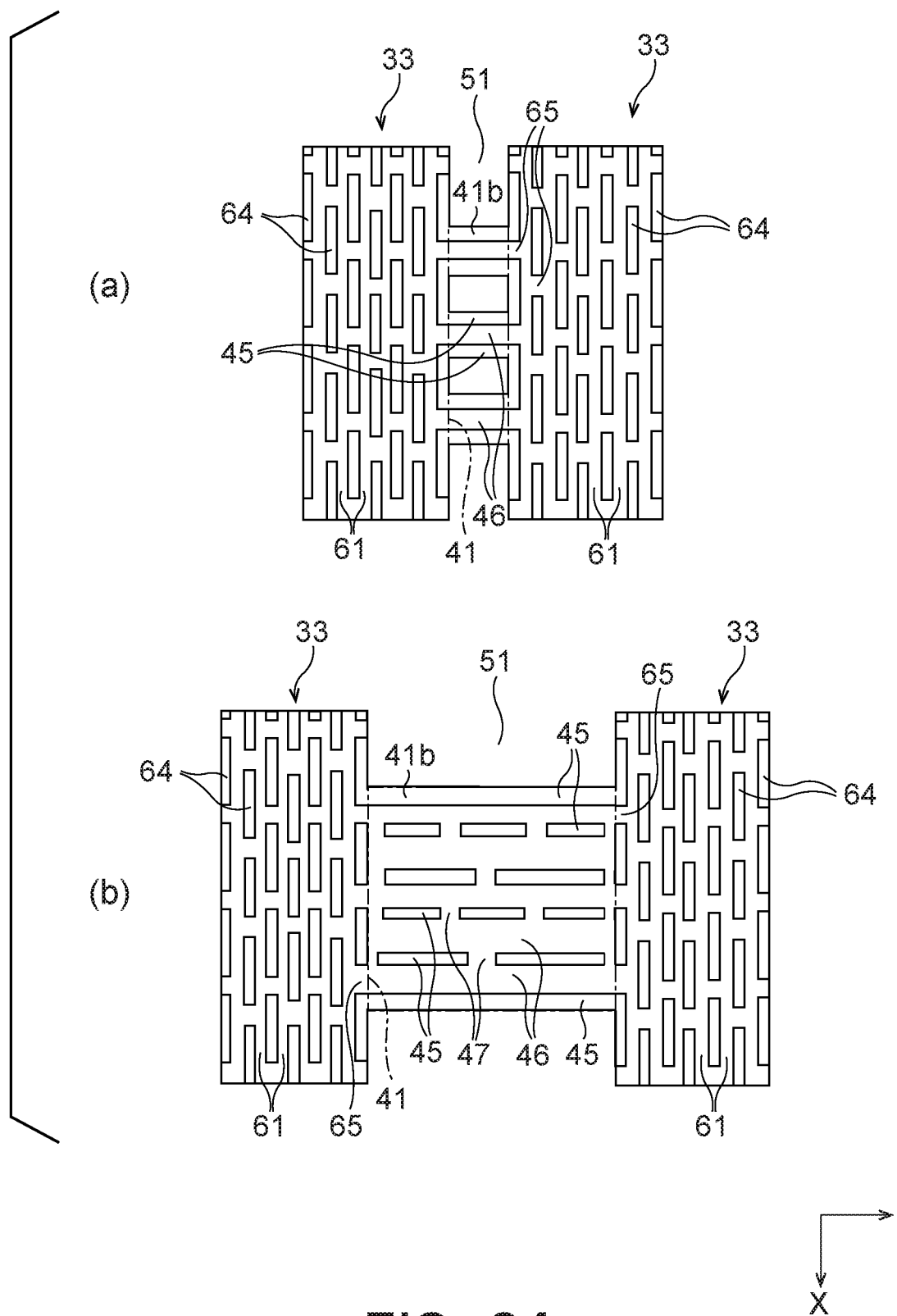
FIG. 24($a$) and FIG. 24($b$) illustrate each bridge according to a tenth modification of the first embodiment.
Figure 25:
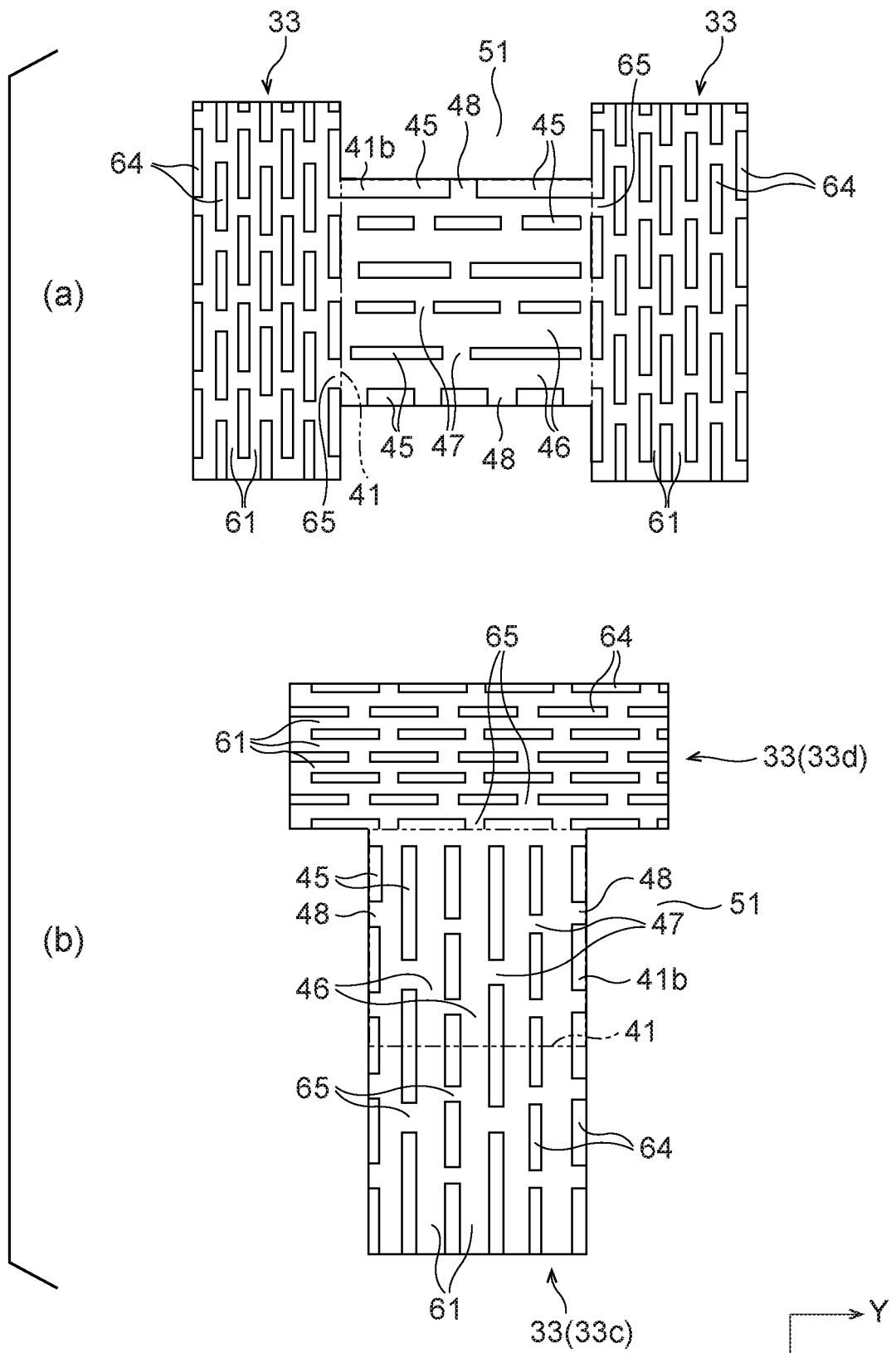
FIG. 25($a$) and FIG. 25($b$) illustrate each bridge according to the tenth modification of the first embodiment.
Figure 26:
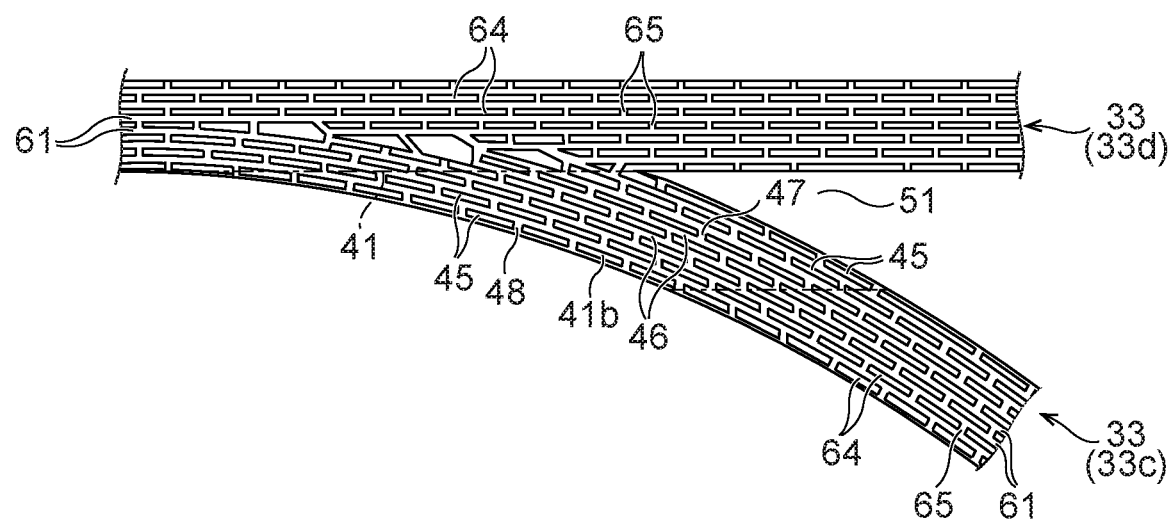
FIG. 26 illustrates each bridge according to the tenth modification of the first embodiment.
Figure 27:
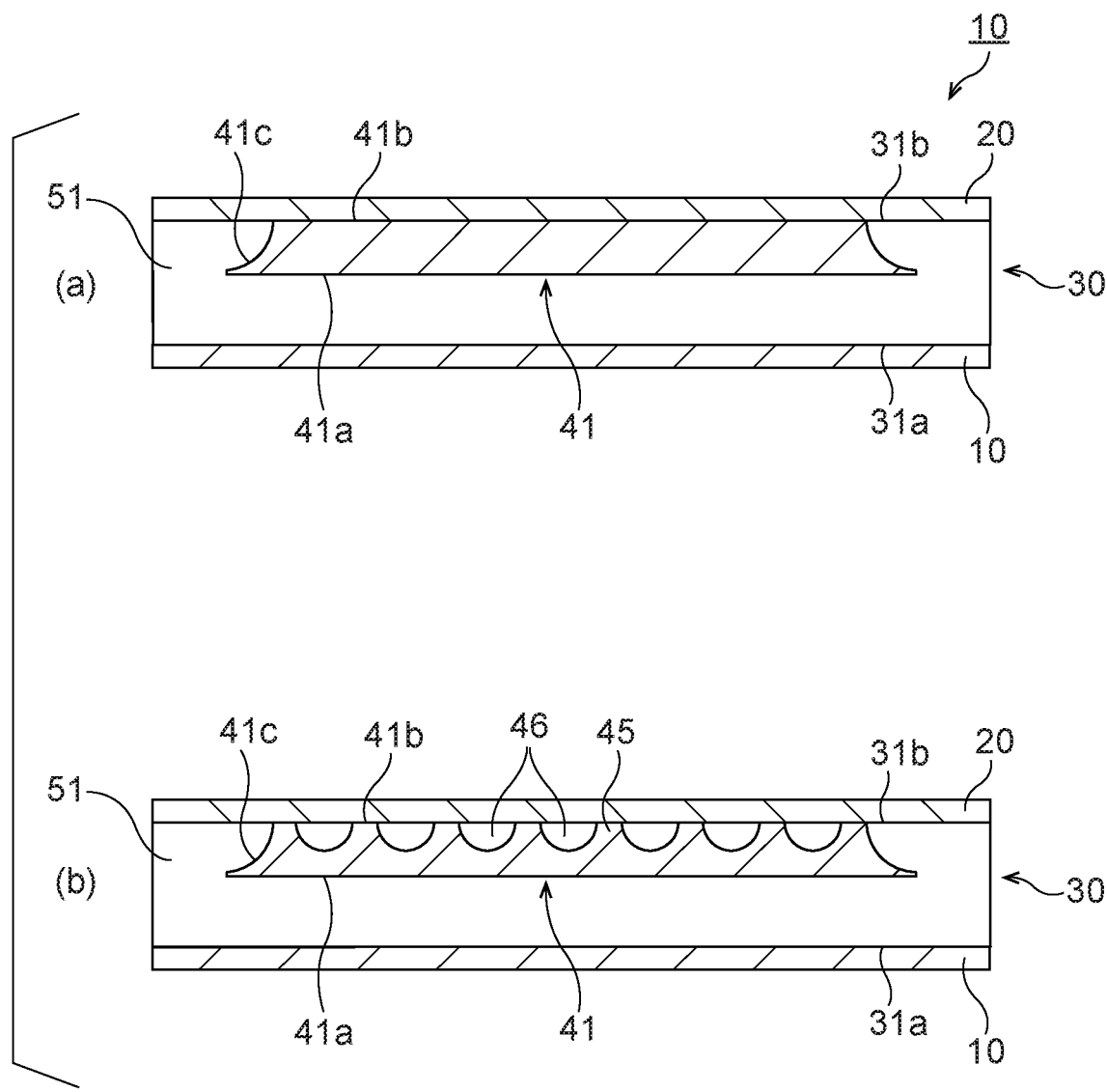
FIG. 27($a$) and FIG. 27($b$) illustrate each bridge according to an eleventh modification of the first embodiment.

In FIG. 24 to FIG. 26, each bridge 41 (denoted by a double-dot chain line) is reduced in thickness by half-etching from the first main body surface 31a side. In this case, the bridge 41 is in contact with at least one of the liquid-flow-channel communication grooves 65 located at the outermost side of the corresponding land section 33 in the width direction. Furthermore, the top surface 41b of the bridge 41 is provided with multiple communication recesses 46 that communicate with the liquid-flow-channel communication groove 65. The multiple communication recesses 46 extend entirely across the corresponding vapor path 51 in the width direction. Moreover, the multiple communication recesses 46 are arranged parallel to each other.

A bridge protrusion 45 is disposed around each communication recess 46. The bridge protrusions 45 are provided at the top surface 41b of the bridge 41. The bridge protrusions 45 protrude from the communication recesses 46 and are in contact with the upper sheet 20. In plan view, each bridge protrusion 45 is rectangular with the width direction of the corresponding vapor path 51 as the longitudinal direction. Each communication recess 46 is located between adjacent bridge protrusions 45 in the longitudinal direction of the vapor path 51.

According to this modification, the working liquid 2b entering between the bridge 41 and the upper sheet 20 can be released to the liquid-flow-channel communication groove 65 via the multiple communication recesses 46. Accordingly, even when the working liquid 2b freezes in an environment where the temperature is lower than the freezing point of the working liquid 2b, widening of the gap between the bridge 41 and the upper sheet 20 due to the frozen working liquid 2b can be suppressed.

As illustrated in FIG. 24(a), the bridge protrusions 45 may extend parallel to each other entirely across the corresponding vapor path 51 in the width direction (Y direction). The opposite ends of each bridge protrusion 45 are respectively connected to the protrusions 64 located at the outermost sides of the land sections 33 in the width direction (Y direction).

As illustrated in FIG. 24(b), the top surface 41b of each bridge 41 may be provided with first communication flow channels 47 that connect adjacent communication recesses 46 to each other. Each first communication flow channel 47 is disposed between adjacent bridge protrusions 45 in the width direction (Y direction) of the corresponding vapor path 51. The bridge protrusions 45 located at the outermost sides of the bridge 41 in the width direction (X direction) extend entirely across the vapor path 51 in the width direction (Y direction). The first communication flow channels 47 extend in a direction intersecting the width direction (Y direction) of the vapor path 51. In FIG. 24(b), the first communication flow channels 47 extend in the X direction and are provided perpendicularly to the longitudinal direction of the communication recesses 46. Accordingly, the working liquid 2b entering between the bridge 41 and the upper sheet 20 can be released to the liquid-flow-channel communication grooves 65 via the first communication flow channels 47 and the communication recesses 46.

As illustrated in FIG. 25(a), the outermost sides of each bridge 41 in the width direction (X direction) may be provided with second communication flow channels 48 that connect the communication recesses 46 to the corresponding vapor path 51. Each second communication flow channel 48 is disposed between adjacent bridge protrusions 45 located at the outermost side of the bridge 41 in the width direction (X direction). In FIG. 25(a), the second communication flow channels 48 extend in the X direction and are provided perpendicularly to the longitudinal direction of the communication recesses 46. Accordingly, the working liquid 2b entering between the bridge 41 and the upper sheet 20 can be released to the vapor path 51 from the communication recesses 46. Moreover, the working liquid 2b condensed in the vapor path 51 can enter through the second communication flow channels 48 and be transported to the evaporation area SR via the liquid flow channel section 60.

As illustrated in FIG. 25(b), in a case where each bridge 41 couples one end of the first land section 33c to an intermediate position of the second land section 33d (e.g., FIG. 18(b) described above), the top surface 41b of the bridge 41 may be provided with multiple communication recesses 46. In this case, the communication recesses 46 communicate with the liquid-flow-channel communication grooves 65 in the second land section 33d. Furthermore, the liquid-flow-channel main grooves 61 of the first land section 33c and the communication recesses 46 of the bridge 41 extend continuously. In detail, the liquid-flow-channel main grooves 61 in the first land section 33c and the communication recesses 46 in the bridge 41 are disposed linearly in plan view. Accordingly, the working liquid 2b entering between the bridge 41 and the upper sheet 20 can be released smoothly toward the liquid-flow-channel main grooves 61 in the first land section 33c from the communication recesses 46. Moreover, the working liquid 2b condensed in the vapor path 51 can be transported smoothly toward the liquid-flow-channel main grooves 61 in the first land section 33c from the communication recesses 46 in the bridge 41.

As illustrated in FIG. 26, in a case where each bridge 41 couples one end of the first land section 33c to an intermediate position of the second land section 33d, the first land section 33c and the bridge 41 may each have a curved shape in plan view. In this case, the top surface 41b of the bridge 41 is provided with multiple communication recesses 46. Moreover, the liquid-flow-channel main grooves 61 in the first land section 33c and the communication recesses 46 in the bridge 41 extend continuously. In detail, each liquid-flow-channel main groove 61 in the first land section 33c and each communication recess 46 in the bridge 41 are connected by a continuous curve in plan view. The expression "connected by a continuous curve" refers to a state where the curvature radius of the center line of the liquid-flow-channel main groove 61 and the curvature radius of the center line of the communication recess 46 match at a connection portion between the bridge 41 and the first land section 33c. Accordingly, the working liquid 2b entering between the bridge 41 and the upper sheet 20 can be released smoothly toward the liquid-flow-channel main grooves 61 in the first land section 33c from the communication recesses 46. Moreover, the working liquid 2b condensed in the vapor path 51 can be transported smoothly toward the liquid-flow-channel main grooves 61 in the first land section 33c from the communication recesses 46 in the bridge 41.

Eleventh Modification

FIG. 27(a) and FIG. 27(b) are cross-sectional views illustrating each bridge 41 according to an eleventh modification, taken in the width direction (X direction) of the bridge 41. In FIG. 27(a) and FIG. 27(b), the bridge 41 is reduced in thickness by half-etching from the first main body surface 31a side. In this case, the width of the bridge 41 increases gradually from the top surface 41b toward the bottom surface 41a. The side surfaces 41c of the bridge 41 are bent, and are inclined outward in the width direction (X direction) of the bridge 41 from the top surface 41b toward the bottom surface 41a. The side surfaces 41c of the bridge 41 communicate with the liquid flow channel section 60 of the land section 33 coupled to the bridge 41.

According to this modification, when the working vapor 2a collides against each side surface 41c of the bridge 41 and liquefies, the working liquid 2b flows readily to the liquid flow channel section 60 of the land section 33 by traveling along the bent side surface 41c.

As illustrated in FIG. 27(a), the top surface 41b of the bridge 41 may be flat, and the top surface 41b of the bridge 41 does not have to be provided with communication recesses 46.

As illustrated in FIG. 27(b), the top surface 41b of the bridge 41 may have multiple communication recesses 46 (see the tenth modification). In this case, when the working vapor 2a collides against each side surface 41c of the bridge 41 and liquefies, the working liquid 2b flows readily to the communication recesses 46 in the bridge 41 by traveling along the bent side surface 41c.

Second Embodiment

Next, a second embodiment will be described with reference to FIG. 28 to FIG. 38. FIG. 28 to FIG. 38 illustrate the second embodiment. In FIG. 28 to FIG. 38, sections identical to those in the embodiment illustrated in FIG. 1 to FIG. 27 are given the same reference signs, and detailed descriptions thereof are omitted.

Figure 28:
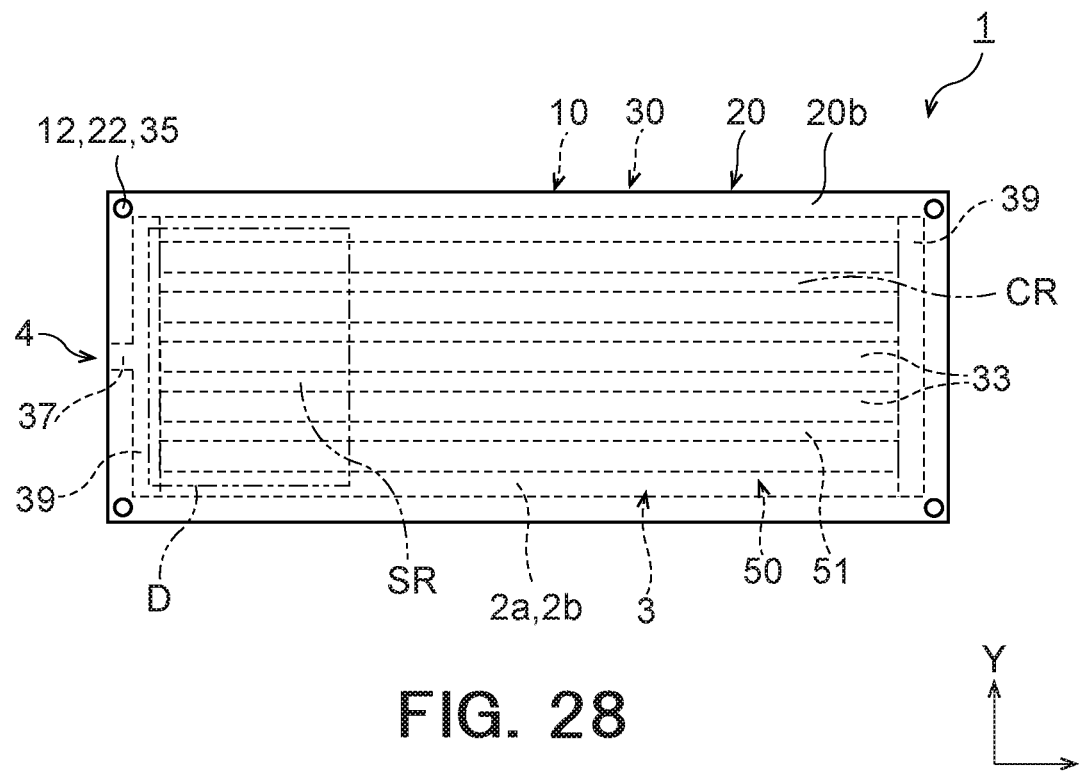
FIG. 28 is a top view illustrating a vapor chamber according to a second embodiment.
Figure 29:
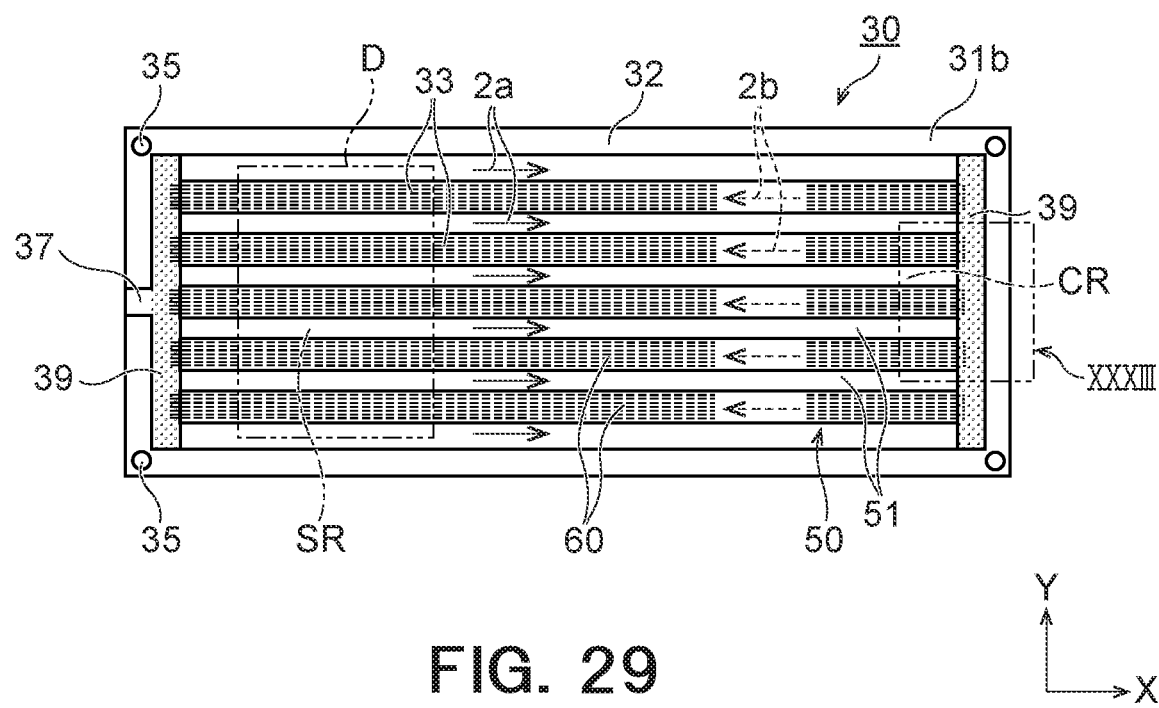
FIG. 29 is a top view of a wick sheet according to the second embodiment.
Figure 30:
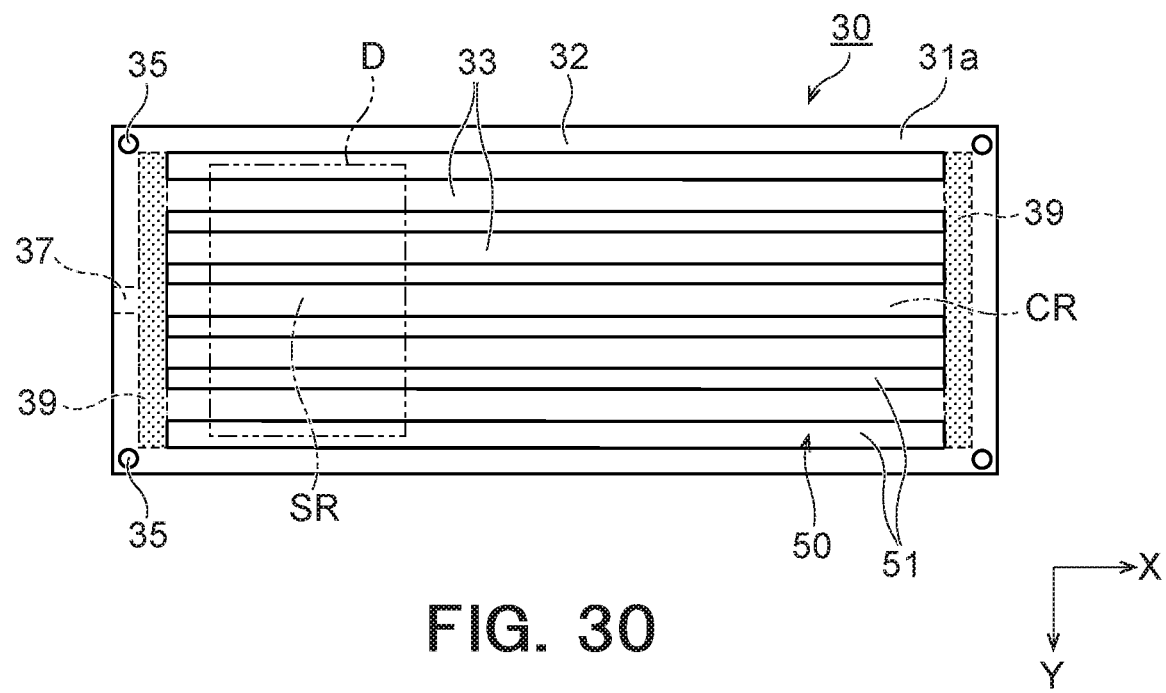
FIG. 30 is a bottom view of the wick sheet according to the second embodiment.

As illustrated in FIG. 28, a vapor chamber 1 according to this embodiment includes a lower sheet 10 (first sheet), an upper sheet 20 (second sheet), and a wick sheet (simply referred to as "wick sheet 30" hereinafter) for the vapor chamber. The wick sheet 30 is interposed between the lower sheet 10 and the upper sheet 20.

As illustrated in FIG. 29 to FIG. 32, the wick sheet 30 according to this embodiment includes a first main body surface 31a, a second main body surface 31b, a frame body section 32, a plurality of land sections 33, and a supporter 39. Vapor paths 51 through which a working vapor 2a travels are provided between the multiple land sections 33. A liquid flow channel section 60 that communicates with the vapor paths 51 and through which a working liquid 2b travels is provided at the second main body surface 31b side of at least one of the land sections 33. The liquid flow channel section 60 has a plurality of liquid-flow-channel main grooves 61 through which the working liquid 2b travels and that are arranged parallel to each other. Adjacent liquid-flow-channel main grooves 61 have a protrusion row 63 provided therebetween. Each protrusion row 63 has a plurality of protrusions 64. The protrusions 64 located at the longitudinal end of each land section 33 extend out toward the supporter 39.

Figure 31:
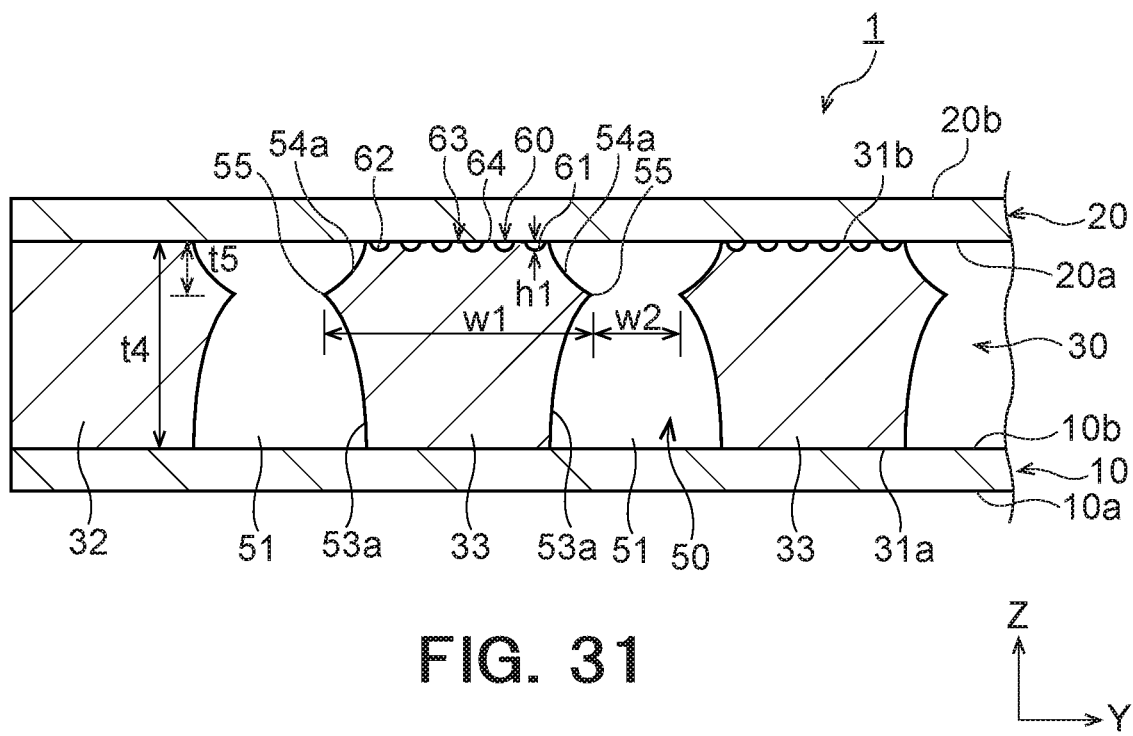
FIG. 31 is a partially-enlarged cross-sectional view of the wick sheet according to the second embodiment.
Figure 32:
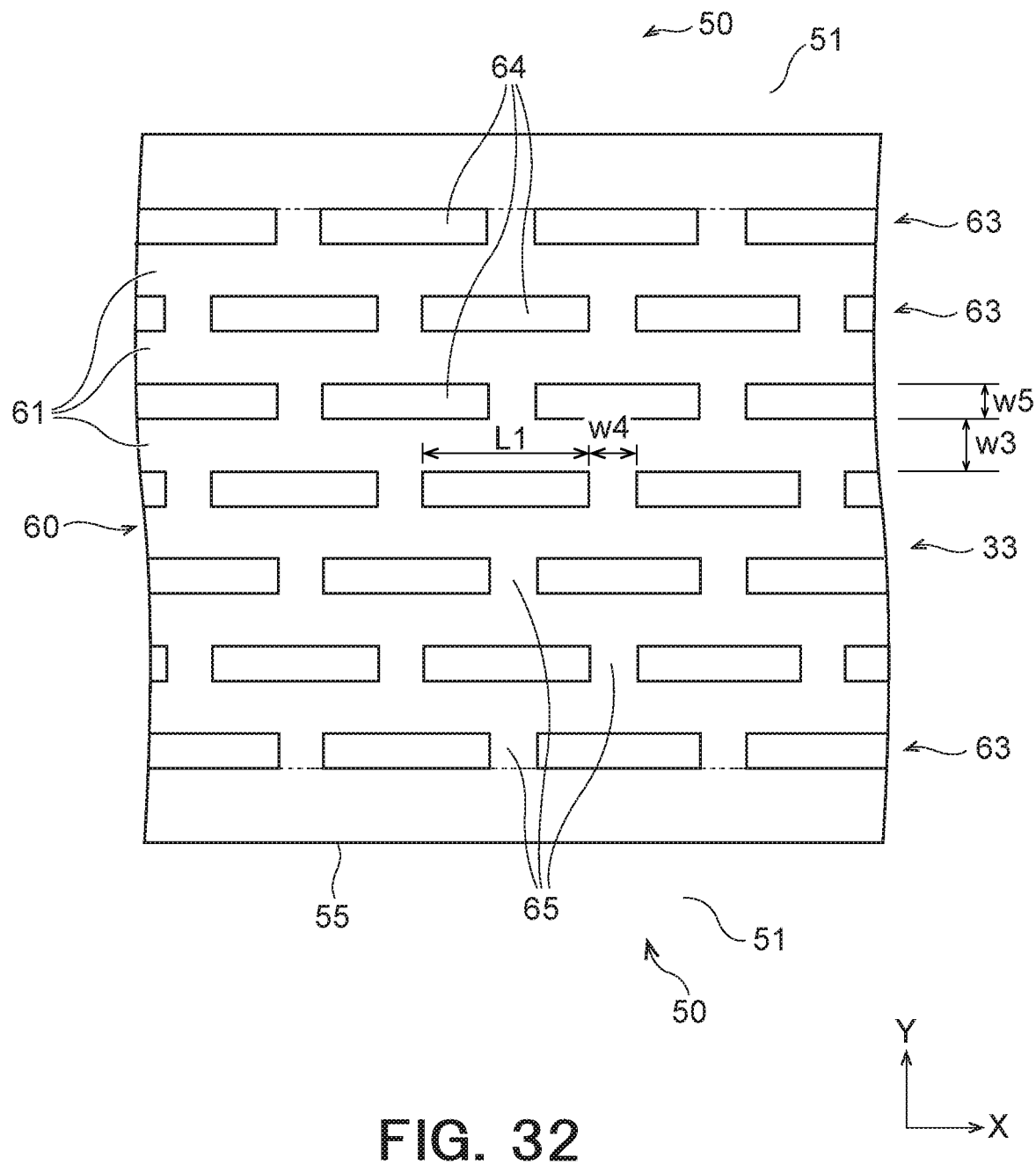
FIG. 32 is a partially-enlarged top view of a liquid flow channel section illustrated in FIG. 29.

As illustrated in FIG. 32, the liquid flow channel section 60 has a plurality of liquid-flow-channel communication grooves 65 that communicate with the liquid-flow-channel main grooves 61. As illustrated in FIG. 31, each liquid-flow-channel main groove 61 has a bent wall surface 62. The protrusions 64 are provided within the liquid flow channel section 60 and protrude from the liquid-flow-channel main grooves 61 and the liquid-flow-channel communication grooves 65 so as to be in contact with the upper sheet 20.

Figure 33:
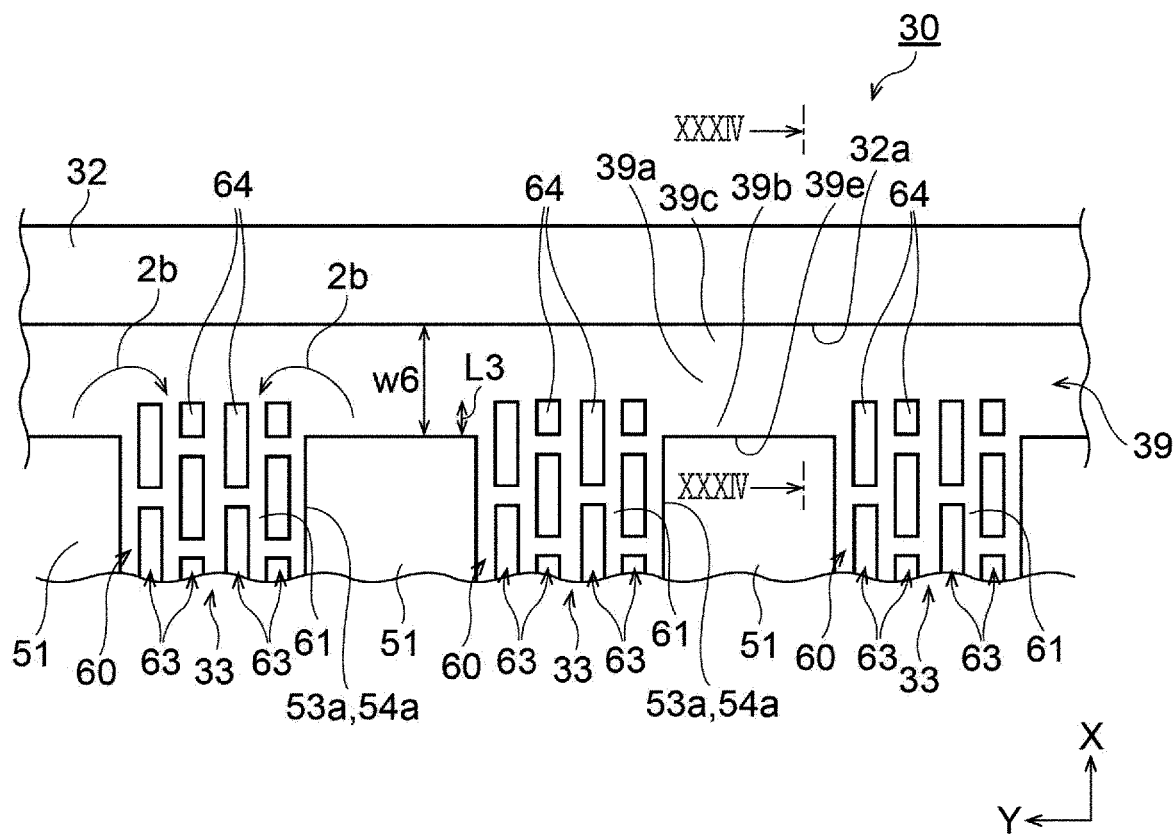
FIG. 33 is an enlarged top view (enlarged view of an area XXXIII in FIG. 29) illustrating a frame body section and a supporter of the wick sheet.
Figure 34:
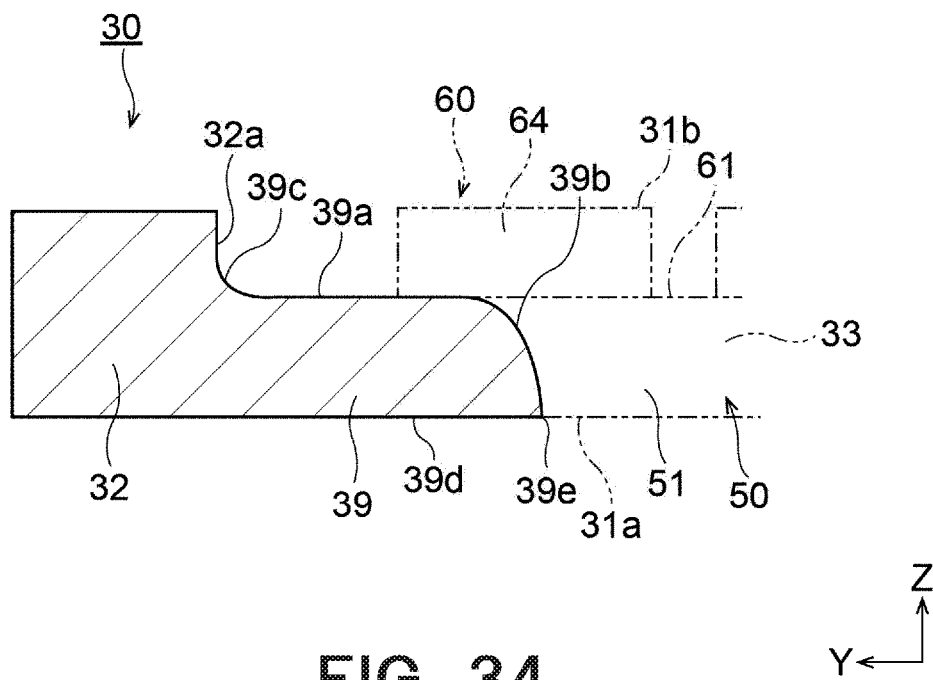
FIG. 34 is an enlarged cross-sectional view (cross-sectional view taken along XXXIV-XXXIV in FIG. 33) illustrating the frame body section and the supporter of the wick sheet.

FIG. 33 is an enlarged top view (enlarged view of an area XXXIII in FIG. 29) illustrating the frame body section 32 and the supporter 39 located at the condensation area CR side, and FIG. 34 is an enlarged cross-sectional view (cross-sectional view taken along line XXXIV-XXXIV in FIG. 33) illustrating the frame body section 32 and the supporter 39. In order to clarify the drawing, FIG. 33 illustrates the liquid-flow-channel main grooves 61 and the protrusion rows 63 in an enlarged manner, and the number of liquid-flow-channel main grooves 61, the number of protrusion rows 63, and the like are different from those in FIG. 31 and FIG. 32 for the sake of convenience.

As illustrated in FIG. 33, the supporter 39 is provided at the condensation area CR side and at the longitudinal ends (positive side in the X direction) of the land sections 33. As mentioned above, the supporter 39 couples the land sections 33 to the frame body section 32. Moreover, the frame body section 32 has a frame-body inner wall surface 32*a* located at the supporter 39 side.

As illustrated in FIG. 34, the supporter 39 has a supporter front surface 39*a*, a supporter inner wall surface 39*b*, a supporter coupling surface 39*c*, and a supporter rear surface 39*d*. The supporter front surface 39*a* is located at the second main body surface 31*b* side and is a flat surface parallel to the second main body surface 31*b*. The supporter inner wall surface 39*b* is oriented toward the vapor paths 51 (i.e., toward the negative side in the X direction) in the vapor flow channel section 50 and extends from the supporter front surface 39*a* to the supporter rear surface 39*d*. The supporter inner wall surface 39*b* is a bent surface bent such that, in cross section, the first main body surface 31*a* side is located inward (i.e., toward the negative side in the X direction) of the vapor paths 51 in the longitudinal direction relative to the second main body surface 31*b* side. The supporter inner wall surface 39*b* is provided continuously with the first wall surface 53*a* and the second wall surface 54*a* of each vapor path 51 (see FIG. 33). The supporter coupling surface 39*c* is provided continuously with the frame-body inner wall surface 32*a* of the frame body section 32. The supporter coupling surface 39*c* is a bent surface bent such that, in cross section, the first main body surface 31*a* side is located inward (i.e., toward the negative side in the X direction) of the vapor paths 51 in the longitudinal direction relative to the second main body surface 31*b* side. The supporter rear surface 39*d* is oriented toward the first main body surface 31*a* and is a flat surface located in the same plane as the first main body surface 31*a*. Moreover, an intersection line 39*e* can be drawn between the supporter inner wall surface 39*b* and the supporter rear surface 39*d*. The supporter inner wall surface 39*b* and the supporter coupling surface 39*c* do not have to be bent surfaces and may be flat surfaces. The supporter inner wall surface 39*b* and the supporter coupling surface 39*c* are preferably inclined surfaces. Furthermore, at the intersection line 39*e*, an angle formed between the supporter rear surface 39*d* and the supporter inner wall surface 39*b* is preferably an acute angle.

As illustrated in FIG. 33, of the plurality of protrusions 64 provided on each land section 33, the protrusions 64 located at the end of the land section 33 in the longitudinal direction (X direction) extend out toward the supporter 39. Specifically, the protrusions 64 located at the longitudinal end of the land section 33 are disposed on the supporter 39. As mentioned above, each land section 33 is provided with a plurality of (four in FIG. 33) protrusion rows 63. In this case, all of the multiple protrusion rows 63 provided on the land section 33 extend out toward the supporter 39 by the same length L3. This extension length L3 may be 10% or more and 80% or less of a width w6 of the supporter 39. The width w6 of the supporter 39 may be 50 μm or more and 2000 μm or less.

As illustrated in FIG. 34, on the supporter 39, the protrusions 64 protrude from the supporter front surface 39*a* toward the second main body surface 31*b*. In this case, the bottom surface of each liquid-flow-channel main groove 61 provided in the land section 33 is located in the same plane as the supporter front surface 39*a*. However, the configuration is not limited to this. The bottom surface of the liquid-flow-channel main groove 61 may be offset from the supporter front surface 39*a* in the thickness direction (Z direction) of the land section 33.

In this description, the expression "the protrusions 64 extend out toward the supporter 39" implies that the protrusions 64 located at the most distal longitudinal end of each land section 33 are located outward of the land section 33 in the longitudinal direction relative to a portion, of the supporter 39 adjacent to the land section 33, located most inward of the vapor path 51 in the longitudinal direction. The expression "the supporter 39 adjacent to the land section 33" refers to an area of the supporter 39 located between the land section 33 and a land section 33 adjacent to the relevant land section 33. In FIG. 33, the protrusions 64 located closest toward the frame body section 32 (i.e., positive side in the X direction) in the land section 33 are located toward the frame body section 32 (i.e., toward the positive side in the X direction) relative to the intersection line 39*e* as a most-inwardly-located portion of the adjacent supporter 39. Furthermore, the aforementioned length L3 is a value obtained by measuring, in the longitudinal direction of the land section 33, the distance between the protrusions 64 located at the most distal longitudinal end of the land section 33 and the portion (intersection line 39*e*) of the supporter 39 located most inward of the vapor path 51 in the longitudinal direction.

In this embodiment, the protrusions 64 located at the condensation area CR side (i.e., positive side in the X direction) and at the longitudinal end (positive end in the X direction) of each land section 33 extend out toward the supporter 39. Accordingly, the working liquid 2*b* condensed on the supporter 39 is recovered by being returned to the liquid flow channel section 60 in accordance with a capillary force of the liquid flow channel section 60 (see reference sign 2*b* in FIG. 33). Consequently, the working liquid 2*b* can flow smoothly when the vapor chamber 1 is being used, and heat uniformity of the vapor chamber 1 can be enhanced. Furthermore, when the vapor chamber 1 is set in an environment where the temperature is lower than the freezing point of the working liquid 2*b*, breakage of the vapor chamber 1 as a result of freezing of the working liquid 2*b* remaining on the supporter 39 can be avoided. Alternatively, at the evaporation area SR side (i.e., negative side in the X direction), the protrusions 64 located at the longitudinal end of each land section 33 may extend out toward the supporter 39.

The vapor chamber 1 and the wick sheet 30 according to this embodiment can be fabricated in a manner substantially similar to the case in the first embodiment except that the bridges 41 are not to be formed (see FIG. 11).

Next, the effects of this embodiment having the above-described configuration will be described.

When the vapor chamber 1 according to this embodiment is being used, the working fluids 2*a* and 2*b* partially reach the supporter 39. It is conceivable that the working fluids 2*a* and 2b reaching the supporter 39 condense into the working liquid 2b and accumulate on the supporter 39. With regard to this, in this embodiment, of the plurality of protrusions 64 provided on each land section 33, the protrusions 64 located at the longitudinal end of the land section 33 extend out toward the supporter 39. Accordingly, the working liquid 2b accumulated on the supporter 39 is recovered into the liquid-flow-channel main grooves 61 via the protrusions 64 located at the longitudinal end of the land section 33. This facilitates the circulation effect of the working fluids 2a and 2b within the sealed space 3, thereby enhancing the heat uniformity of the vapor chamber 1 without hindering the flow of the working fluids 2a and 2b.

Furthermore, when being used, the electronic apparatus E equipped with the vapor chamber 1 may conceivably be placed in an environment where the temperature is lower than the freezing point of the working liquid 2b. With regard to this, in this embodiment, accumulation of the working liquid 2b on the supporter 39 is suppressed. Therefore, even when the working liquid 2b freezes, deformation of the upper sheet 20 due to a force caused by expansion of the working liquid 2b remaining on the supporter 39 can be suppressed. Accordingly, a decrease in flatness of the second upper sheet surface 20b of the upper sheet 20 to which the device D is attached can be suppressed, and formation of a gap between the second upper sheet surface 20b and the device D can be suppressed. As a result, a hindrance to the conduction of heat from the device D can be suppressed, and performance degradation of the vapor chamber 1 can be suppressed.

Furthermore, according to this embodiment, the supporter inner wall surface 39b of the supporter 39 is inclined such that, in cross section, the first main body surface 31a side is located inward (i.e., toward the negative side in the X direction) of the vapor paths 51 in the longitudinal direction relative to the second main body surface 31b side. Accordingly, the working fluids 2a and 2b can flow smoothly toward the vapor paths 51 from above the supporter 39, thereby facilitating the circulation of the working fluids 2a and 2b within the vapor chamber 1.

Moreover, according to this embodiment, the supporter coupling surface 39c of the supporter 39 is inclined such that, in cross section, the first main body surface 31a side is located inward (i.e., toward the negative side in the X direction) of the vapor paths 51 in the longitudinal direction relative to the second main body surface 31b side. Accordingly, the working liquid 2b is less likely to accumulate at corners between the frame body section 32 and the supporter 39, and the working liquid 2b can be recovered smoothly toward the liquid flow channel section 60.

MODIFICATIONS

Next, various modifications of this embodiment will be described with reference to FIG. 35 to FIG. 38. FIG. 35 to FIG. 38 are enlarged top views each illustrating a part of the wick sheet 30 according to each modification. In FIG. 35 to FIG. 38, sections identical to those in the embodiment illustrated in FIG. 28 to FIG. 34 are given the same reference signs, and detailed descriptions thereof are omitted.

First Modification

Figure 35:
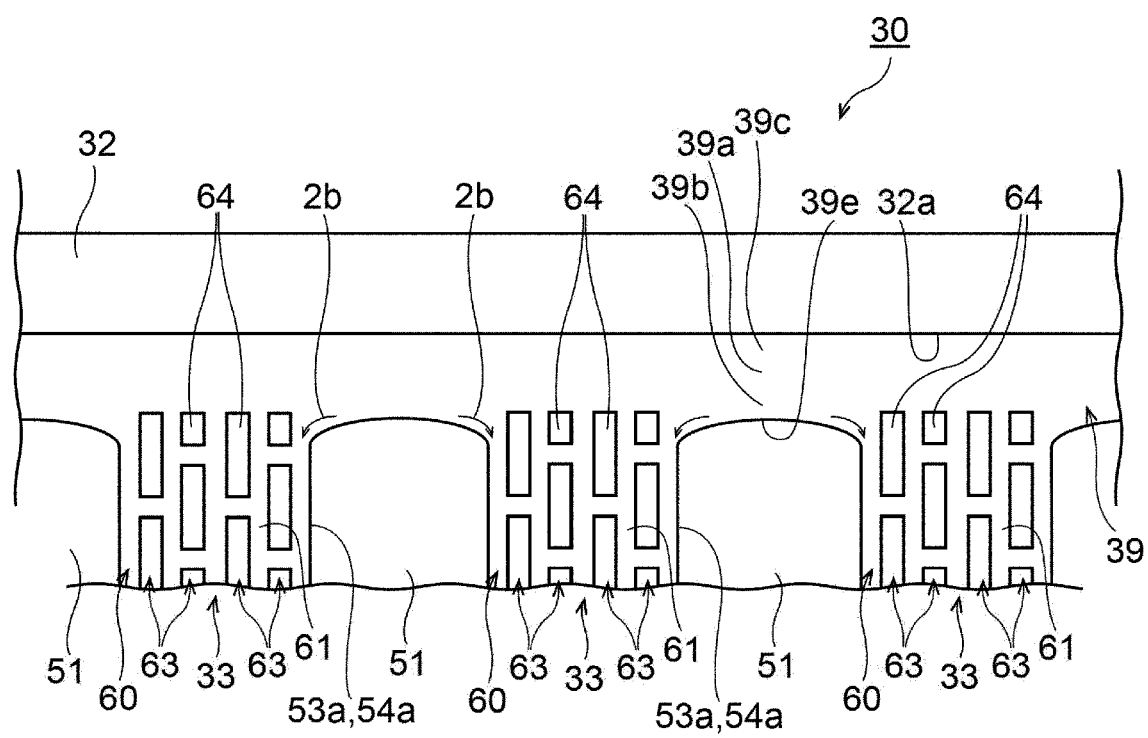
FIG. 35 is an enlarged top view illustrating a frame body section and a supporter of a wick sheet according to a first modification of the second embodiment.
Figure 36:
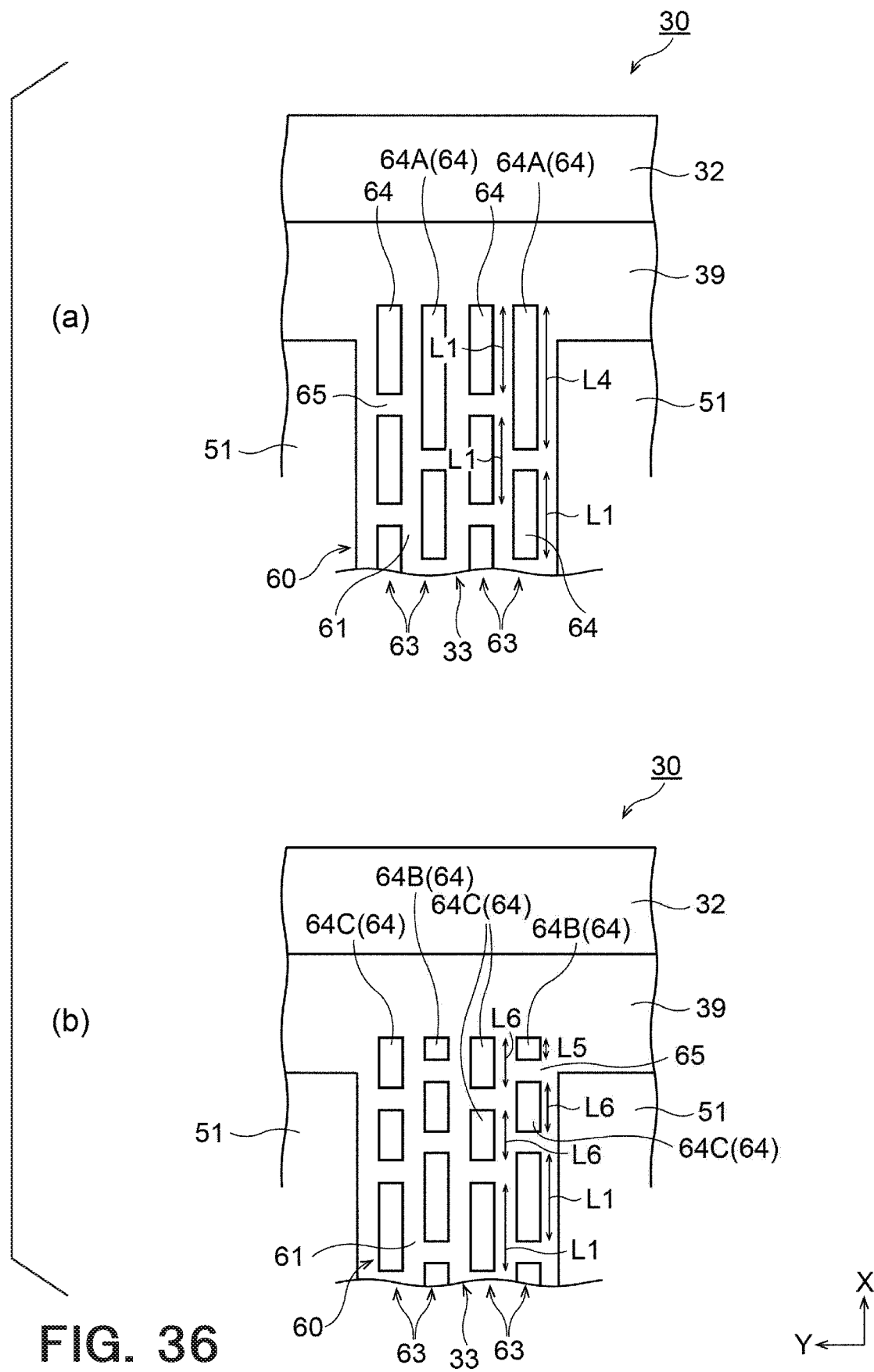
FIG. 36(a) and FIG. 36(b) are enlarged top views illustrating a frame body section and a supporter of a wick sheet according to a second modification of the second embodiment.
Figure 37:
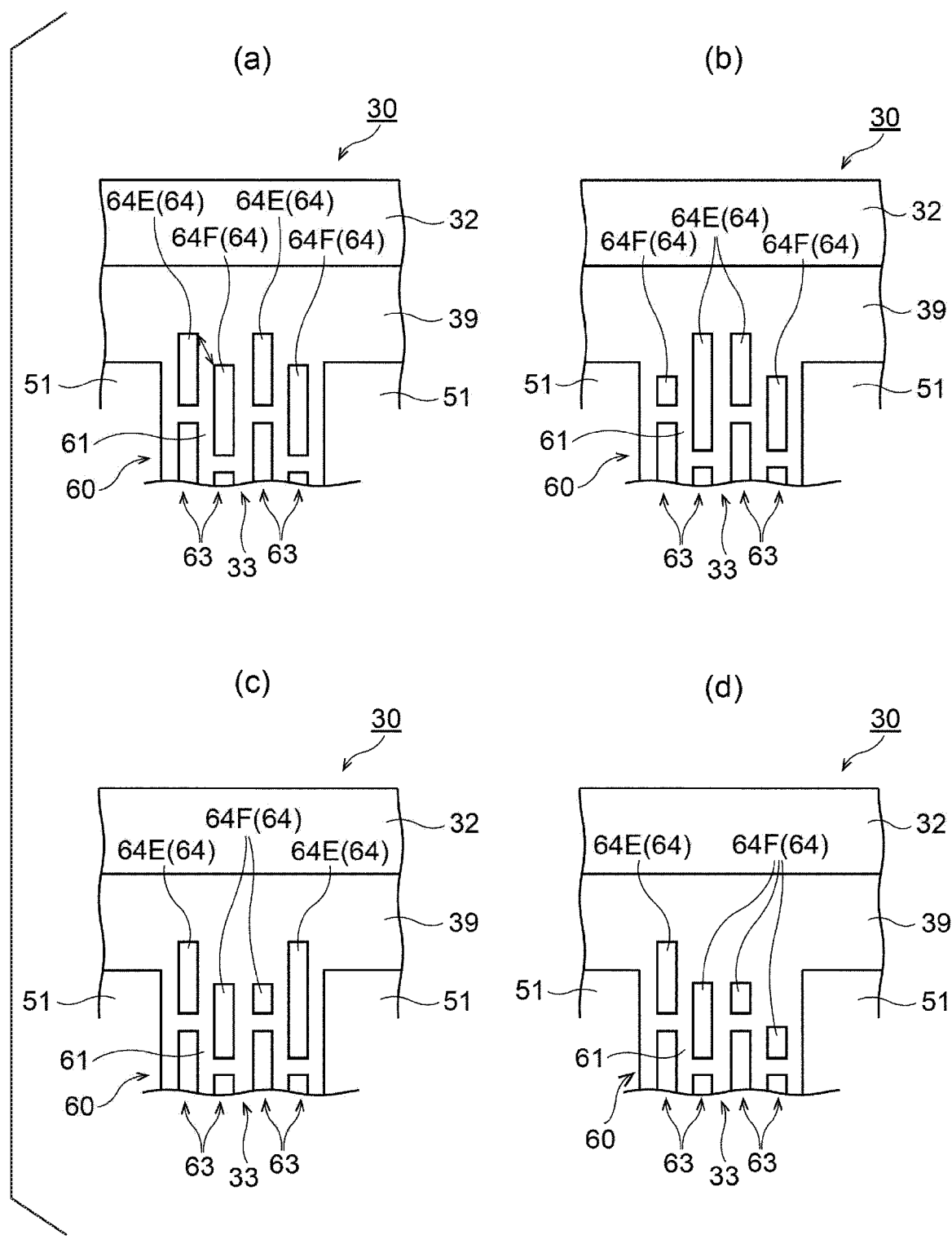
FIG. 37(a) to FIG. 37(d) are enlarged top views illustrating a frame body section and a supporter of a wick sheet according to a third modification of the second embodiment.

As illustrated in FIG. 35, at a longitudinal end (negative end in the X direction) of each vapor path 51, the intersection line 39e of the supporter 39 located at opposite widthwise (Y direction) ends of the vapor path 51 may be bent in plan view. Specifically, at the widthwise ends of each vapor path 51, the intersection line 39e of the supporter 39 is bent inward (i.e., negative side in the X direction) of the vapor path 51 in the longitudinal direction from the inner side toward the outer side in the width direction (Y direction) of the vapor path 51 in plan view. The intersection line 39e of the supporter 39 may have a circular-arc shape or an elliptical shape in plan view, or may have a shape with a line segment and curved lines connected to opposite sides thereof in plan view.

According to this modification, the working liquid 2b existing on the supporter front surface 39a and the supporter inner wall surface 39b of the supporter 39 can flow into the liquid flow channel section 60 (see reference sign 2b in FIG. 35) also from the side surfaces (the first wall surface 53a and the second wall surface 54a) of each land section 33. Accordingly, the working liquid 2b accumulated on the supporter 39 is recovered into the liquid flow channel section 60 efficiently via the side surfaces of the land section 33. This can further facilitate the circulation effect of the working fluids 2a and 2b within the sealed space 3.

Second Modification

As illustrated in FIG. 36(a) and FIG. 36(b), a length L4 (dimension in the X direction) of each protrusion 64 located at the end of the corresponding land section 33 in the longitudinal direction (X direction) may be different from the length L1 (dimension in the X direction) of another protrusion 64.

For example, as illustrated in FIG. 36(a), the length L4 of protrusions 64A (64) located at the longitudinal end of the land section 33 may be greater than the length L1 of the other protrusions 64 (L4>L1). Accordingly, a capillary force acts on the longer protrusions 64A, so that adhesion of the working liquid 2b around the protrusions 64A is suppressed, whereby the working liquid 2b can be returned efficiently toward the liquid flow channel section 60. Therefore, in a thermal cycle test that involves repeating heating and cooling, expansion of the vapor chamber 1 in the area of the supporter 39 can be suppressed.

In FIG. 36(a), the length L4 of the protrusions 64A located at the longitudinal end of one or more of the protrusion rows 63 is greater than the length L1 of the other protrusions 64. On the other hand, the length of protrusions 64 located at the longitudinal end of the remaining one or more of the protrusion rows 63 is equal to the length L1 of the other protrusions 64. However, the configuration is not limited to this. The length L4 of the protrusions 64A located at the longitudinal end of all of the protrusion rows 63 may be greater than the length L1 of the other protrusions 64.

Furthermore, as illustrated in FIG. 36(b), lengths L5 and L6 of protrusions 64B (64) and 64C (64) located at the longitudinal end of each land section 33 may be smaller than the length L1 of the other protrusions 64 (L5<L1, L6<L1). Accordingly, because the liquid-flow-channel communication grooves 65 are disposed near the supporter 39, the working liquid 2b remaining on the supporter 39 can be taken into the liquid flow channel section 60 efficiently. The length L6 of the protrusions 64C adjacent, in the longitudinal direction (X direction), to the protrusions 64B and 64C located at the longitudinal end of the land section 33 may also be smaller than the length L1 of the other protrusions 64.

In FIG. 36(b), the lengths L5 and L6 of the protrusions 64B and 64C located at the longitudinal ends of all of the protrusion rows 63 are smaller than the length L1 of the other protrusions 64. However, the configuration is not limited to this. The length L1 of the protrusions 64 located at the longitudinal end of one or more of the protrusion rows 63 may be equal to the length L1 of the other protrusions 64.

Third Modification

As illustrated in FIG. 37(a) to FIG. 37(d), of the multiple (four in this case) protrusion rows 63, protrusions 64E (64) located at the longitudinal end of one or more of the protrusion rows 63 may extend out toward the supporter 39. Protrusions 64F (64) located at the longitudinal end of the remaining one or more protrusion rows 63 do not have to extend out toward the supporter 39.

For example, as illustrated in FIG. 37(a), a protrusion row 63 including a protrusion 64E extending out toward the supporter 39 and a protrusion row 63 including a protrusion 64F not extending out toward the supporter 39 may be provided alternately in the width direction (Y direction) of the land section 33. The expression "protrusion 64F not extending out toward the supporter 39" implies that the protrusion 64F overlaps a portion of the adjacent supporter 39 located most inward of the vapor path 51 in the longitudinal direction, or is located inward of the land section 33 in the longitudinal direction relative to the aforementioned portion.

Furthermore, as illustrated in FIG. 37(b), the protrusions 64E of the protrusion rows 63 located inward of the land section 33 in the width direction (Y direction) may extend out toward the supporter 39. The protrusions 64F of the protrusion rows 63 located at the opposite widthwise ends of the land section 33 do not have to extend out toward the supporter 39.

Moreover, as illustrated in FIG. 37(c), the protrusions 64E of the protrusion rows 63 located at the opposite widthwise ends (in the Y direction) of the land section 33 may extend out toward the supporter 39. The protrusions 64F of the protrusion rows 63 located inward of the land section 33 in the width direction do not have to extend out toward the supporter 39.

Furthermore, as illustrated in FIG. 37(d), the protrusion 64E of the protrusion row 63 located at one widthwise end (in the Y direction) of the land section 33 may extend out toward the supporter 39. The protrusion 64F of the protrusion row 63 located at the other widthwise end of the land section 33 and the protrusions 64F of the protrusion rows 63 located inward of the land section 33 in the width direction do not have to extend out toward the supporter 39.

According to this modification, the width of an inlet through which the working liquid 2b flows into each liquid-flow-channel main groove 61 can be increased (e.g., see a double arrow in FIG. 37(a)). Accordingly, the working liquid 2b remaining on the supporter 39 can be taken into the liquid flow channel section 60 efficiently.

Fourth Modification

Figure 38:
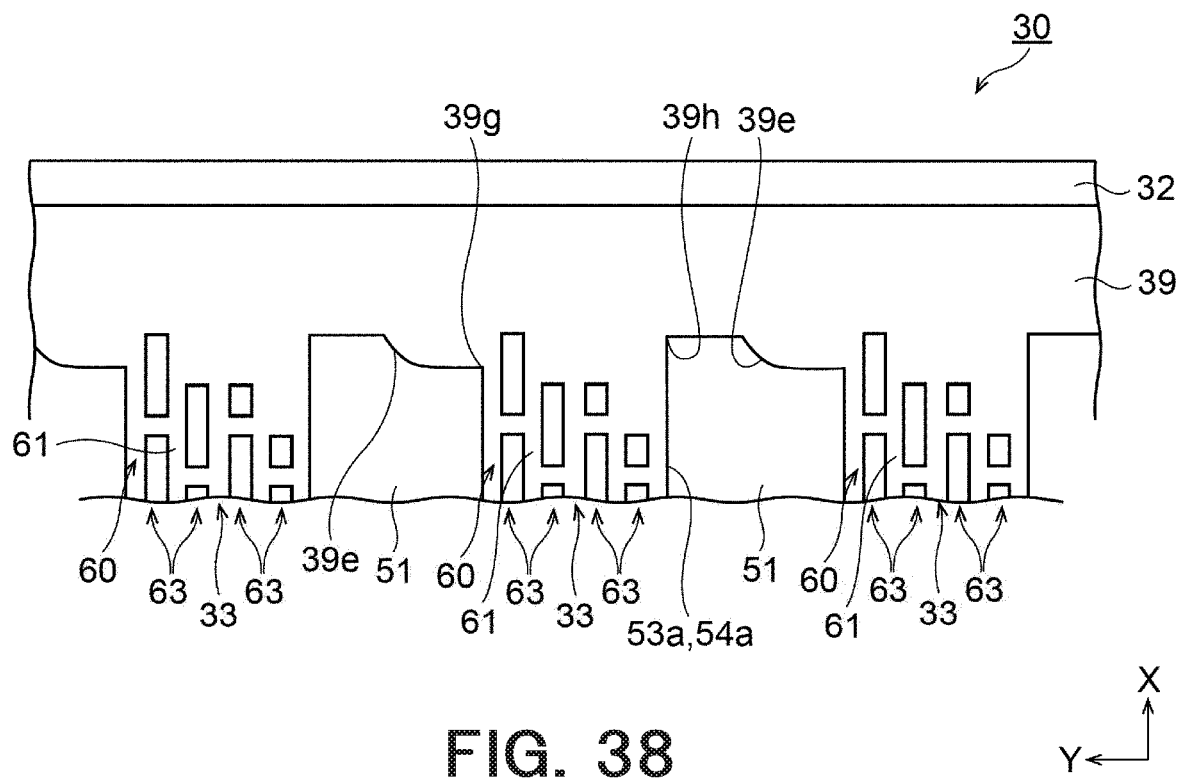
FIG. 38 is an enlarged top view illustrating a frame body section and a supporter of a wick sheet according to a fourth modification of the second embodiment.

As illustrated in FIG. 38, the intersection line 39e of the supporter 39 may be curved or bent in plan view. In this case, an intersection point between one of side surfaces (the first wall surface 53a and the second wall surface 54a) located at one widthwise end (in the Y direction) of the land section 33 and the intersection line 39e is defined as a first end point 39g. An intersection point between the side surface located at the other widthwise end (in the Y direction) of the land section 33 and another intersection line 39e is defined as a second end point 39h. In this case, a line connecting the first end point 39g and the second end point 39h is not parallel to the width direction (Y direction) of the land section 33 in plan view.

Furthermore, in FIG. 38, the protrusion 64 of the protrusion row 63 located at one widthwise end (end at the first end point 39g side) of the land section 33 extends out toward the supporter 39. Specifically, at the end at the first end point 39g side, the protrusion 64 located at the longitudinal end of the land section 33 is located outward in the longitudinal direction (i.e., positive side in the X direction) of the vapor path 51 relative to the first end point 39g. On the other hand, the protrusion 64 of the protrusion row 63 located at the other widthwise end (end at the second end point 39h side) of the land section 33 does not extend out toward the supporter 39. Specifically, at the end at the second end point 39h side, the protrusion 64 located at the longitudinal end of the land section 33 is located inward in the longitudinal direction (i.e., negative side in the X direction) of the vapor path 51 relative to the second end point 39h.

According to this modification, the working liquid 2b remaining on the supporter 39 can be taken into the liquid flow channel section 60 efficiently at one widthwise end (at the first end point 39g side) of the land section 33. On the other hand, at the other widthwise end (at the second end point 39h side) of the land section 33, the volume of the vapor path 51 increases, so that the pressure of the working vapor 2a can be reduced in this area. Particularly, when the supporter 39 is located near the evaporation area SR, a rapid increase in pressure within a space surrounding the supporter 39 due to the working vapor 2a generated in the evaporation area SR can be suppressed.

This embodiment is different from the first embodiment in that the vapor flow channel section 50 is not provided with the bridges 41 therein. Alternatively, the vapor flow channel section 50 may be provided with the bridges 41 therein.

Third Embodiment

Next, a third embodiment will be described with reference to FIG. 39 to FIG. 44. FIG. 39 to FIG. 44 illustrate the third embodiment. The third embodiment illustrated in FIG. 39 to FIG. 44 is mainly different from the second embodiment in that the protrusions 64 located at the longitudinal end of each land section 33 are disposed apart from the supporter 39. In FIG. 39 to FIG. 44, sections identical to those in the embodiments illustrated in FIG. 1 to FIG. 38 are given the same reference signs, and detailed descriptions thereof are omitted.

Figure 39:
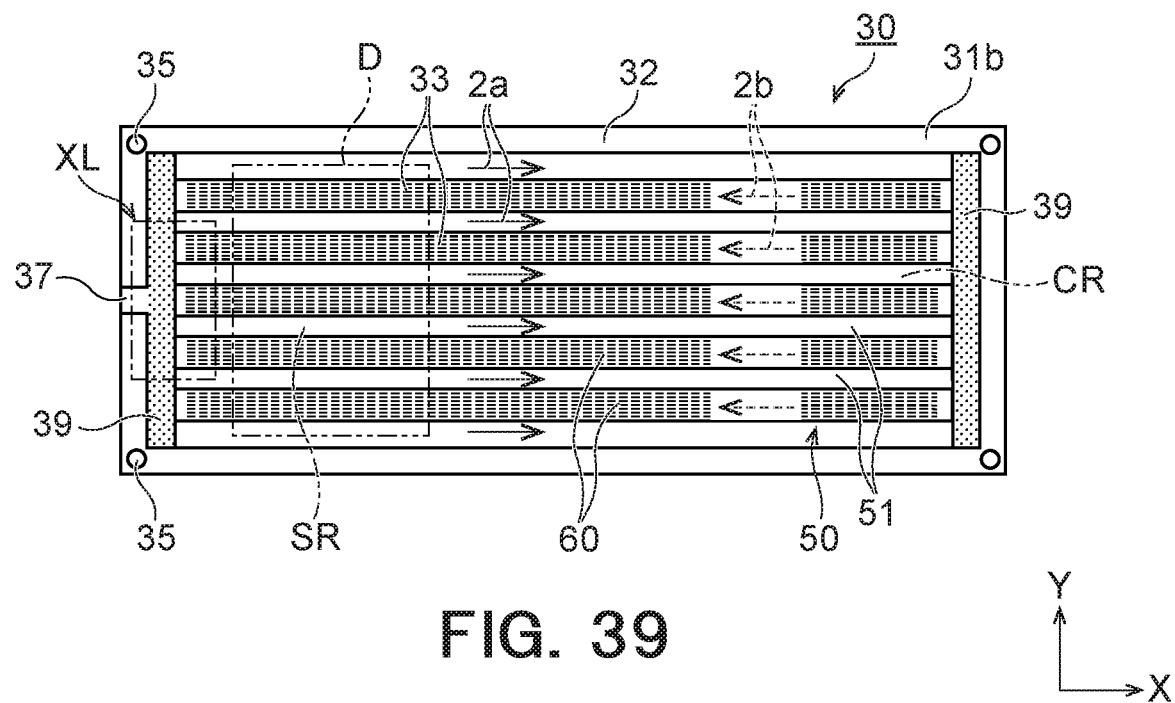
FIG. 39 is a top view of a wick sheet according to a third embodiment.
Figure 40:
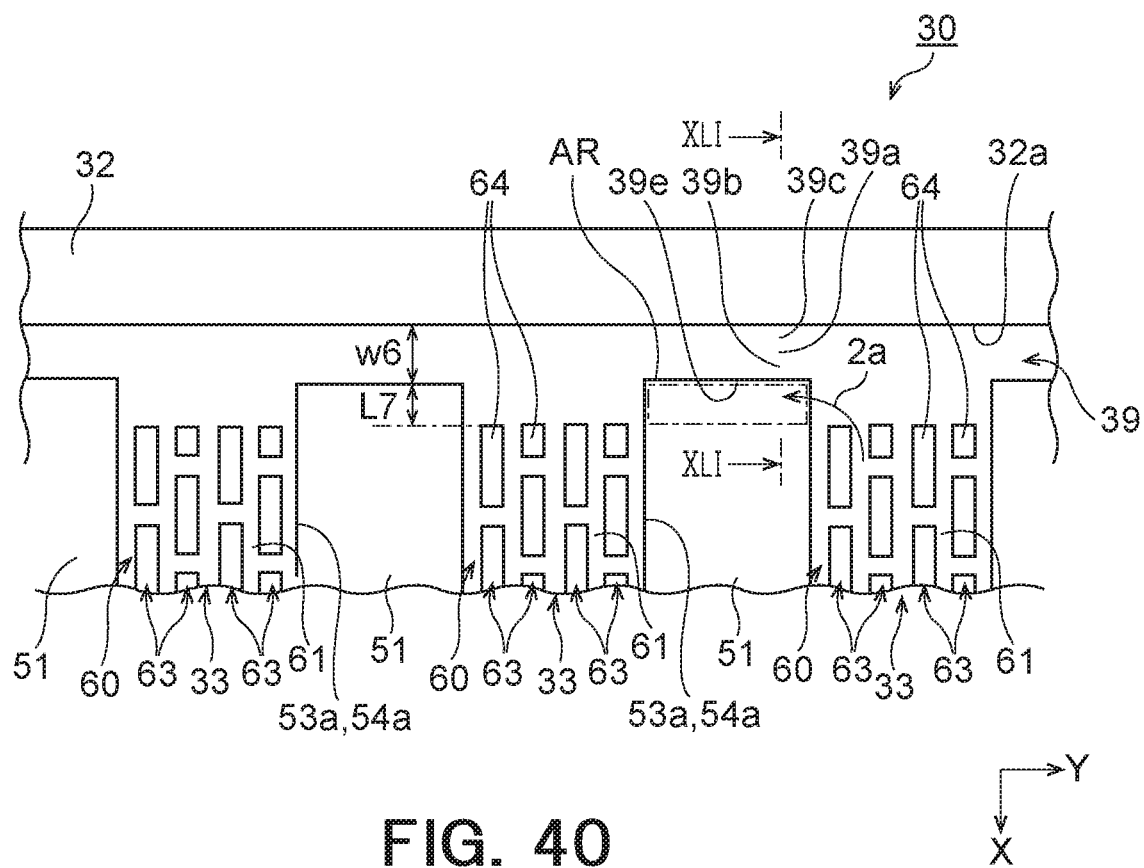
FIG. 40 is an enlarged top view (enlarged view of an area XL in FIG. 39) illustrating a frame body section and a supporter of the wick sheet according to the third embodiment.

As illustrated in FIG. 39 and FIG. 40, the wick sheet 30 according to this embodiment includes a first main body surface 31a, a second main body surface 31b, a frame body section 32, a plurality of land sections 33, and a supporter 39. Vapor paths 51 through which a working vapor 2a travels are provided between the multiple land sections 33. A liquid flow channel section 60 that communicates with the vapor paths 51 and through which a working liquid 2b travels is provided at the second main body surface 31b side of at least one of the land sections 33. The liquid flow channel section 60 has a plurality of liquid-flow-channel main grooves 61 through which the working liquid 2b travels and that are arranged parallel to each other. Adjacent liquid-flow-channel main grooves 61 have a protrusion row 63 provided therebetween. Each protrusion row 63 has a plurality of protrusions 64. The protrusions 64 located at the longitudinal end of each land section 33 are disposed apart from the supporter 39.

Figure 41:
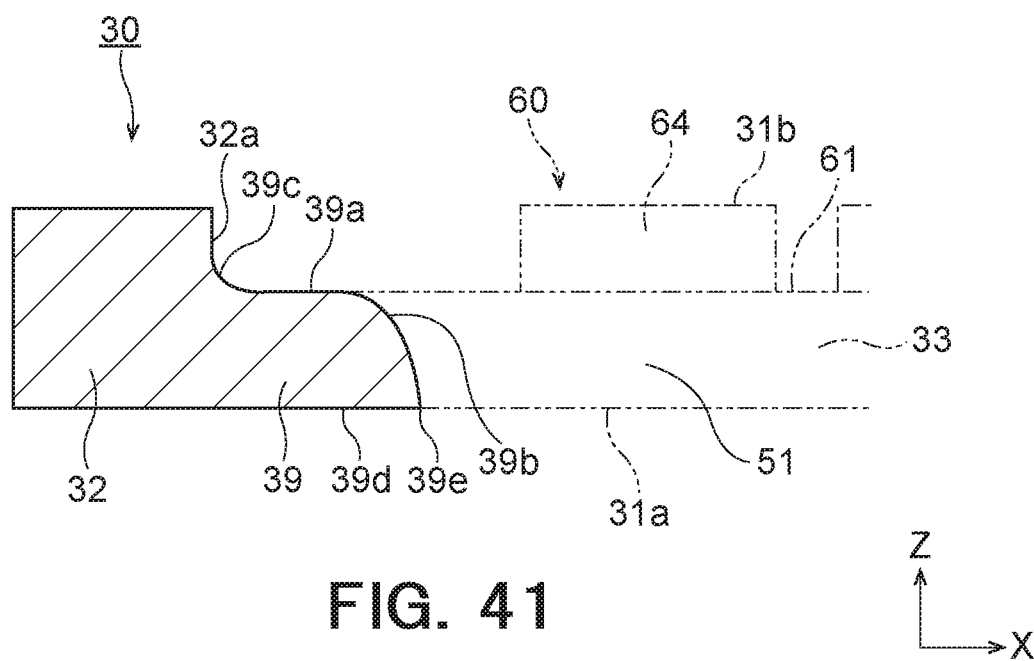
FIG. 41 is an enlarged cross-sectional view (cross-sectional view taken along line XLI-XLI in FIG. 40) illustrating the frame body section and the supporter of the wick sheet according to the third embodiment.

FIG. 40 is an enlarged top view (enlarged view of an area XLI in FIG. 39) illustrating the frame body section 32 and the supporter 39 located at the evaporation area SR side, and FIG. 41 is an enlarged cross-sectional view (cross-sectional view taken along line XLI-XLI in FIG. 40) illustrating the frame body section 32 and the supporter 39. In order to clarify the drawing, FIG. 40 illustrates the liquid-flow-channel main grooves 61 and the protrusion rows 63 in an enlarged manner, and the number of liquid-flow-channel main grooves 61, the number of protrusion rows 63, and the like are different from those in the other drawings for the sake of convenience. Furthermore, in FIG. 40, the injection flow channel 37 and the like are not illustrated.

As illustrated in FIG. 40, the supporter 39 is provided at the evaporation area SR side and at the longitudinal ends (negative side in the X direction) of the land sections 33. As mentioned above, the supporter 39 couples the land sections 33 to the frame body section 32. Moreover, the frame body section 32 has a frame-body inner wall surface 32a located at the supporter 39 side.

As illustrated in FIG. 41, the supporter 39 has a supporter front surface 39a, a supporter inner wall surface 39b, a supporter coupling surface 39c, and a supporter rear surface 39d. The supporter front surface 39a is located at the second main body surface 31b side and is a flat surface parallel to the second main body surface 31b. The supporter inner wall surface 39b is oriented toward the vapor paths 51 (i.e., toward the positive side in the X direction) in the vapor flow channel section 50 and extends from the supporter front surface 39a to the supporter rear surface 39d. The supporter inner wall surface 39b is a bent surface bent such that, in cross section, the first main body surface 31a side is located inward (i.e., toward the positive side in the X direction) of the vapor paths 51 in the longitudinal direction relative to the second main body surface 31b side. The supporter inner wall surface 39b is provided continuously with the first wall surface 53a and the second wall surface 54a of each vapor path 51 (see FIG. 40). The supporter coupling surface 39c is provided continuously with the frame-body inner wall surface 32a of the frame body section 32. The supporter coupling surface 39c is a bent surface bent such that, in cross section, the first main body surface 31a side is located inward (i.e., toward the positive side in the X direction) of the vapor paths 51 in the longitudinal direction relative to the second main body surface 31b side. The supporter rear surface 39d is oriented toward the first main body surface 31a and is a flat surface located in the same plane as the first main body surface 31a. Moreover, an intersection line 39e is provided between the supporter inner wall surface 39b and the supporter rear surface 39d. The supporter inner wall surface 39b and the supporter coupling surface 39c do not have to be bent surfaces and may be flat surfaces. The supporter inner wall surface 39b and the supporter coupling surface 39c are preferably inclined surfaces. Furthermore, at the intersection line 39e, an angle formed between the supporter rear surface 39d and the supporter inner wall surface 39b is preferably an acute angle.

As illustrated in FIG. 40, of the plurality of protrusions 64 provided on each land section 33, the protrusions 64 located at the end of the land section 33 in the longitudinal direction (X direction) are disposed apart from the supporter 39 inwardly in the longitudinal direction (i.e., toward the positive side in the X direction) of the land section 33. Specifically, the protrusions 64 located at the longitudinal end of each land section 33 are not disposed on the supporter 39 but are disposed apart from the supporter 39. As mentioned above, each land section 33 has a plurality of (four in FIG. 40) protrusion rows 63. In this case, all of the multiple protrusion rows 63 provided on the land section 33 are disposed apart from the supporter 39 by the same length L7 from the supporter 39. This separation length L7 from the supporter 39 may be 50% or more and 200% or less of the width w6 of the supporter 39. The width w6 of the supporter 39 may be 50 μm or more and 200 μm or less.

As illustrated in FIG. 41, at a position located away from the supporter 39, each protrusion 64 protrudes toward the second main body surface 31b from the corresponding liquid-flow-channel main groove 61. In this case, the bottom surface of each liquid-flow-channel main groove 61 provided in the land section 33 is located in the same plane as the supporter front surface 39a. However, the configuration is not limited to this. The bottom surface of the liquid-flow-channel main groove 61 may be offset from the supporter front surface 39a in the thickness direction (Z direction) of the land section 33.

In this description, the expression "the protrusions 64 are disposed apart from the supporter 39" implies that the protrusions 64 located at the most distal longitudinal end of each land section 33 are located inward of the land section 33 in the longitudinal direction relative to a portion, of the supporter 39 adjacent to the land section 33, located most inward of the vapor path 51 in the longitudinal direction. The expression "the supporter 39 adjacent to the land section 33" refers to an area of the supporter 39 located between the land section 33 and a land section 33 adjacent to the relevant land section 33. In FIG. 40, the protrusions 64 located closest toward the frame body section 32 (i.e., negative side in the X direction) in the land section 33 are located inward of the land section 33 in the longitudinal direction (i.e., positive side in the X direction) relative to the intersection line 39e as a most-inwardly-located portion of the adjacent supporter 39. Furthermore, the aforementioned length L7 is a value obtained by measuring, in the longitudinal direction of the land section 33, the distance between the protrusions 64 located at the most distal longitudinal end of the land section 33 and the portion (intersection line 39e) of the supporter 39 located most inward of the vapor path 51 in the longitudinal direction.

In this embodiment, the protrusions 64 located at the evaporation area SR side (i.e., negative side in the X direction) and at the longitudinal end (negative end in the X direction) of each land section 33 are disposed apart from the supporter 39. In other words, each vapor path 51 located between adjacent land sections 33 extends in toward the supporter 39. Accordingly, the volume of each vapor path 51 is increased near the longitudinal end of the corresponding land section 33 (reference sign AR in FIG. 40), so that the pressure of the working vapor 2a can be reduced in this area AR. Particularly, when the supporter 39 is located near the evaporation area SR, a rapid increase in pressure within a space surrounding the supporter 39 due to the working vapor 2a generated in the evaporation area SR can be suppressed. Furthermore, the vapor paths 51 extending in toward the supporter 39 can facilitate evaporation of the working vapor 2a from the terminal ends of the land sections 33. This facilitates the circulation effect of the working fluids 2a and 2b within the sealed space 3, thereby enhancing the heat uniformity of the vapor chamber 1 without hindering the flow of the working fluids 2a and 2b.

The vapor chamber 1 and the wick sheet 30 according to this embodiment can be fabricated in a manner substantially similar to the case in the first embodiment except that the bridges 41 are not to be formed (see FIG. 11).

Next, the effects of this embodiment having the above-described configuration will be described.

When the vapor chamber 1 according to this embodiment is being used, the working liquid 2b on each land section 33 evaporates near the evaporation area SR by receiving heat from the device D. The working liquid 2b evaporates so that the working liquid 2b turns into the working vapor 2a, whereby the volume rapidly increases. With regard to this, in this embodiment, the protrusions 64 located at the longitudinal end of each land section 33 are disposed apart from the supporter 39. Accordingly, the working vapor 2a generated on the land section 33 flows quickly to the adjacent vapor path 51 in the width direction (Y direction) of the land section 33 without being hindered by the protrusions 64 (see reference sign 2a in FIG. 40). Moreover, the area AR as a large space in each vapor path 51 exists between adjacent land sections 33. As a result, the working vapor 2a generated on the land section 33 is quickly released to the area AR in the vapor path 51, so that a rapid increase in pressure within the space above the land section 33 can be suppressed.

By suppressing a rapid increase in pressure within the space above each land section 33, deformation of the upper sheet 20 due to a force caused by evaporation of the working liquid 2b on the land section 33 is suppressed. Accordingly, a decrease in flatness of the second upper sheet surface 20b of the upper sheet 20 to which the device D is attached can be suppressed, and formation of a gap between the second upper sheet surface 20b and the device D can be suppressed. As a result, a hindrance to the conduction of heat from the device D can be suppressed, and performance degradation of the vapor chamber 1 can be suppressed.

Furthermore, according to this embodiment, the supporter inner wall surface 39b of the supporter 39 is bent such that, in cross section, the first main body surface 31a side is located inward (i.e., toward the positive side in the X direction) of the vapor paths 51 in the longitudinal direction relative to the second main body surface 31b side. Accordingly, the working fluids 2a and 2b can flow smoothly toward the vapor paths 51 from above the supporter 39, thereby facilitating the circulation of the working fluids 2a and 2b within the vapor chamber 1.

Moreover, according to this embodiment, the supporter coupling surface 39c of the supporter 39 is bent such that, in cross section, the first main body surface 31a side is located inward (i.e., toward the positive side in the X direction) of the vapor paths 51 in the longitudinal direction relative to the second main body surface 31b side. Accordingly, the working fluids 2a and 2b can flow smoothly toward the vapor paths 51 from the frame body section 32 side via the supporter 39, thereby facilitating the circulation of the working fluids 2a and 2b within the vapor chamber 1.

MODIFICATIONS

Figure 42:
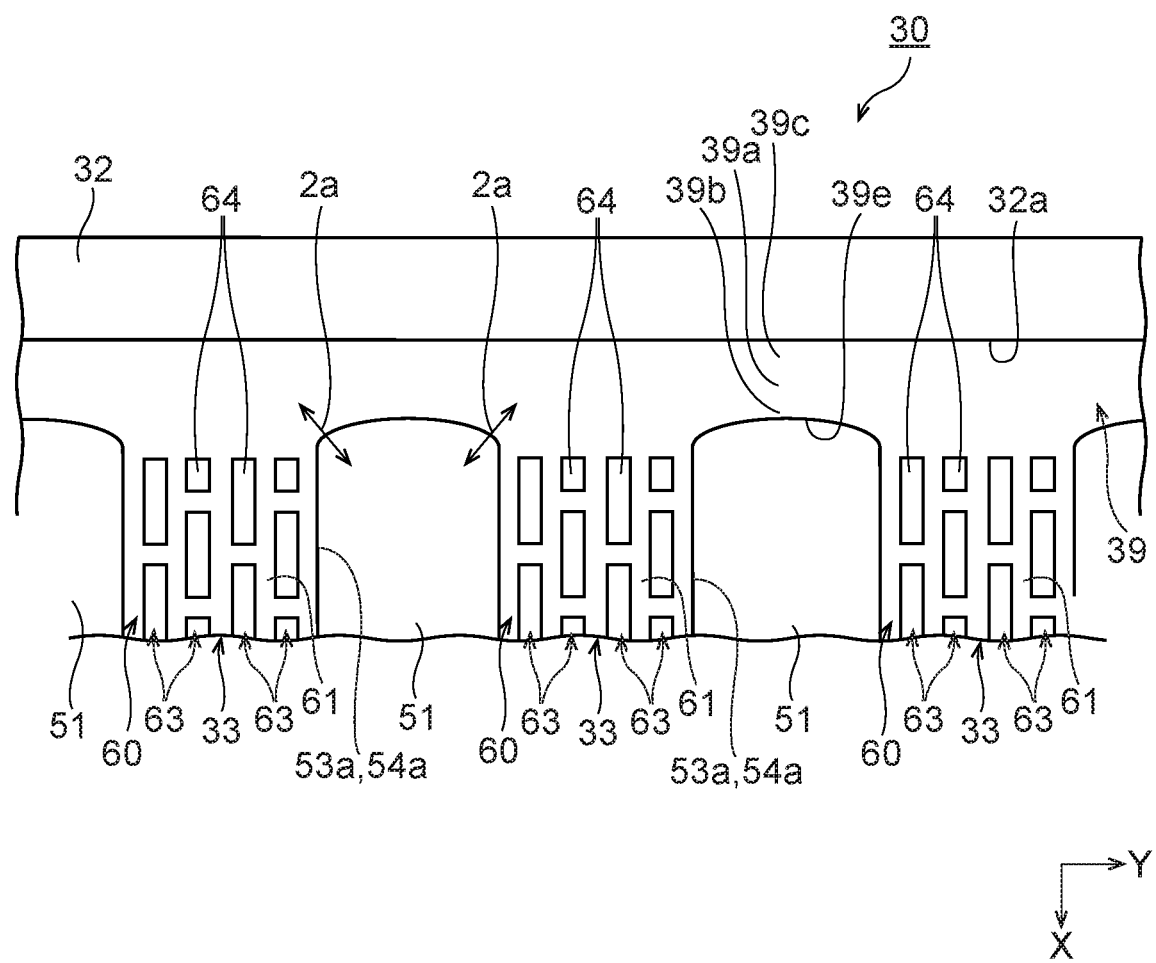
FIG. 42 is an enlarged top view illustrating a frame body section and a supporter of a wick sheet according to a first modification of the third embodiment.
Figure 43:
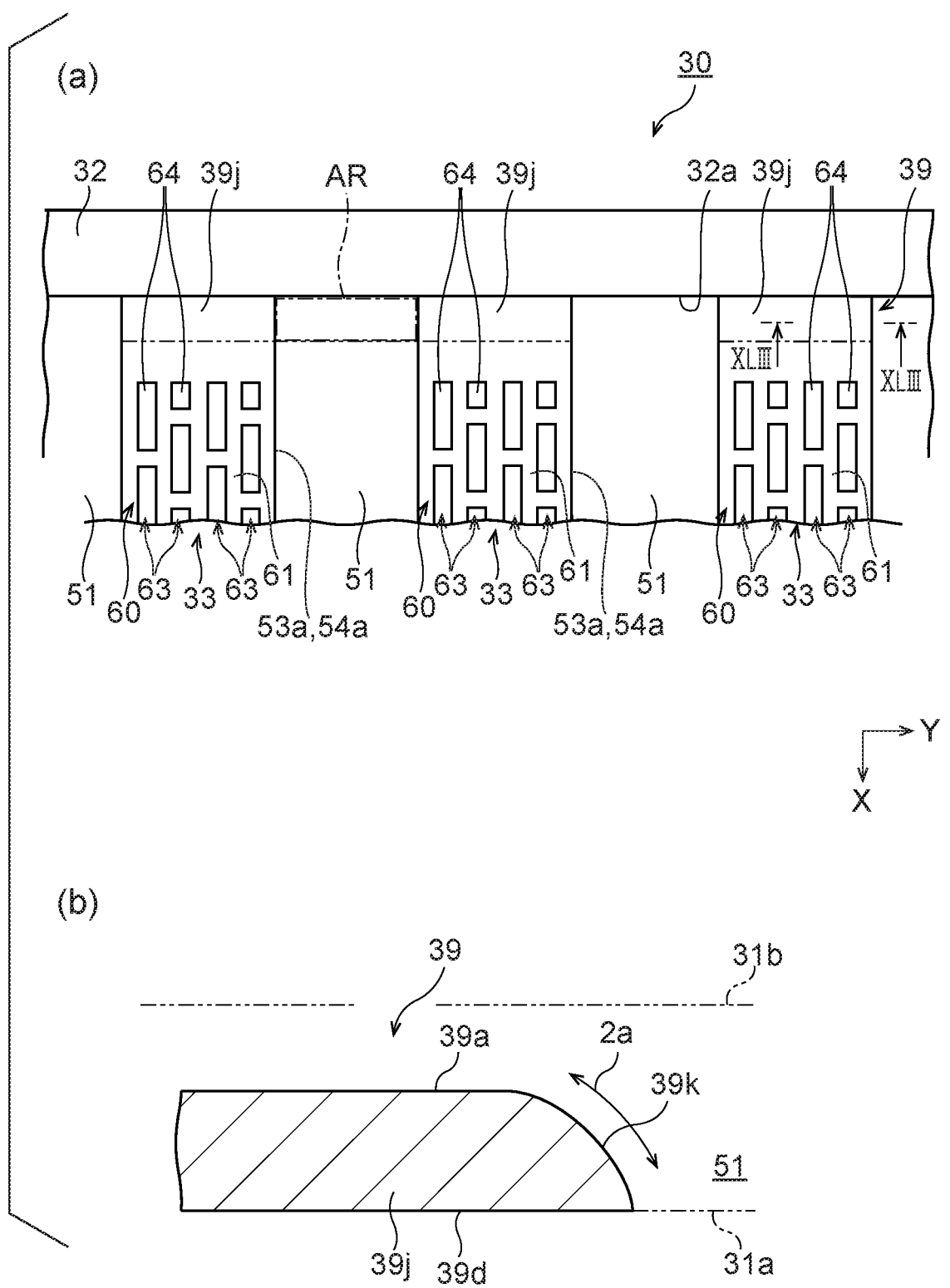
FIG. 43(a) is an enlarged top view illustrating a frame body section and a supporter of a wick sheet according to a second modification of the third embodiment.
FIG. 43(b) is a cross-sectional view taken along line XLIII-XLIII in FIG. 43(a).
Figure 44:
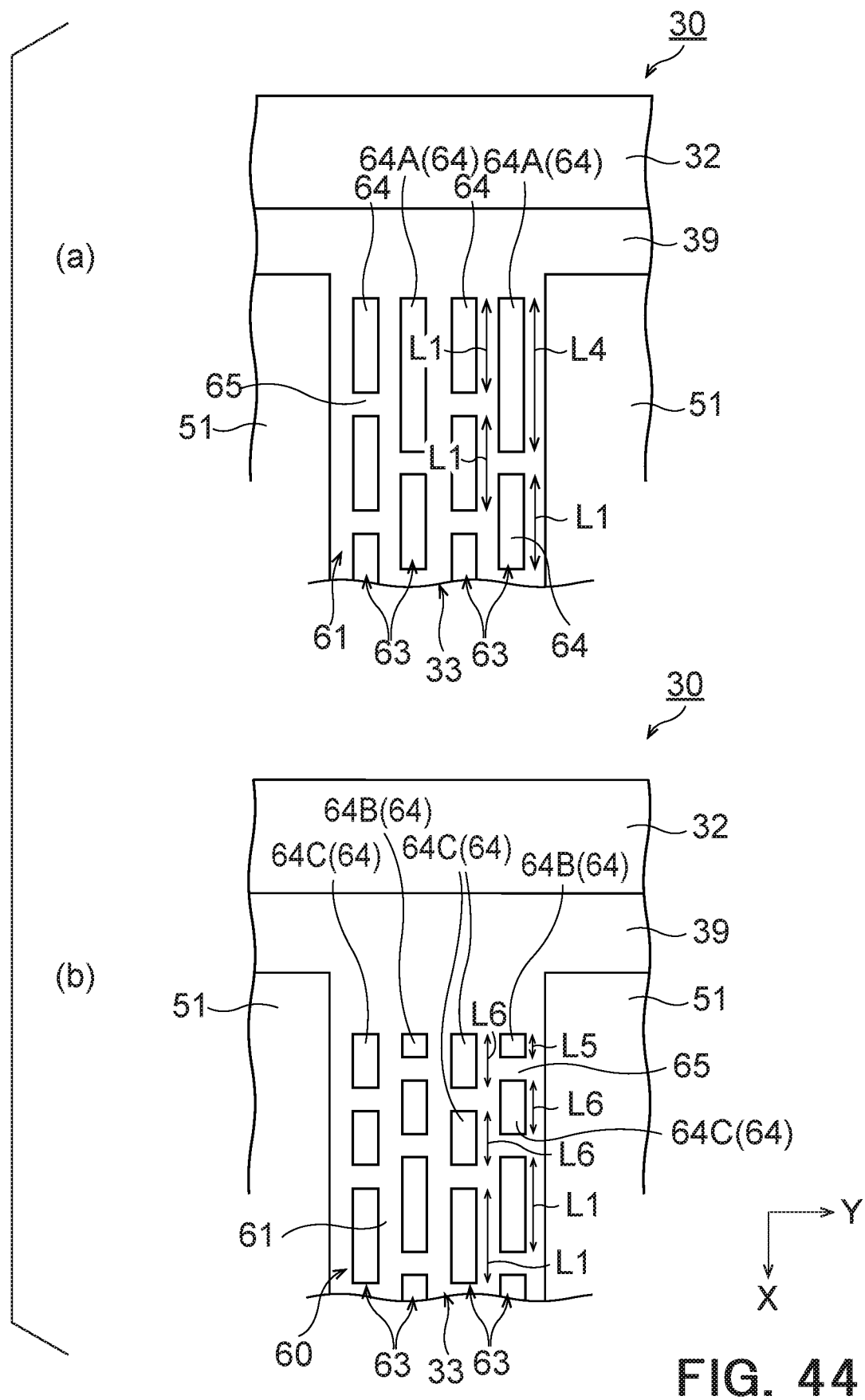
FIG. 44(a) and FIG. 44(b) are enlarged top views illustrating a frame body section and a supporter of a wick sheet according to a third modification of the third embodiment.

Next, various modifications of this embodiment will be described with reference to FIG. 42 to FIG. 44. FIG. 42 to FIG. 44 are enlarged top views each illustrating a part of the wick sheet 30 according to each modification. In FIG. 42 to FIG. 44, sections identical to those in the embodiment illustrated in FIG. 40 and FIG. 41 are given the same reference signs, and detailed descriptions thereof are omitted.

First Modification

As illustrated in FIG. 42, at a longitudinal end (negative end in the X direction) of each vapor path 51, the intersection line 39e of the supporter 39 located at opposite widthwise (Y direction) ends of the vapor path 51 may be bent in plan view. Specifically, at the widthwise ends of each vapor path 51, the intersection line 39e of the supporter 39 is bent inward (i.e., positive side in the X direction) of the vapor path 51 in the longitudinal direction from the inner side toward the outer side in the width direction (Y direction) of the vapor path 51 in plan view. The intersection line 39e of the supporter 39 may have a circular-arc shape or an elliptical shape in plan view, or may have a shape with a line segment and curved lines connected to opposite sides thereof in plan view.

According to this modification, the working vapor 2a can flow smoothly between the supporter 39 and each vapor path 51 via bent portions located at the opposite widthwise ends of the supporter inner wall surface 39b of the supporter 39 (see reference sign 2a in FIG. 42). Accordingly, the working vapor 2a accumulated on the supporter 39 can be transported efficiently into the vapor path 51 via the supporter inner wall surface 39b. As a result, this can further facilitate the circulation effect of the working fluids 2a and 2b within the sealed space 3.

Second Modification

As illustrated in FIG. 43(a) and FIG. 43(b), the end of each vapor path 51 in the longitudinal direction (X direction) may extend to the frame body section 32.

For example, as illustrated in FIG. 43(a), the longitudinal end (negative end in the X direction) of each vapor path 51 may extend to the frame-body inner wall surface 32a of the frame body section 32, and the supporter 39 may be split by the vapor paths 51. In this case, the supporter 39 includes a plurality of coupling portions 39j. Each coupling portion 39j is located at the longitudinal end (negative end in the X direction) of the corresponding land section 33 and couples the land section 33 and the frame body section 32 to each other. Each vapor path 51 is provided between adjacent coupling portions 39j.

Accordingly, the volume of each vapor path 51 (reference sign AR in FIG. 43(a)) can be further increased near the longitudinal end of each land section 33, so that the pressure of the working vapor 2a can be reduced in the area AR. Particularly, when the supporter 39 is located near the evaporation area SR, a rapid increase in pressure within a space surrounding the supporter 39 due to the working vapor 2a generated in the evaporation area SR can be suppressed. Furthermore, the vapor paths 51 extending in toward the supporter 39 can facilitate evaporation of the working vapor 2a from the terminal ends of the land sections 33.

Furthermore, as illustrated in FIG. 43(b), in a cross section taken in the width direction (Y direction) of each land section 33, the coupling portion 39j has a supporter side surface 39k oriented toward the corresponding vapor path 51 (in the Y direction). The supporter side surface 39k extends from the supporter front surface 39a to the supporter rear surface 39d. The supporter side surface 39k is a bent surface bent such that, in cross section, the first main body surface 31a side is located inward in the width direction (Y direction) of the vapor path 51 relative to the second main body surface 31b side. Accordingly, the working vapor 2a can flow smoothly between the supporter 39 (coupling portion 39j) and the vapor path 51 via the bent supporter side surface 39k (see reference sign 2a in FIG. 43(b)). Consequently, the working vapor 2a accumulated on the supporter 39 can be transported efficiently into the vapor path 51 via the supporter side surface 39k. As a result, this can further facilitate the circulation effect of the working fluids 2a and 2b within the sealed space 3. In this modification, the cross-sectional shape of the coupling portion 39j in the width direction (Y direction) of the land section 33 may be different from the cross-sectional shape of the land section 33.

Third Modification

As illustrated in FIG. 44(a) and FIG. 44(b), the length L4 (dimension in the X direction) of each protrusion 64 located at the end of the corresponding land section 33 in the longitudinal direction (X direction) may be different from the length L1 (dimension in the X direction) of another protrusion 64.

For example, as illustrated in FIG. 44(a), the length L4 of protrusions 64A (64) located at the longitudinal end of the land section 33 may be greater than the length L1 of the other protrusions 64 (L4>L1). Accordingly, a capillary force acts on the longer protrusions 64A, so that adhesion of the working liquid 2b around the protrusions 64A is suppressed, whereby the working liquid 2b can be returned efficiently toward the liquid flow channel section 60. Therefore, in a thermal cycle test that involves repeating heating and cooling, expansion of the vapor chamber 1 in the area of the supporter 39 can be suppressed.

In FIG. 44(a), the length L4 of the protrusions 64A located at the longitudinal end of one or more of the protrusion rows 63 is greater than the length L1 of the other protrusions 64. On the other hand, the length of protrusions 64 located at the longitudinal end of the remaining one or more of the protrusion rows 63 is equal to the length L1 of the other protrusions 64. However, the configuration is not limited to this. The length L4 of the protrusions 64A located at the longitudinal end of all of the protrusion rows 63 may be greater than the length L1 of the other protrusions 64.

Furthermore, as illustrated in FIG. 44(b), the lengths L5 and L6 of protrusions 64B (64) and 64C (64) located at the longitudinal end of each land section 33 may be smaller than the length L1 of the other protrusions 64 (L5<L1, L6<L1). Accordingly, the liquid-flow-channel main grooves 61 and the liquid-flow-channel communication grooves 65 of the liquid flow channel section 60 each have an increased area near the supporter 39, thereby facilitating evaporation of the working liquid 2b on the land section 33.

In FIG. 44(b), the lengths L5 and L6 of the protrusions 64B and 64C located at the longitudinal ends of all of the protrusion rows 63 are smaller than the length L1 of the other protrusions 64. However, the configuration is not limited to this. The length L1 of the protrusions 64 located at the longitudinal end of one or more of the protrusion rows 63 may be equal to the length L1 of the other protrusions 64.

This embodiment is different from the first embodiment in that the vapor flow channel section 50 is not provided with the bridges 41 therein. Alternatively, the vapor flow channel section 50 may be provided with the bridges 41 therein.

The present disclosure is not directly limited to each of the above embodiments and modifications, and can be realized by modifying the elements within a scope not deviating from the gist thereof in the practical phase. Furthermore, various inventions can be made in accordance with appropriate combinations of multiple elements disclosed in each of the above embodiments and modifications. One or more elements may be deleted from all the elements indicated in each of the above embodiments and modifications.

The invention claimed is:

1. A wick sheet for a vapor chamber, the wick sheet comprising:
   a first main body surface;
   a second main body surface opposite the first main body surface;
   a frame body section;
   a plurality of land sections apart from each other within the frame body section;
   a vapor path, through which a vapor of a working fluid travels, between the plurality of land sections and extending from the first main body surface to the second main body surface;
   a liquid flow channel section, that communicates with the vapor path and through which the working fluid in a liquid form travels, at a second main body surface side of at least one of the land sections; and
   a bridge that couples the land sections to the frame body section or that couples the land sections to each other, wherein
   the bridge is reduced in thickness from at least one of a first main body surface side and the second main body surface side,
   the liquid flow channel section has a liquid-flow-channel main groove through which the working fluid in the liquid form travels, and also has a liquid-flow-channel communication groove communicating with the liquid-flow-channel main groove, and
   the bridge is in contact with the liquid-flow-channel communication groove of at least one of the land sections.

2. The wick sheet according to claim 1, wherein each of the land sections has a curved shape or a bent linear shape in plan view.

3. The wick sheet according to claim 1, wherein the plurality of land sections include a first land section extending linearly in plan view and a second land section having a curved shape or a bent linear shape in plan view.

4. The wick sheet according to claim 1, wherein the bridge has a top surface at the second main body surface side, the top surface including a communication recess communicating with the liquid-flow-channel communication groove.

5. The wick sheet according to claim 4, wherein the top surface of the bridge includes a plurality of the communication recesses, the top surface including a first communication flow channel that connects the adjacent communication recesses to each other.

6. The wick sheet according to claim 4, wherein a second communication flow channel that connects the communication recess and the vapor path is at an outermost position of the bridge in a width direction.

7. The wick sheet according to claim 4, wherein the plurality of land sections include a first land section and a second land section, the bridge couples one end of the first land section to an intermediate position of the second land section, and the liquid-flow-channel main groove in the first land section and the communication recess in the bridge extend continuously.

8. The wick sheet according to claim 1, wherein the bridge couples a longitudinal end of each land section to the frame body section.

9. A vapor chamber having a working fluid enclosed therein, the vapor chamber comprising:
   a first sheet; and
   a wick sheet according to claim 1.

10. An electronic apparatus comprising:
a housing;
a device accommodated within the housing; and
the vapor chamber according to claim 9 that is thermally in contact with the device.

11. A wick sheet for a vapor chamber, the wick sheet comprising:
a first main body surface;
a second main body surface opposite the first main body surface;
a frame body section;
a plurality of land sections apart from each other within the frame body section;
a vapor path, through which a vapor of a working fluid travels, between the plurality of land sections and extending from the first main body surface to the second main body surface;
a liquid flow channel section, that communicates with the vapor path and through which the working fluid in a liquid form travels, at a second main body surface side of at least one of the land sections; and
a bridge that couples the land sections to the frame body section or that couples the land sections to each other, wherein
the bridge is reduced in thickness from at least one of a first main body surface side and the second main body surface side,
the bridge has a top surface at the second main body surface side, a bottom surface at the first main body surface side, and a side surface between the top surface and the bottom surface and oriented in a direction facing a flowing direction of the vapor of the working fluid in the vapor path, the side surface being non-parallel to a width direction of the vapor path.

12. A wick sheet for a vapor chamber, the wick sheet comprising:
a first main body surface;
a second main body surface opposite the first main body surface;
a frame body section;
a plurality of land sections apart from each other within the frame body section;
a vapor path, through which a vapor of a working fluid travels, between the plurality of land sections and extending from the first main body surface to the second main body surface;
a liquid flow channel section, that communicates with the vapor path and through which the working fluid in a liquid form travels, at a second main body surface side of at least one of the land sections; and
a bridge that couples the land sections to the frame body section or that couples the land sections to each other, wherein
the bridge is reduced in thickness from at least one of a first main body surface side and the second main body surface side,
the bridge has a top surface at the second main body surface side, a bottom surface at the first main body surface side, and a side surface between the top surface and the bottom surface and oriented in a direction facing a flowing direction of the vapor of the working fluid in the vapor path, the side surface being inclined relative to the first main body surface and the second main body surface.

13. A vapor chamber having a working fluid enclosed therein, the vapor chamber comprising:
a first sheet; and
a wick sheet according to claim 12.

14. An electronic apparatus comprising:
a housing;
a device accommodated within the housing; and
the vapor chamber according to claim 13 that is thermally in contact with the device.

15. A wick sheet for a vapor chamber, the wick sheet comprising:
a first main body surface;
a second main body surface opposite the first main body surface;
a frame body section;
a plurality of land sections apart from each other within the frame body section;
a vapor path, through which a vapor of a working fluid travels, between the plurality of land sections and extending from the first main body surface to the second main body surface;
a liquid flow channel section, that communicates with the vapor path and through which the working fluid in a liquid form travels, at a second main body surface side of at least one of the land sections; and
a bridge that couples the land sections to the frame body section or that couples the land sections to each other, wherein
the bridge is reduced in thickness from at least one of a first main body surface side and the second main body surface side,
the bridge has a top surface at the second main body surface side and a bottom surface at the first main body surface side, and
the bridge has a width that gradually increases from the top surface toward the bottom surface.

16. A vapor chamber having a working fluid enclosed therein, the vapor chamber comprising:
a first sheet; and
a wick sheet according to claim 15.

17. An electronic apparatus comprising:
a housing;
a device accommodated within the housing; and
the vapor chamber according to claim 16 that is thermally in contact with the device.

18. A vapor chamber having a working fluid enclosed therein, the vapor chamber comprising:
a first sheet; and
a wick sheet according to claim 11.

19. An electronic apparatus comprising:
a housing;
a device accommodated within the housing; and
the vapor chamber according to claim 18 that is thermally in contact with the device.

* * * * *